US012666712B2

(12) United States Patent
Zhuang et al.

(10) Patent No.: US 12,666,712 B2
(45) Date of Patent: Jun. 23, 2026

(54) INTEGRATED CIRCUIT AND METHOD OF FORMING THE SAME

(71) Applicant: TAIWAN SEMICONDUCTOR MANUFACTURING COMPANY, LTD., Hsinchu (TW)

(72) Inventors: Hui-Zhong Zhuang, Hsinchu (TW); Johnny Chiahoa Li, Hsinchu (TW); Tzu-Ying Lin, Hsinchu (TW); Jia-Hong Gao, Hsinchu (TW); Jung-Chan Yang, Hsinchu (TW); Jerry Chang Jui Kao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 417 days.

(21) Appl. No.: 18/314,536

(22) Filed: May 9, 2023

(65) Prior Publication Data

US 2024/0038762 A1 Feb. 1, 2024

Related U.S. Application Data

(60) Provisional application No. 63/373,631, filed on Aug. 26, 2022, provisional application No. 63/369,606, filed on Jul. 27, 2022.

(51) Int. Cl.
*H10D 84/90* (2025.01)
*H03K 3/037* (2006.01)
(Continued)

(52) U.S. Cl.
CPC ........... *H10D 84/907* (2025.01); *H03K 3/037* (2013.01); *H10D 84/0179* (2025.01);
(Continued)

(58) Field of Classification Search
CPC ..... H03K 3/35625; H03K 3/037; H10D 89/10
See application file for complete search history.

(56) References Cited

U.S. PATENT DOCUMENTS 6,198,324 B1 * 3/2001 Schober ............. H03K 3/35625
327/217
8,723,574 B2 * 5/2014 Tomita ............. H03K 3/356156
327/202
(Continued)

FOREIGN PATENT DOCUMENTS

CN 113268945 8/2021
DE 102018122529 7/2019
(Continued)

*Primary Examiner* — Evren Seven
(74) *Attorney, Agent, or Firm* — Hauptman Ham, LLP

(57) ABSTRACT

A flip-flop includes a first, second, third and a fourth active region extending in a first direction, and being on a first level of a substrate. The first active region corresponds to a first set of transistors of a first type. The second active region corresponds to a second set of transistors of a second type different from the first type. The third active region corresponds to a third set of transistors of the second type. The fourth active region corresponds to a fourth set of transistors of the first type. The flip-flop further includes a first gate structure extending in the second direction, overlapping at least the second active region and the third active region, and being on a second level different from the first level. The first gate structure is configured to receive a first clock signal.

20 Claims, 28 Drawing Sheets

(51) Int. Cl.
   *H10D 84/01*      (2026.01)
   *H10D 84/03*      (2025.01)
   *H10D 89/10*      (2025.01)

(52) U.S. Cl.
   CPC ....... *H10D 84/0186* (2025.01); *H10D 84/038*
   (2025.01); *H10D 89/10* (2025.01); *H10D*
   *84/937* (2025.01); *H10D 84/966* (2025.01)

(56) References Cited

U.S. PATENT DOCUMENTS

| | | | | |
|---|---|---|---|---|
| 10,911,034 | B2 | 2/2021 | Seo et al. | |
| 11,742,838 | B2 * | 8/2023 | Kim ...................... | G06F 30/392 |
| | | | | 327/202 |
| 2005/0104133 | A1 * | 5/2005 | Kanno ................... | H10D 89/10 |
| | | | | 257/E27.062 |
| 2009/0167394 | A1 * | 7/2009 | Bosshart .............. | H10D 84/907 |
| | | | | 327/203 |
| 2011/0032016 | A1 | 2/2011 | Maeno | |

| | | | | |
|---|---|---|---|---|
| 2017/0317666 | A1 * | 11/2017 | Liu ........................ | H10D 89/10 |
| 2017/0358565 | A1 | 12/2017 | Hensel et al. | |
| 2018/0075182 | A1 | 3/2018 | Zhuang et al. | |
| 2019/0207593 | A1 * | 7/2019 | Seo ..................... | H03K 3/35625 |
| 2019/0319022 | A1 * | 10/2019 | Song ..................... | H10D 84/85 |
| 2020/0021292 | A1 * | 1/2020 | Peng ................. | H03K 19/0948 |
| 2021/0083668 | A1 | 3/2021 | Peng et al. | |
| 2021/0143800 | A1 * | 5/2021 | Lee ..................... | G06F 30/3953 |
| 2021/0297068 | A1 | 9/2021 | Liu et al. | |
| 2023/0401372 | A1 | 12/2023 | Fang et al. | |

FOREIGN PATENT DOCUMENTS

| | | |
|---|---|---|
| DE | 102021100870 | 11/2021 |
| KR | 10-2019-0032120 | 3/2019 |
| KR | 10-2021-0139132 | 11/2021 |
| KR | 10-2021-0154696 | 12/2021 |
| KR | 10-2022-0037925 | 3/2022 |
| TW | I687053 | 3/2020 |
| TW | 202213711 | 4/2022 |

* cited by examiner

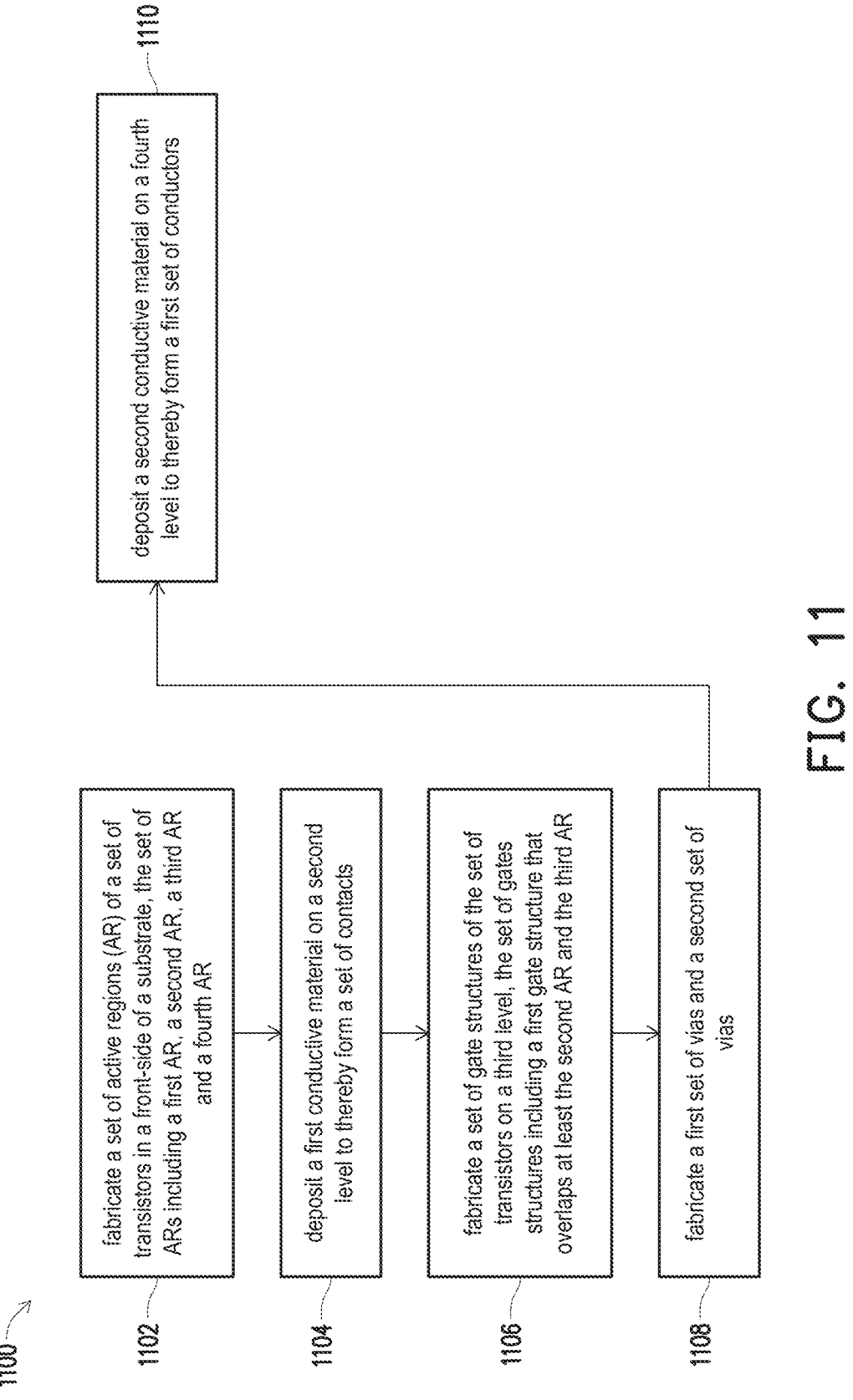

1110 — deposit a second conductive material on a fourth level to thereby form a first set of conductors 1102 — fabricate a set of active regions (AR) of a set of transistors in a front-side of a substrate, the set of ARs including a first AR, a second AR, a third AR and a fourth AR 1104 — deposit a first conductive material on a second level to thereby form a set of contacts 1106 — fabricate a set of gate structures of the set of transistors on a third level, the set of gates structures including a first gate structure that overlaps at least the second AR and the third AR 1108 — fabricate a first set of vias and a second set of vias

1200 ⌐

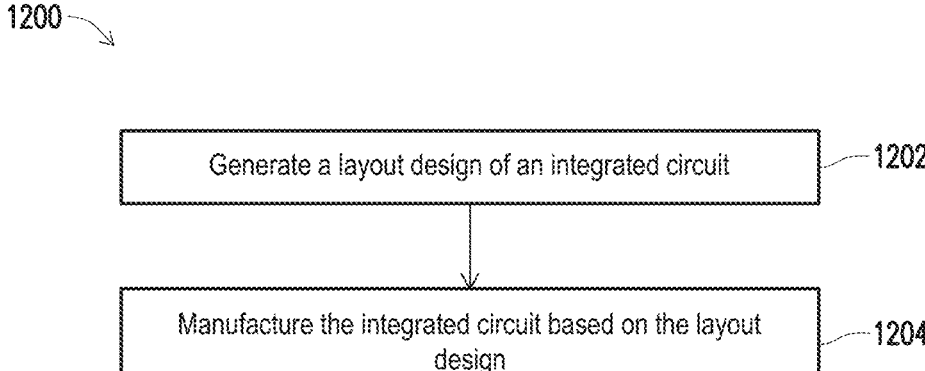

Generate a layout design of an integrated circuit — 1202

Manufacture the integrated circuit based on the layout design — 1204

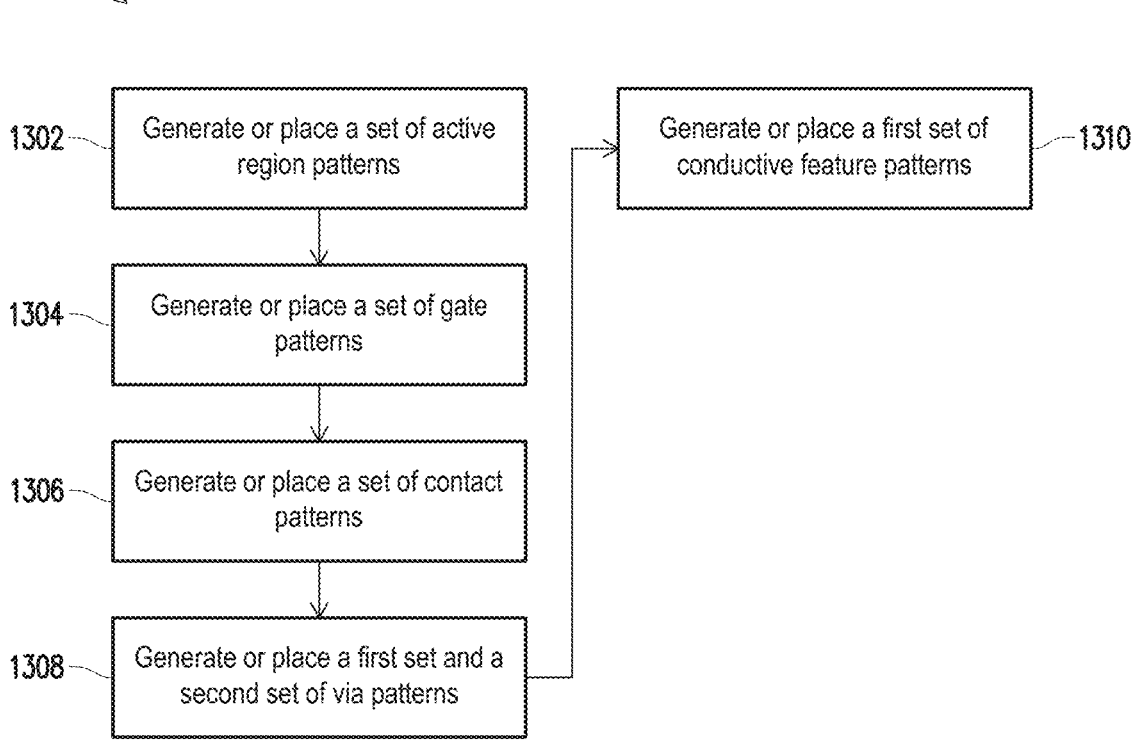

1302 — Generate or place a set of active region patterns

1304 — Generate or place a set of gate patterns

1306 — Generate or place a set of contact patterns

1308 — Generate or place a first set and a second set of via patterns

Generate or place a first set of conductive feature patterns — 1310

FIG. 13

INTEGRATED CIRCUIT AND METHOD OF FORMING THE SAME

PRIORITY CLAIM

This application claims the benefit of U.S. Provisional Application No. 63/369,606, filed Jul. 27, 2022, and U.S. Provisional Application No. 63/373,631, filed Aug. 26, 2022, which are herein incorporated by reference in their entireties.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 is a flow chart of a method of forming or manufacturing an integrated circuit in accordance with some embodiments.

FIG. 12 is a flow chart of a method of manufacturing an IC device, in accordance with some embodiments.

FIG. 13 is a flowchart of a method of generating a layout design of an integrated circuit, in accordance with some embodiments.

DETAILED DESCRIPTION

Figure 1A:
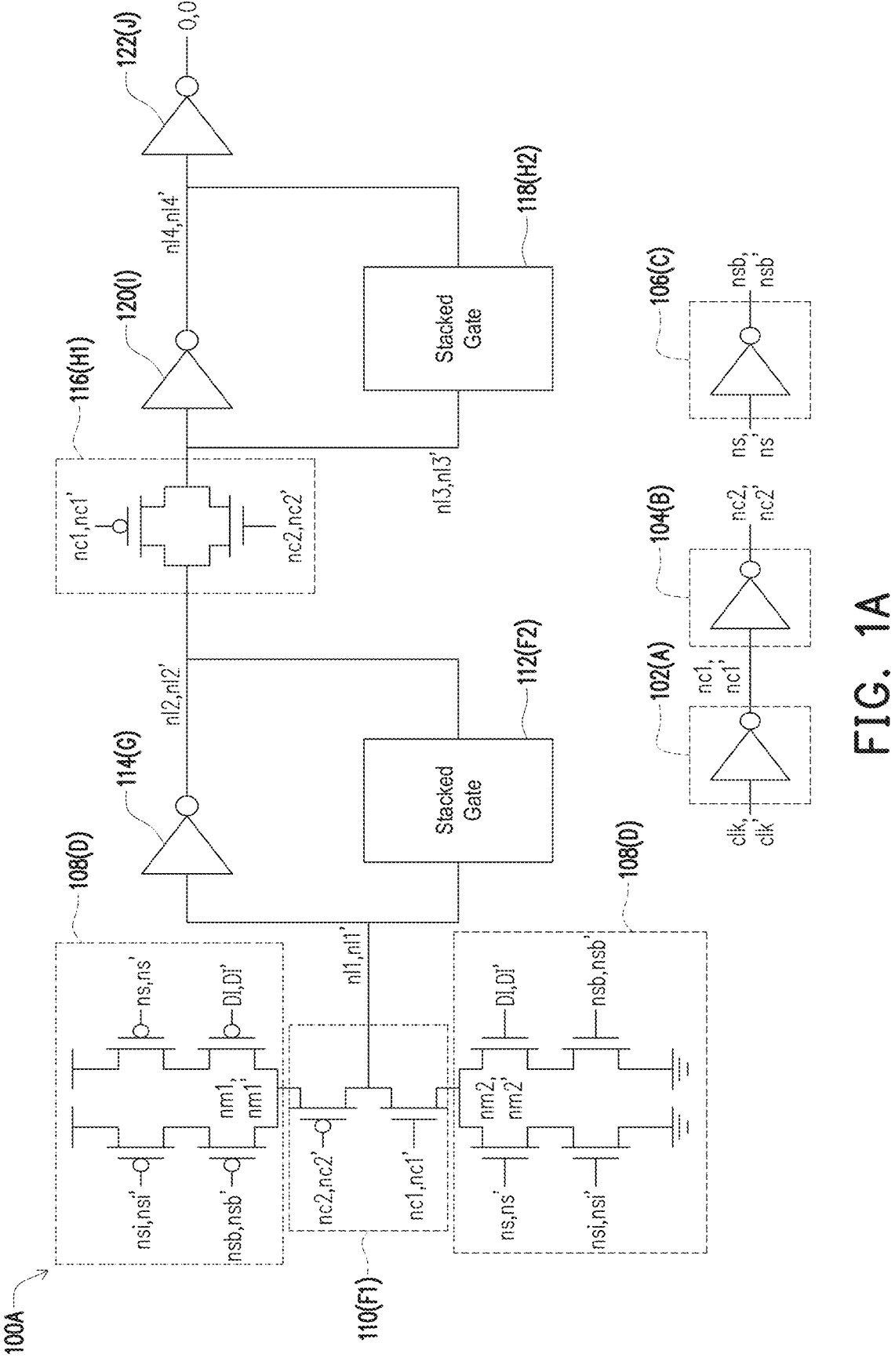
FIG. 1A is a circuit diagram of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a flip-flop includes a first active region, a second active region, a third active region and a fourth active region. Each of the first active region, the second active region, the third active region and the fourth active region extend in a first direction, and is on a first level of a substrate.

Each of the first active region, the second active region, the third active region and the fourth active region is separated from one another in a second direction different from the first direction.

In some embodiments, the first active region corresponds to a first set of transistors of a first type. In some embodiments, the second active region corresponds to a second set of transistors of a second type different from the first type. In some embodiments, the third active region corresponds to a third set of transistors of the second type. In some embodiments, the fourth active region corresponds to a fourth set of transistors of the first type.

In accordance with some embodiments, the flip-flop further includes a first gate structure and a second gate structure. In some embodiments, each of the first gate structure and the second gate structure extends in the second direction, and is on a second level different from the first level. In some embodiments, the second level is also referred to as a POLY level.

In some embodiments, each of the first gate structure and the second gate structure overlaps at least the second active region and the third active region. In some embodiments, the first gate structure is configured to receive a first clock signal. In some embodiments, the first gate structure is configured to receive a second clock signal inverted from the first clock signal. Thus, the first clock signal is routed on the first gate structure, and the second clock signal is routed on the second gate structure across at least 2 active regions within the flip-flop thereby maximizing vertical routing resource alignment in at least the second level (e.g., POLY level), and thereby reducing metal-0 (M0) usage and other upper metal layer usage in the flip-flop. In some embodiments, by reducing M0 usage, the flip-flop of the present disclosure offers more routing flexibility and more via landing spots compared to other approaches, and thereby increases routing resources.

FIG. 1A is a circuit diagram of an integrated circuit 100A, in accordance with some embodiments. In some embodiments, integrated circuit 100A is a flip-flop circuit. In some embodiments, integrated circuit 100A is a multi-bit flip-flop (MBFF) circuit.

Integrated circuit 100A is a flip-flop circuit. Integrated circuit 100A is configured to receive at least a data signal DI' or a scan in signal nsi', and is configured to output an output signal O'. In some embodiments, the data signal DI' is a data input signal. In some embodiments, the scan in signal nsi' is a scan input signal. In some embodiments, the output signal O' is a stored state of at least the data signal DI' or the scan in signal nsi'. A flip-flop circuit is used for illustration, other types of circuits are within the scope of the present disclosure.

Integrated circuit 100A includes an inverter 102, an inverter 104, an inverter 106, a multiplexer 108, a circuit 110, a stacked gate circuit 112, an inverter 114, a transmission gate 116, a stacked gate circuit 118, an inverter 120 and an inverter 122. In some embodiments, inverters 120 and 122 are referred to as an output circuit.

For ease of illustration, inverter 102 is shown in FIGS. 1A-10 as inverter A, inverter 104 is shown in FIGS. 1A-10 as inverter B, inverter 106 is shown in FIGS. 1A-10 as inverter C, multiplexer 108 is shown in FIGS. 1A-10 as multiplexer D, circuit 110 is shown in FIGS. 1A-10 as circuit F1, stacked gate circuit 112 is shown in FIGS. 1A-10 as stacked gate circuit F2, inverter 114 is shown in FIGS. 1A-10 as inverter G, transmission gate 116 is shown in FIGS. 1A-10 as transmission gate H1, stacked gate circuit 118 is shown in FIGS. 1A-10 as stacked gate circuit H2, inverter 120 is shown in FIGS. 1A-10 as inverter I and inverter 122 is shown in FIGS. 1A-10 as inverter J.

An input terminal of inverter 102 is configured to receive clock signal clk' on a node clk. In the present disclosure, signals of a corresponding node are denoted with a common symbol as the corresponding node, except the signals further include an apostrophe (e.g., ') symbol. For example, the clock signal clk' corresponds to the signal of node clk.

An output terminal of inverter 102 is configured to output a clock signal nc1' to at least an input terminal of inverter 104. In some embodiments, clock signal nc1' is inverted from clock signal clk', and vice versa.

In some embodiments, the node clk corresponds to at least one of the input terminal of inverter 102. In some embodiments, the node nc1 corresponds to at least one of the output terminal of inverter 102, the input terminal of inverter 104, a first input terminal of circuit 110 and a first input terminal of transmission gate 116.

The input terminal of inverter 104 is coupled to at least the output terminal of inverter 102, and is configured to receive clock signal nc1'. An output terminal of inverter 104 is configured to output the clock signal nc2'. In some embodiments, clock signal nc2' is inverted from clock signal nc1', and vice versa. In some embodiments, the node nc2 corresponds to at least one of the output terminal of inverter 104, a second input terminal of circuit 110 and a second input terminal of transmission gate 116.

An input terminal of inverter 106 is configured to receive the scan enable signal ns'. In some embodiments, the input terminal of inverter 106 is coupled to a third input terminal (described below) of multiplexer 302. An output terminal of inverter 106 is configured to output the inverted scan enable signal nsb'. In some embodiments, the output terminal of inverter 106 is coupled to a fourth input terminal of multiplexer 302.

In some embodiments, the node nsb corresponds to at least one of the output terminal of inverter 106 and a fourth input terminal of multiplexer 108.

In some embodiments, the node ns corresponds to at least one of the input terminal of inverter 106 and a third input terminal of multiplexer 108.

Multiplexer 108 includes a first input terminal (e.g., node DI) configured to receive the data signal DI', a second input terminal (e.g., node nsi) configured to receive the scan in signal nsi', a third input terminal (e.g., node ns) configured to receive a scan enable signal ns', and a fourth input terminal (e.g., node nsb) configured to receive an inverted scan enable signal nsb'.

Multiplexer 108 includes transistors T1-T8 (described below in FIG. 1B).

In some embodiments, a node DI corresponds to at least a first input terminal of multiplexer 108 and a node nsi corresponds to at least a second input terminal of multiplexer 108.

In some embodiments, the scan enable signal ns' is a selection signal of multiplexer 108, and the inverted scan enable signal nsb' is an inverted selection signal of multiplexer 108. An output terminal of multiplexer 108 is coupled to an input terminal of circuit 110. Multiplexer 108 is configured to output a signal nm1' and nm2' to circuit 110 on corresponding node nm1 and nm2. In some embodiments, multiplexer 108 is coupled to inverter 106, and is configured to receive inverted scan enable signal nsb'.

Circuit 110 is coupled to multiplexer 108, stacked gate circuit 112 and inverter 114. A first input terminal of circuit 110 is coupled to and configured to receive signal nm1' from multiplexer 108. A second input terminal of circuit 110 is coupled to and configured to receive signal nm2' from multiplexer 108. An output terminal of circuit 110 is coupled to an input terminal of inverter 114 and an output terminal of stacked gate circuit 112. The output terminal of circuit 110 is configured to output a signal nl1' to inverter 114.

In some embodiments, the node nm1 corresponds to at least the first input terminal of circuit 110, and the node nm2 corresponds to at least the second input terminal of circuit 110.

In some embodiments, the node nl1 corresponds to at least one of the output terminal of circuit 110, the output terminal of stacked gate circuit 112 and the input terminal of inverter 114.

In some embodiments, circuit 110 is coupled to inverter 102, and is configured to receive clock signal nc1'. In some embodiments, circuit 110 is coupled to inverter 104, and is configured to receive clock signal nc2'.

Inverter 114 is coupled to circuit 110, stacked gate circuit 112 and transmission gate 116.

An input terminal of inverter 114 is configured to receive the signal nl1'. The input terminal of inverter 114 is coupled to the output terminal of circuit 110 and the output terminal of the stacked gate circuit 112.

An output terminal of inverter 114 is configured to output the signal nl2'. In some embodiments, signal nl2' is inverted from signal nl1', and vice versa. The output terminal of inverter 114 is coupled to a third input terminal of transmission gate 116 and an input terminal of stacked gate circuit 112. In some embodiments, the node nl2 corresponds to at least one of the input terminal of stacked gate circuit 112, the third input terminal of transmission gate 116 or the output terminal of inverter 114.

Stacked gate circuit 112 is coupled to inverter 114, circuit 110 and transmission gate 116.

The input terminal of stacked gate circuit 112 is configured to receive the signal nl2'. The input terminal of stacked gate circuit 112 is coupled to the third input terminal of transmission gate 116 and the output terminal of inverter 114.

The output terminal of stacked gate circuit 112 is configured to output the signal nl1'. The output terminal of stacked gate circuit 112 is coupled to the input terminal of inverter 114 and the output terminal of circuit 110.

Transmission gate 116 is coupled to stacked gate circuit 112, inverter 114, stacked gate circuit 118, and inverter 120. Transmission gate 116 includes transistors T17-T18 (described below in FIG. 1B).

The first input terminal of transmission gate 116 is configured to receive the signal nc1'. The first input terminal of transmission gate 116 is coupled to the output terminal of inverter 102.

The second input terminal of transmission gate 116 is configured to receive the signal nc2'.

The second input terminal of transmission gate 116 is coupled to the output terminal of inverter 104.

The third input terminal of transmission gate 116 is configured to receive the signal nl2'. The third input terminal of transmission gate 116 is coupled to the input terminal of stacked gate circuit 112 and the output terminal of inverter 114.

The output terminal of stacked gate circuit 118 is configured to output the signal nl3'. The output terminal of stacked gate circuit 118 is coupled to an input terminal of inverter 120 and an output terminal of transmission gate 116.

In some embodiments, the node nl3 corresponds to at least one of the output terminal of transmission gate 116, the output terminal of stacked gate circuit 118 and the input terminal of inverter 120.

Inverter 120 is coupled to inverter 122, stacked gate circuit 118 and transmission gate 116.

The input terminal of inverter 120 is configured to receive the signal nl3'. The input terminal of inverter 120 is coupled to the output terminal of transmission gate 116 and the output terminal of the stacked gate circuit 118.

An output terminal of inverter 120 is configured to output the signal nl4'. In some embodiments, signal nl4' is inverted from signal nl3', and vice versa. The output terminal of inverter 120 is coupled to an input terminal of inverter 122 and an input terminal of stacked gate circuit 118.

In some embodiments, the node nl4 corresponds to at least one of the input terminal of stacked gate circuit 118, an input terminal of inverter 122 or the output terminal of inverter 120.

Stacked gate circuit 118 is coupled to inverter 120, inverter 122 and transmission gate 116.

The input terminal of stacked gate circuit 118 is configured to receive the signal nl4'. The input terminal of stacked gate circuit 118 is coupled to the output terminal of inverter 120 and the input terminal of inverter 122.

The output terminal of stacked gate circuit 118 is configured to output the signal nl3'. The output terminal of stacked gate circuit 118 is coupled to the output terminal of transmission gate 116 and the input terminal of inverter 120.

Inverter 122 is coupled to inverter 120 and stacked gate circuit 118.

The input terminal of inverter 122 is configured to receive the signal nl4'. The input terminal of inverter 122 is coupled to the output terminal of inverter 120 and the input terminal of the stacked gate circuit 118.

An output terminal of inverter 122 is configured to output an output signal O'. In some embodiments, output signal O' is inverted from signal nl4', and vice versa.

In some embodiments, the node nl4 corresponds to at least the input terminal of inverter 122.

Figure 1B:
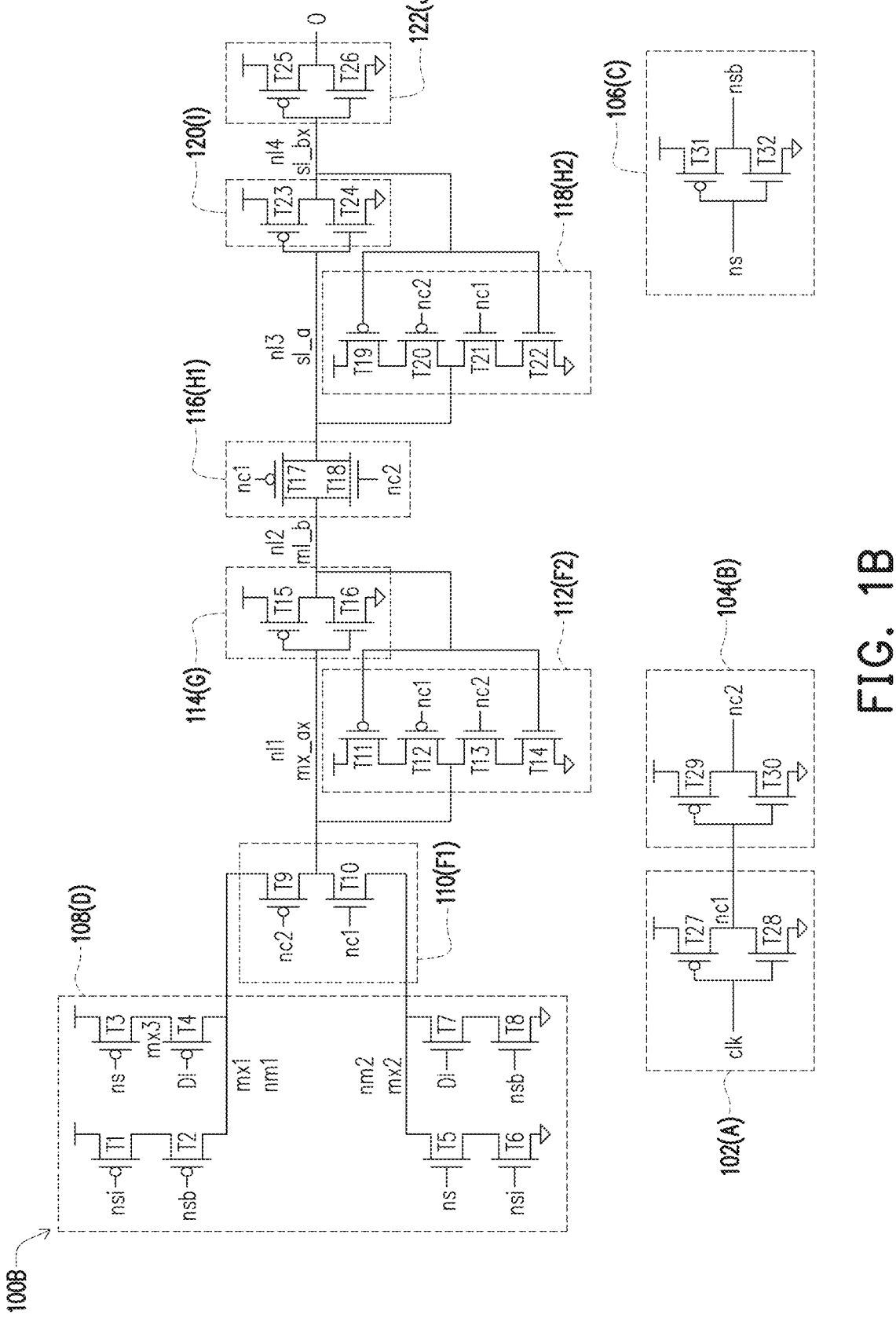
FIG. 1B is a circuit diagram of an integrated circuit, in accordance with some embodiments.

FIG. 1B is a circuit diagram of an integrated circuit 100B, in accordance with some embodiments. Integrated circuit 100B is an embodiment of integrated circuit 100A, and similar detailed description is therefore omitted.

Multiplexer 108 includes transistors T1-T8. In some embodiments, each of transistors T1, T2, T3 and T4 is a p-type metal oxide semiconductor (PMOS) transistor. In some embodiments, each of transistors T5, T6, T7 and T8 is an n-type metal oxide semiconductor (NMOS) transistor.

A gate terminal of transistor T1 is configured to receive scan in signal nsi'. A gate terminal of transistor T6 is configured to receive scan in signal nsi'. In some embodiments, the gate terminal of transistor T1 is coupled to the gate terminal of transistor T6.

A gate terminal of transistor T2 is configured to receive inverted scan enable signal nsb'. A source terminal of transistor T1 is coupled to the voltage supply VDD. A drain terminal of transistor T1 is coupled to a source terminal of transistor T2.

A gate terminal of transistor T3 is configured to receive scan enable signal ns'. A source terminal of transistor T3 is coupled to the voltage supply VDD. A drain terminal of transistor T3 is coupled to a source terminal of transistor T4.

A gate terminal of transistor T4 is configured to receive data signal DI'. A gate terminal of transistor T7 is configured to receive data signal DI'. In some embodiments, the gate terminal of transistor T4 is coupled to the gate terminal of transistor T7.

A source terminal of transistor T6 is coupled to the reference voltage supply VSS. A drain terminal of transistor T6 is coupled to a source terminal of transistor T5. A gate terminal of transistor T5 is configured to receive scan enable signal ns'. In some embodiments, the gate terminal of transistor T5 is coupled to the gate terminal of transistor T3.

A source terminal of transistor T8 is coupled to the reference voltage supply VSS. A drain terminal of transistor T8 is coupled to a source terminal of transistor T7. A gate terminal of transistor T8 is configured to receive inverted scan enable signal nsb'. In some embodiments, the gate terminal of transistor T8 is coupled to the gate terminal of transistor T2.

Each of the source terminal of transistor T9, the drain terminal of transistor T2 and the drain terminal of transistor T4 are coupled together at node nm1. Signal nm1' is the signal of at least the source terminal of transistor T9, the drain terminal of transistor T2 or the drain terminal of transistor T4.

Each of the source terminal of transistor T10, the drain terminal of transistor T5 and the drain terminal of transistor T7 are coupled together at node nm2. Signal nm2' is the signal of at least the source terminal of transistor T10, the drain terminal of transistor T5 or the drain terminal of transistor T7.

Circuit 110 includes transistors T9-T10. In some embodiments, circuit 110 is configured as a transmission gate. In some embodiments, transistor T9 is a PMOS transistor. In some embodiments, transistor T10 is an NMOS transistor.

Stacked gate circuit 112 includes transistors T11-T14. In some embodiments, each of transistors T11 and T12 is a PMOS transistor. In some embodiments, each of transistors T13 and T14 is an NMOS transistor.

A gate terminal of transistor T9 is configured to receive clock signal nc2' at node nc2. A gate terminal of transistor T10 is configured to receive clock signal nc1'.

Each of a drain terminal of transistor T9, a drain terminal of transistor T10, a drain terminal of transistor T13, a drain terminal of transistor T12, a gate terminal of transistor T15 and a gate terminal of transistor T16 are coupled together at node nl1. Signal nl1' is the signal of at least the drain terminal of transistor T9, the drain terminal of transistor T10, the drain terminal of transistor T13, the drain terminal of transistor T12, the gate terminal of transistor T15 or the gate terminal of transistor T16.

A gate terminal of transistor T11 and a gate terminal of transistor T14 are coupled together at node nl2, and are further coupled to transmission gate 116.

A source terminal of transistor T11 is coupled to the voltage supply VDD. A drain terminal of transistor T11 is coupled to a source terminal of transistor T12.

A gate terminal of transistor T12 is configured to receive clock signal nc1'. In some embodiments, the gate terminal of transistor T12 is coupled to at least an output terminal of inverter 102.

A gate terminal of transistor T13 is configured to receive clock signal nc2'. In some embodiments, the gate terminal of transistor T13 is coupled to at least an output terminal of inverter 104.

A source terminal of transistor T13 is coupled to a drain terminal of transistor T14. A source terminal of transistor T14 is coupled to the reference voltage supply VSS.

Inverter 114 includes transistors T15-T16. In some embodiments, transistor T15 is a PMOS transistor. In some embodiments, transistor T16 is an NMOS transistor.

Transmission gate 116 includes transistors T17-T18. In some embodiments, transistor T17 is a PMOS transistor. In some embodiments, transistor T18 is an NMOS transistor.

Stacked gate circuit 118 includes transistors T19-T22. In some embodiments, each of transistors T19 and T20 is a PMOS transistor. In some embodiments, each of transistors T21 and T22 is an NMOS transistor.

The gate terminals of transistors T15 and T16 are configured to receive signal nl1'. A source terminal of transistor T15 is coupled to the voltage supply VDD. A source terminal of transistor T16 is coupled to the reference voltage supply VSS.

Each of a drain terminal of transistor T15, a drain terminal of transistor T16, a source/drain terminal of transistor T17, a source/drain terminal of transistor T18, the gate terminal of transistor T11 and the gate terminal of transistor T14 are coupled together at node nl2.

A gate terminal of transistor T17 is configured to receive clock signal nc1'. A gate terminal of transistor T18 is configured to receive clock signal nc2'.

Each of a drain/source terminal of transistor T17, a drain/source terminal of transistor T18, a gate terminal of transistor T23, a gate terminal of transistor T24, a drain terminal of transistor T20 and a drain terminal of transistor T21 are coupled together at node nl3. Signal nl3' is the signal of at least the drain/source terminal of transistor T17, the drain/source terminal of transistor T18, the gate terminal of transistor T23, the gate terminal of transistor T24, the drain terminal of transistor T20 or the drain terminal of transistor T21.

Each of a gate terminal of transistor T19, a gate terminal of transistor T22, a drain terminal of transistor T23, a drain terminal of transistor T24, a gate terminal of transistor T25 and a gate terminal of transistor T26 are coupled together at node nl4. The gate terminal of transistor T19 and the gate terminal of transistor T22 are configured to receive signal nl4' from the drain terminal of transistor T23 and the drain terminal of transistor T24.

A source terminal of transistor T19 is coupled to the voltage supply VDD. A drain terminal of transistor T19 is coupled to a source terminal of transistor T20.

A gate terminal of transistor T20 is configured to receive clock signal nc2'. In some embodiments, the gate terminal of transistor T20 is coupled to at least an output terminal of inverter 104.

A gate terminal of transistor T21 is configured to receive clock signal nc1'. In some embodiments, the gate terminal of transistor T21 is coupled to at least an output terminal of inverter 102.

A source terminal of transistor T21 is coupled to a drain terminal of transistor T22. A source terminal of transistor T22 is coupled to the reference voltage supply VSS.

Inverter 120 includes transistors T23-T24. In some embodiments, transistor T23 is a PMOS transistor. In some embodiments, transistor T24 is an NMOS transistor.

Inverter 122 includes transistors T25-T26. In some embodiments, transistor T25 is a PMOS transistor. In some embodiments, transistor T26 is an NMOS transistor.

The gate terminals of transistors T23 and T24 are configured to receive signal nl3'. A source terminal of transistor T23 is coupled to the voltage supply VDD. A source terminal of transistor T24 is coupled to the reference voltage supply VSS. The drain terminals of transistors T23 and T24 are configured to output the signal nl4'.

The gate terminals of transistors T25 and T26 are coupled together, and configured to receive signal nl4'. A source terminal of transistor T25 is coupled to the voltage supply VDD. A source terminal of transistor T26 is coupled to the reference voltage supply VSS. The drain terminals of transistors T25 and T26 are coupled together, and configured to output the signal O' at node O.

Inverter 102 includes transistors T27-T28. In some embodiments, transistor T27 is a PMOS transistor. In some embodiments, transistor T28 is an NMOS transistor.

A gate terminal of transistor T27 and a gate terminal of transistor T28 are configured to receive clock signal clk' at node clk. The gate terminals of transistor T27 and transistor T28 are coupled together. A source terminal of transistor T27 is coupled to the voltage supply VDD. A drain terminal of transistor T27 and a drain terminal of transistor T28 are coupled together, and are configured to output inverted clock signal nc1'. A source terminal of transistor T28 is coupled to the reference voltage supply VSS.

Inverter 104 includes transistors T29-T30. In some embodiments, transistor T29 is a PMOS transistor. In some embodiments, transistor T30 is an NMOS transistor.

Each of the drain terminal of transistor T27, the drain terminal of transistor T28, a gate terminal of transistor T29 and a gate terminal of transistor T30 are coupled together at node nc1. The gate terminal of transistor T29 and the gate terminal of transistor T30 are configured to receive clock signal nc1'. A source terminal of transistor T29 is coupled to the voltage supply VDD. A drain terminal of transistor T29 and a drain terminal of transistor T30 are coupled together at node nc2, and are configured to output inverted clock signal nc2'. A source terminal of transistor T30 is coupled to the reference voltage supply VSS.

Inverter 106 includes transistors T31-T32. In some embodiments, transistor T31 is a PMOS transistor. In some embodiments, transistor T32 is an NMOS transistor.

A gate terminal of transistor T31 and a gate terminal of transistor T32 are configured to receive scan enable signal ns'. The gate terminals of transistor T31 and transistor T32 are coupled together at node ns. A source terminal of transistor T31 is coupled to the voltage supply VDD. A drain terminal of transistor T31 and a drain terminal of transistor T32 are coupled together at node nsb, and are configured to output inverted scan enable signal nsb'. A source terminal of transistor T32 is coupled to the reference voltage supply VSS.

In some embodiments, one or more NMOS transistors are changed to one or more PMOS transistors, and vice versa. In some embodiments, one or more of the drains or sources are flipped with the other.

Other configurations, arrangements or other circuits in integrated circuit 100B are within the scope of the present disclosure.

Figure 1C:
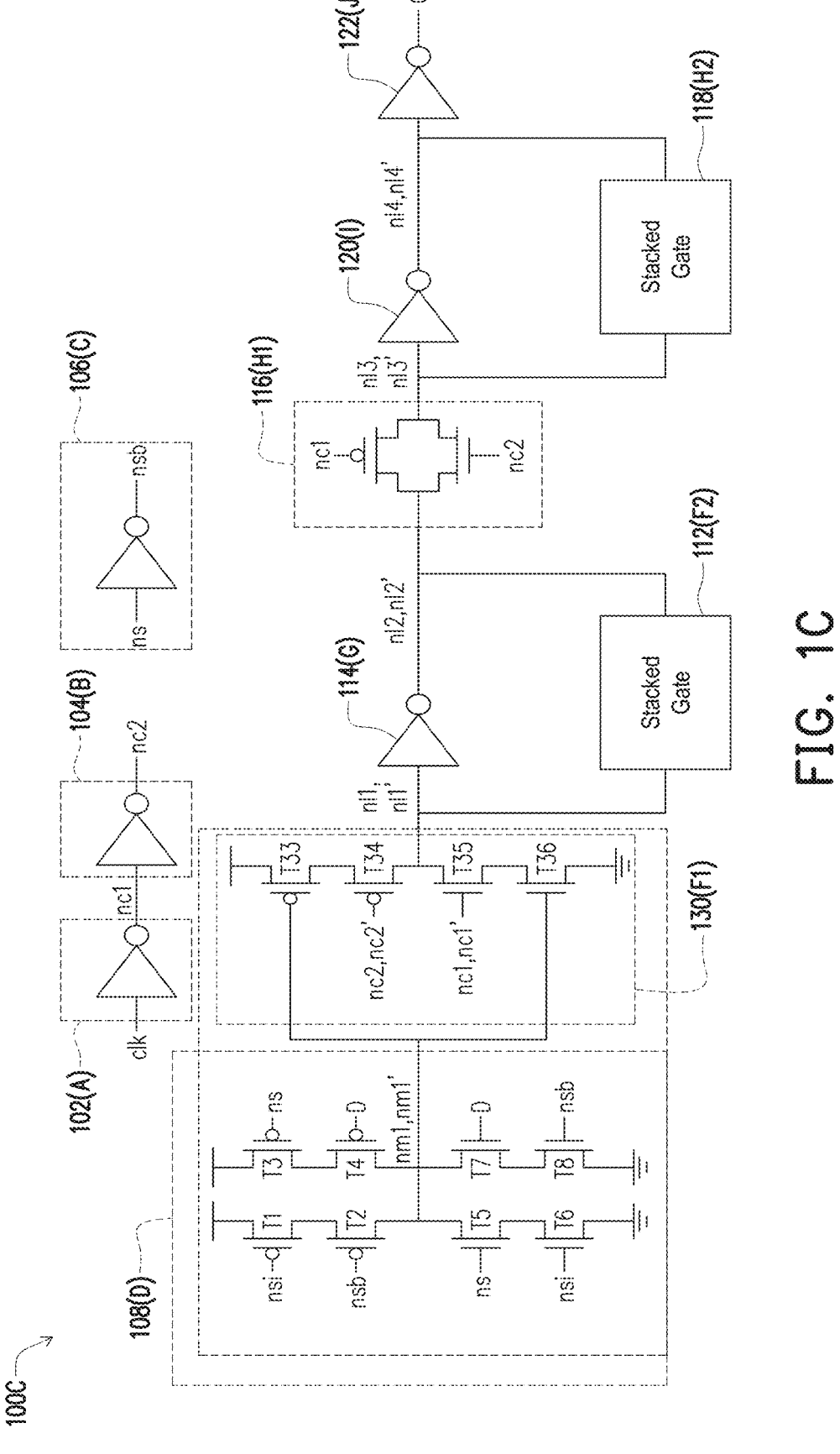
FIG. 1C is a circuit diagram of an integrated circuit, in accordance with some embodiments.

FIG. 1C is a circuit diagram of an integrated circuit 100C, in accordance with some embodiments.

Integrated circuit 100C is a variation of integrated circuit 100A and 100B, and similar detailed description is therefore omitted. In comparison with integrated circuit 100A or 100B, a stacked gate circuit 130 of FIG. 1C replaces circuit 110, and similar detailed description is therefore omitted.

Each of a gate terminal of transistor T33, a gate terminal of transistor T36, the drain terminal of transistor T2, the drain terminal of transistor T4, the drain terminal of transistor T5 and the drain terminal of transistor T7 are coupled together at node nm1. Signal nm1' is the signal of at least the gate terminal of transistor T33, the gate terminal of transistor T36, the drain terminal of transistor T2, the drain terminal of transistor T4, the drain terminal of transistor T5 or the drain terminal of transistor T7.

Stacked gate circuit 130 includes transistors T33-T36. In some embodiments, each of transistors T33 and T34 is a PMOS transistor. In some embodiments, each of transistors T35 and T36 is an NMOS transistor.

A source terminal of transistor T33 is coupled to the voltage supply VDD. A drain terminal of transistor T33 is coupled to a source terminal of transistor T34.

A gate terminal of transistor T34 is configured to receive clock signal nc2'. In some embodiments, the gate terminal of transistor T34 is coupled to at least an output terminal of inverter 104.

Each of a drain terminal of transistor T34, a drain terminal of transistor T35, the input terminal of inverter 114 and the output terminal of stacked gate circuit 112 are coupled together at node nl1.

In some embodiments, each of the drain terminal of transistor T34, the drain terminal of transistor T35, the gate terminal of transistor T15, the gate terminal of transistor T16, the drain terminal of transistor T12 and the drain terminal of transistor T13 are coupled together at node nl1. Signal nl1' is the signal of at least the drain terminal of transistor T34, the drain terminal of transistor T35, the gate terminal of transistor T15, the gate terminal of transistor T16, the drain terminal of transistor T12 or the drain terminal of transistor T13.

A gate terminal of transistor T35 is configured to receive clock signal nc1'. In some embodiments, the gate terminal of transistor T35 is coupled to at least an output terminal of inverter 102.

A source terminal of transistor T35 is coupled to a drain terminal of transistor T36. A source terminal of transistor T36 is coupled to the reference voltage supply VSS.

Other configurations, arrangements or other circuits in integrated circuit 100C are within the scope of the present disclosure.

Figure 1D:
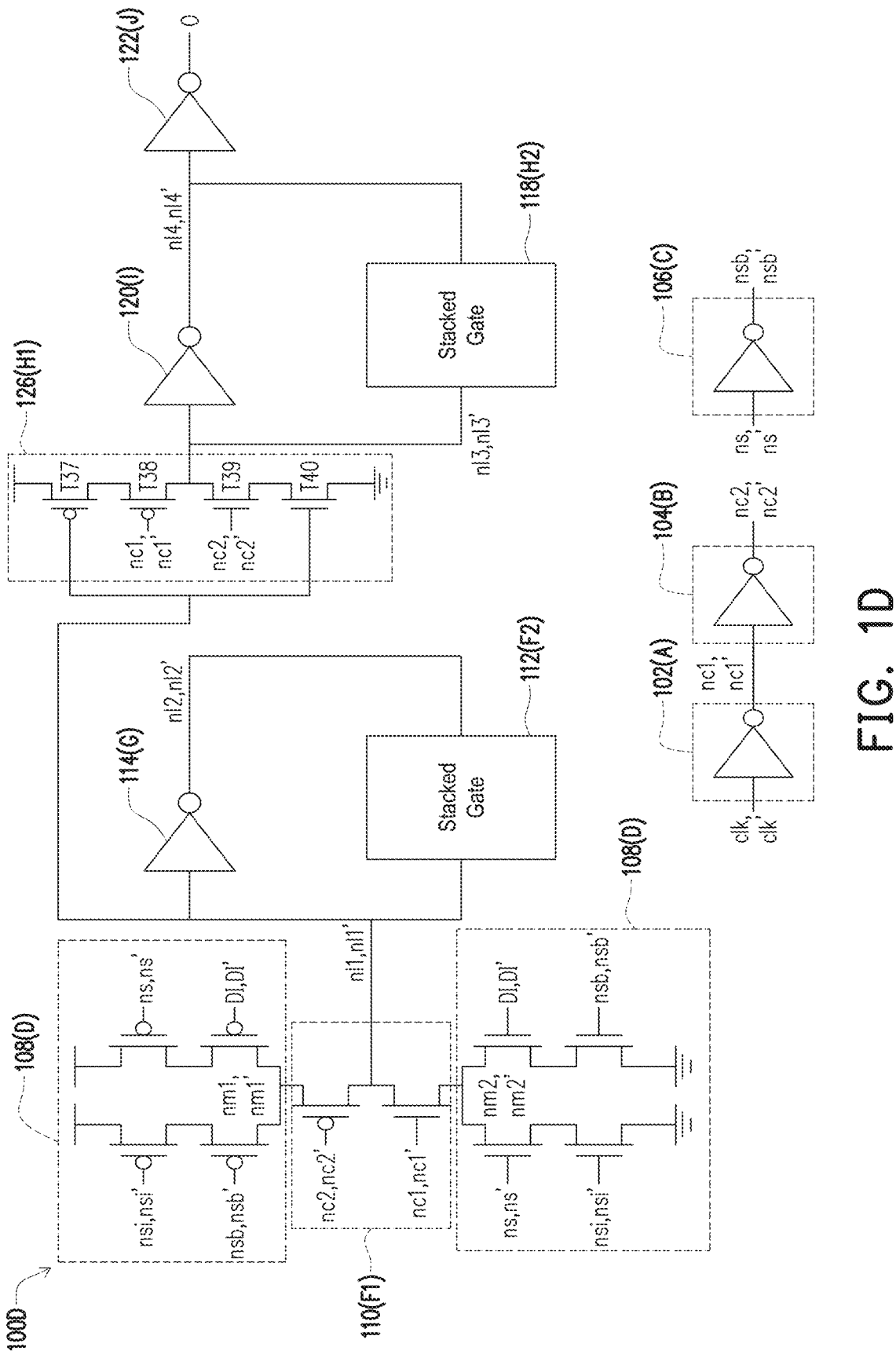
FIG. 1D is a circuit diagram of an integrated circuit, in accordance with some embodiments.

FIG. 1D is a circuit diagram of an integrated circuit 100D, in accordance with some embodiments.

Integrated circuit 100D is a variation of integrated circuit 100A and 100B, and similar detailed description is therefore omitted. In comparison with integrated circuit 100A or 100B, a stacked gate circuit 126 of FIG. 1D replaces transmission gate 116, and similar detailed description is therefore omitted.

An input terminal of stacked gate circuit 126 is coupled to the output terminal of circuit 110, the input terminal of inverter 114 and the output terminal of stacked gate circuit 112.

An output terminal of stacked gate circuit 126 is coupled to the input terminal of inverter 120 and the output terminal of stacked gate circuit 118.

Stacked gate circuit 126 includes transistors T37-T40. In some embodiments, each of transistors T37 and T38 is a PMOS transistor. In some embodiments, each of transistors T39 and T40 is an NMOS transistor.

Each of a gate terminal of transistor T37, a gate terminal of transistor T40, the output terminal of circuit 110, the input terminal of inverter 114 and the output terminal of stacked gate circuit 112 are coupled together.

In some embodiments, each of a gate terminal of transistor T37, a gate terminal of transistor T40, the drain terminal of transistor T9, the drain terminal of transistor T10, the drain terminal of transistor T13, the drain terminal of transistor T12, the gate terminal of transistor T15 and the gate terminal of transistor T16 are coupled together at node nl1. Signal nl1' is the signal of at least the gate terminal of transistor T37, a gate terminal of transistor T40, the drain terminal of transistor T9, the drain terminal of transistor T10, the drain terminal of transistor T13, the drain terminal of transistor T12, the gate terminal of transistor T15 or the gate terminal of transistor T16.

A source terminal of transistor T37 is coupled to the voltage supply VDD. A drain terminal of transistor T37 is coupled to a source terminal of transistor T38.

A gate terminal of transistor T38 is configured to receive clock signal nc1'. In some embodiments, the gate terminal of transistor T38 is coupled to at least an output terminal of inverter 102.

Each of a drain terminal of transistor T38, a drain terminal of transistor T39, the input terminal of inverter 120 and the output terminal of stacked gate circuit 118 are coupled together at node nl3.

In some embodiments, each of the drain terminal of transistor T38, the drain terminal of transistor T39, the gate terminal of transistor T23, the gate terminal of transistor T24, the drain terminal of transistor T20 and the drain terminal of transistor T21 are coupled together at node nl3. Signal nl3' is the signal of at least the drain terminal of transistor T38, the drain terminal of transistor T39, the gate terminal of transistor T23, the gate terminal of transistor T24, the drain terminal of transistor T20 or the drain terminal of transistor T21.

A gate terminal of transistor T39 is configured to receive clock signal nc2'. In some embodiments, the gate terminal of transistor T39 is coupled to at least an output terminal of inverter 104.

A source terminal of transistor T39 is coupled to a drain terminal of transistor T40. A source terminal of transistor T40 is coupled to the reference voltage supply VSS.

Other configurations, arrangements or other circuits in integrated circuit 100D are within the scope of the present disclosure.

Figure 2A:
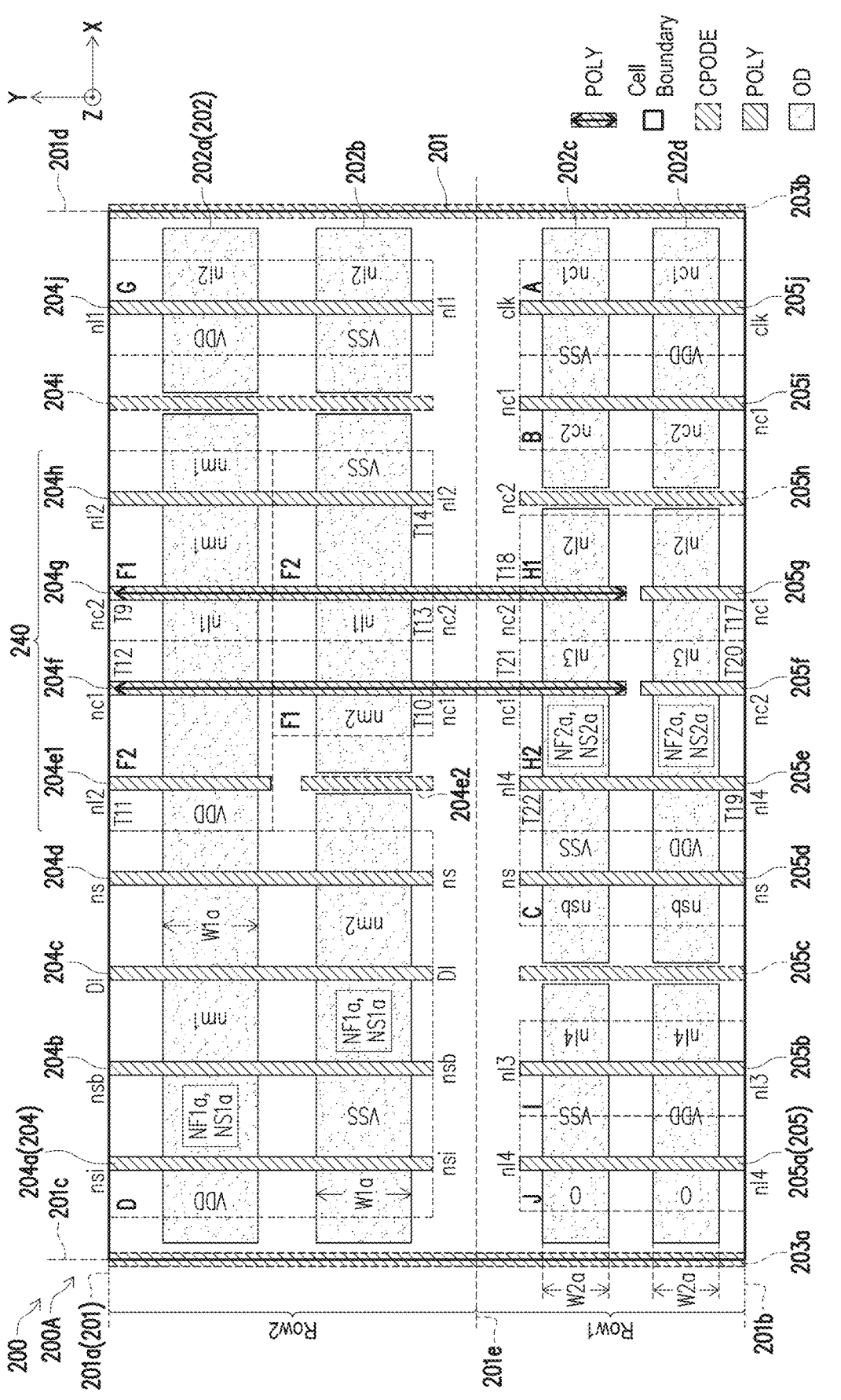
FIGS. 2A-2D are corresponding diagrams of a layout design of a corresponding integrated circuit, in accordance with some embodiments.
Figure 2B:
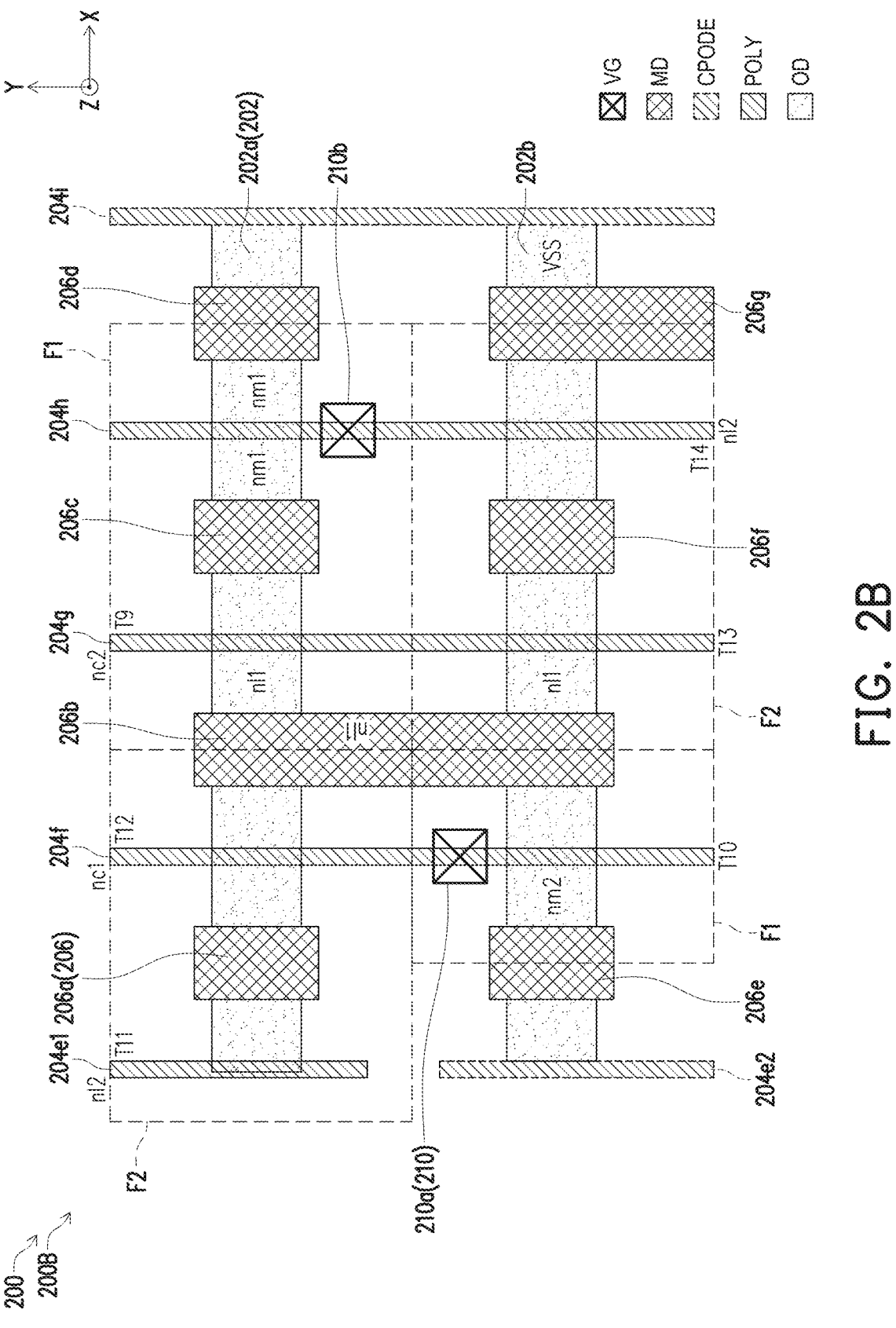
Figure 2C:
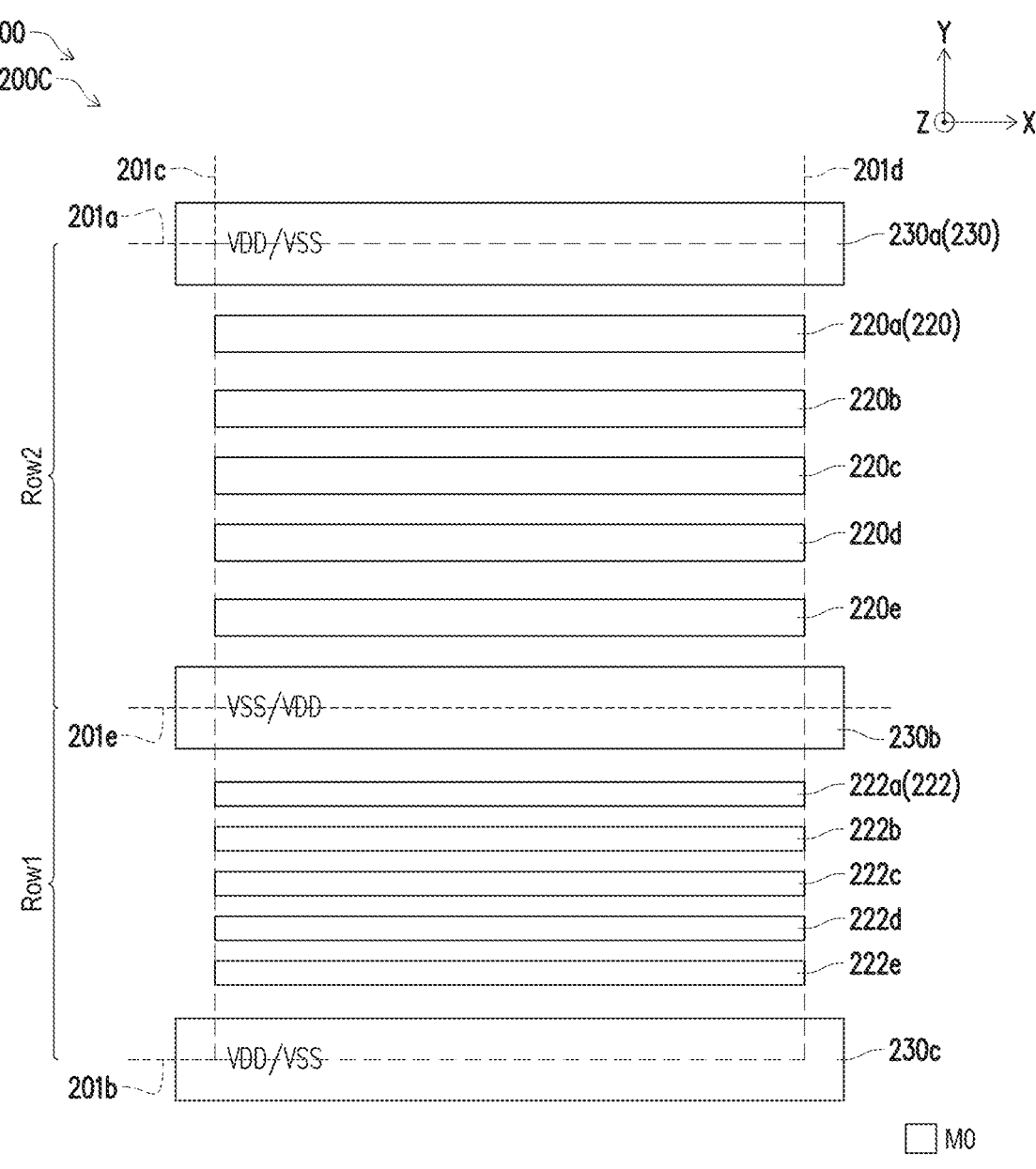

FIGS. 2A-2C are diagrams of a layout design 200 of an integrated circuit, in accordance with some embodiments. Layout design 200 is a layout diagram of at least integrated circuit 100A of FIG. 1A, integrated circuit 100B of FIG. 1B or integrated circuit 300 of FIGS. 3A-3F.

Figure 2D:
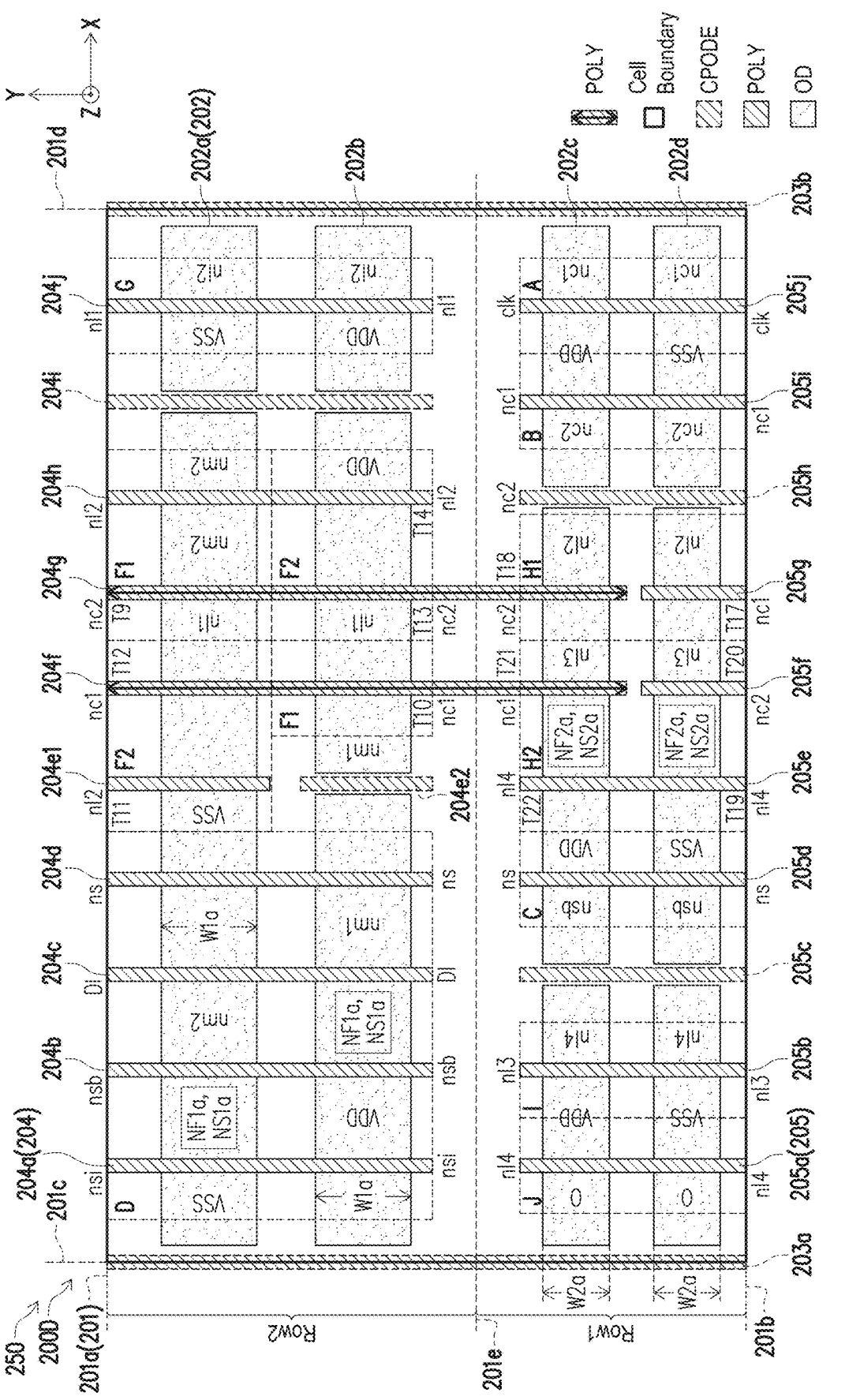

FIG. 2D is a diagram of a layout design 250 of an integrated circuit, in accordance with some embodiments. Layout design 250 is a layout diagram of at least integrated circuit 100A of FIG. 1A, integrated circuit 100B of FIG. 1B or integrated circuit 350 of FIG. 3D.

FIG. 2A is a diagram of a corresponding portion 200A of a layout design 200, simplified for ease of illustration.

FIG. 2B is a diagram of a corresponding portion 200B of a layout design 200, simplified for ease of illustration. In some embodiments, portion 200B is a zoomed-in portion of region 240 of FIG. 2A, and similar detailed description is therefore omitted.

FIG. 2C is a diagram of a corresponding portion 200C of a layout design 200, simplified for ease of illustration.

FIG. 2D is a diagram of a corresponding portion 200D of a layout design 250, simplified for ease of illustration.

For ease of illustration, some of the labeled elements of one or more of FIGS. 2A-2D, 3A-3F, 4A-4C, 5A-5B, 6-7, 8A-8B, 9A-9B and 10-15 are not labelled in one or more of FIGS. 2A-2D, 3A-3F, 4A-4C, 5A-5B, 6-7, 8A-8B, 9A-9B and 10-15. In some embodiments, layout design 200 includes additional elements not shown in FIGS. 2A-2C. In some embodiments, layout design 250 includes additional elements not shown in FIG. 2D.

Portion 200A includes one or more features of layout design 200 of an oxide diffusion (OD) level or an active level, a gate (POLY) level or a continuous poly over diffusion edge (CPODE) level of layout design 200.

Portion 200B includes one or more features of layout design 200 of the OD level, the POLY level, the CPODE level, a metal over diffusion (MD) level and a via over gate (VG) level of layout design 200.

Portion 200C includes one or more features of the metal 0 (M0) level of at least layout design 200 or 250.

Portion 200D includes one or more features of layout design 250 of the OD level, the POLY level and the CPODE level of layout design 250.

In some embodiments, at least layout design 200 or 250 includes additional elements not shown in FIGS. 2A-2D for ease of illustration. In some embodiments, at least one of integrated circuit 300, 350, 400, 450, 500A-500B, 600, 700, 800A-800B, 900A-900B or 1000 include additional elements not shown in FIGS. 2A-2D for ease of illustration.

Layout design 200 or 250 is usable to manufacture integrated circuit 100A of FIG. 1A or integrated circuit 100B of FIG. 1B. Layout design 200 or 250 is usable to manufacture integrated circuit 300 of FIGS. 3A-3F.

Layout design 200 corresponds to a cell 201. Cell 201 includes a cell boundary 201a and a cell boundary 201b that extend in a first direction X. Cell 201 further includes a cell boundary 201c and a cell boundary 201d that extend in a second direction Y. In some embodiments, the second direction Y is different from the first direction X. Cell 201 is divided into row 1 and row 2. A line 201e separates row 1 and row 2 of cell 201 from each other. Line 201e extends in the first direction X.

Cell 201 corresponds to a standard cell of integrated circuit 100A of FIG. 1A or integrated circuit 100B of FIG. 1B. In some embodiments, cell 201 is a standard cell of a flip-flop. In some embodiments, layout design 200 abuts other cell layout designs (not shown) along cell boundaries 201a and 201b, and along cell boundaries 201c and 201d that extend in the second direction Y. In some embodiments, layout design 200 is a double height standard cell.

In some embodiments, layout design 200 is a layout of integrated circuit 100A of FIG. 1A or integrated circuit 100B of FIG. 1B.

Layout design 200 has two rows extending in the first direction X, and being separated from each other in the second direction Y.

Each of multiplexer D, stacked gate circuit F2, circuit F1, and inverter G are in row 2. Stacked gate circuit F2 and circuit F1 are between multiplexer D and inverter G.

Each of inverter J, inverter I, inverter C, stacked gate circuit H2, transmission gate H1, inverter B and inverter A are in row 1. Inverter I, inverter C, stacked gate circuit H2, transmission gate H1, inverter B are between inverter J and inverter A. Other arrangements in layout design 200 are within the scope of the present disclosure.

Layout design 200 includes one or more active region layout patterns 202a, 202b, 202c or 202d (collectively referred to as a "set of active region patterns 202") extending in the first direction X.

Embodiments of the present disclosure use the term "layout pattern" which is hereinafter also referred to as "patterns" in the remainder of the present disclosure for brevity.

Active region patterns 202a, 202b, 202c or 202d of the set of active region patterns 202 are separated from one another in the second direction Y.

The set of active region patterns 202 is usable to manufacture a corresponding set of active regions 302 of integrated circuit 300, 350, 400, 450, 500A-500B, 600, 700, 800A-800B, 900A-900B or 1000. In some embodiments, the set of active regions 302 are located on a front-side of integrated circuit 300, 350, 400, 450, 500A-500B, 600, 700, 800A-800B, 900A-900B or 1000. In some embodiments, the set of active regions 302 correspond to source and drain regions of one or more planar transistors, finFET transistors, nanosheet transistors or nanowire transistors. Other transistor types are within the scope of the present disclosure.

In some embodiments, active region patterns 202a, 202b, 202c, 202d are usable to manufacture corresponding active regions 302a, 302b, 302c, 302d of the set of active regions 302 of integrated circuit 300, 350, 400, 450, 500A-500B, 600, 700, 800A-800B, 900A-900B or 1000.

In some embodiments, the set of active region patterns 202 is referred to as an oxide diffusion (OD) region which defines the source or drain diffusion regions of at least integrated circuit 300, 350, 400, 450, 500A-500B, 600, 700, 800A-800B, 900A-900B or 1000 or layout design 200 or 250.

As shown in FIG. 2A, active region patterns 202a and 202d correspond to a supply voltage VDD (e.g., conductive feature patterns/power rail patterns 230a and 230c), and therefore active region patterns 202a and 202d correspond to PMOS transistors. As shown in FIG. 2A, active region patterns 202b and 202c correspond to a reference supply voltage VSS (e.g., conductive feature pattern/power rail pattern 230b) and therefore active region patterns 202b and 202c correspond to NMOS transistors.

In some embodiments, active region patterns 202a and 202d are usable to manufacture source and drain regions of PMOS transistors of integrated circuit 300, 400A, 500A, 600, 700, 800A, 900A or 1000, and active region patterns 202b and 202c are usable to manufacture source and drain regions of NMOS transistors of integrated circuits 300, 400A, 500A, 600, 700, 800A, 900A or 1000.

In some embodiments, active region patterns 202a, 202b, 202c and 202d are shown in FIGS. 2A, 2D are shown with corresponding node labels (e.g., nm1, nm2, nl1, nl2, nl3, nl4, D, O, nc1, nc2, nsb, VDD, VSS, etc.) that identify corresponding drain or source regions of corresponding transistors of FIGS. 1A-1D that are coupled to the corresponding node. For example, a source of transistor T1 of active region pattern 202a is coupled to supply voltage VDD, and is labeled in FIG. 2A with "VDD." Similarly, a source of transistor T8 and a source of transistor T6 of active region pattern 202b is coupled to reference supply voltage VSS, and is labeled in FIG. 2A with "VSS."

In some embodiments, active region patterns 202a and 202d are usable to manufacture source and drain regions of NMOS transistors of integrated circuits 350, 450, 500B, 600, 700, 800B, 900B or 1000, and active region patterns 202b and 202c are usable to manufacture source and drain regions of PMOS transistors of integrated circuits 350, 450, 500B, 600, 700, 800B, 900B or 1000.

At least one of active region pattern 202a or 202b has a width W1a in the second direction.

At least one of active region pattern 202c or 202d has a width W2a in the second direction.

The width W1a is greater than width W2a. In some embodiments, the width W1a is equal to the width W2a.

In some embodiments, the width W1a of active region patterns 202a and 202b is related to the number of conducting devices (e.g., transistors) manufactured by the corresponding active region patterns 202a and 202b, and the corresponding speed and driving strength of the conducting devices (e.g., transistors) in the corresponding active regions 302a and 302b.

In some embodiments, at least the width W1a of active region patterns 202a and 202b is directly related to the number of fin patterns NF1a useable to manufacture corresponding fins in active region 302a and 302b. In some embodiments, at least the width W2a of active region patterns 202c and 202d is directly related to the number of fin patterns NF2a useable to manufacture corresponding fins in active region 302c and 302d.

For example, in some embodiments, an increase in the width W1a of active region patterns 202a and 202b or the width W2a of active region patterns 202c and 202d causes the number of fins NF1a and NF2a and the number of conducting devices (e.g., transistors) manufactured by set of active region layout patterns 202 to increase, and the corresponding speed and driving strength of the conducting devices (e.g., transistors) increases while the area and power consumed increases.

For example, in some embodiments, a decrease in the width W1a of active region patterns 202a and 202b or the width W2a of active region patterns 202c and 202d causes the number of fins NF1a and NF2a and the number of conducting devices (e.g., transistors) manufactured by set of active region layout patterns 202 to decrease, and the corresponding speed and driving strength of the conducting devices (e.g., transistors) decreases while the area and power consumed decreases.

In some embodiments, active region patterns 202a and 202b have a number of nanosheets NS1a that are useable to manufacture corresponding nanosheets in active region 302a and 302b. In some embodiments, active region patterns 202c and 202d have a number of nanosheets NS2a that are useable to manufacture corresponding nanosheets in active region 302c and 302d.

The number of nanosheets NS1a in active region patterns 202a and 202b is greater than a number of nanosheets NS2a in active region patterns 202c and 202d. In some embodiments, the number of nanosheets NS1a in active region patterns 202a and 202b is equal to the number of nanosheets NS2a in active region patterns 202c and 202d.

In some embodiments, the set of active region patterns 202 is located on a first layout level. In some embodiments, the first layout level corresponds to an active level or an OD level of one or more of layout design 200 or 250 or integrated circuit 300, 350, 400, 450, 500A-500B, 600, 700, 800A-800B, 900A-900B or 1000.

Other configurations, arrangements on other layout levels or quantities of patterns in the set of active region patterns 202 are within the scope of the present disclosure.

Layout design 200 further includes one or more gate patterns 203a or 203b (collectively referred to as a "set of dummy gate patterns 203"), one or more gate patterns 204a, 204b, 204c, 204d, 204e, 204f, 204g, 204h, 204i or 204j (collectively referred to as a "set of gate patterns 204") or one or more gate patterns 205a, 205b, 205c, 205d, 205e, 205f, 205g, 205h, 205i or 205j (collectively referred to as a "set of gate patterns 205") extending in the second direction Y.

The set of dummy gate patterns 203 is usable to manufacture a corresponding set of dummy gates 303 of integrated circuit 300, 350, 400, 450, 500A-500B, 600, 700, 800A-800B, 900A-900B or 1000.

In some embodiments, dummy gate patterns 203a, 203b are usable to manufacture corresponding dummy gates 303a, 303b of the set of dummy gates 303 of integrated circuit 300, 350, 400, 450, 500A-500B, 600, 700, 800A-800B, 900A-900B or 1000.

The set of dummy gate patterns 203 overlap cell boundaries 201c and 201d. In some embodiments, dummy gate patterns are also referred to as CPODE patterns.

The set of gate patterns 204 is usable to manufacture a corresponding set of gates 304 of integrated circuit 300, 350, 400, 450, 500A-500B, 600, 700, 800A-800B, 900A-900B or 1000.

In some embodiments, gate patterns 204a, 204b, 204c, 204d, 204e1, 204e2, 204f, 204g, 204h, 204i or 204j are usable to manufacture corresponding gates 304a, 304b, 304c, 304d, 304e1, 304e2, 304f, 304g, 304h, 304i or 304j of the set of gates 304 of integrated circuit 300, 350, 400, 450, 500A-500B, 600, 700, 800A-800B, 900A-900B or 1000.

Gate pattern 204i is a dummy gate pattern useable to manufacture dummy gate 304i.

The set of gate patterns 205 is usable to manufacture a corresponding set of gates 305 of integrated circuit 300, 350, 400, 450, 500A-500B, 600, 700, 800A-800B, 900A-900B or 1000.

In some embodiments, gate patterns 205a, 205b, 205c, 205d, 205e, 205f, 205g, 205h, 205i or 205j are usable to manufacture corresponding gates 305a, 305b, 305c, 305d, 305e, 305f, 305g, 305h, 305i or 305j of the set of gates 305 of integrated circuit 300, 350, 400, 450, 500A-500B, 600, 700, 800A-800B, 900A-900B or 1000.

Gate pattern 205c is a dummy gate pattern useable to manufacture dummy gate 305c. Gate pattern 205h is a dummy gate pattern useable to manufacture dummy gate 305h.

In some embodiments, each of the gate patterns in the set of gate patterns 204 and 205 is shown in FIGS. 2A and 2D with labels "T1-T32" that identify corresponding transistors of FIGS. 1A-1B manufactured by the corresponding gate pattern in FIGS. 2A-2D, and further description is omitted for brevity.

The set of gate patterns 204 is above the set of active region patterns 202. The set of gate patterns 204 is positioned on a second layout level different from the first layout level. In some embodiments, the second layout level is different from the first layout level. In some embodiments, the second layout level corresponds to the POLY level of one or more of layout design 200 or 250 or integrated circuit 300, 350, 400, 450, 500A-500B, 600, 700, 800A-800B, 900A-900B or 1000. In some embodiments, the POLY level is above the OD level.

Gate pattern 204f overlaps active region patterns 202a, 202b and 202c. Gate pattern 204f corresponds to node nc1/signal nc1'. Gate pattern 204f corresponds to transistor T12 of stacked gate circuit F2, transistor T10 of circuit F1 and transistor T21 of stacked gate circuit H2.

Gate pattern 205f overlaps active region pattern 202d. Gate pattern 205f corresponds to node nc2/signal nc2'. Gate pattern 205f corresponds to transistor T20 of stacked gate circuit H2.

Gate pattern 204g overlaps active region patterns 202a, 202b and 202c. Gate pattern 204f corresponds to node nc2/signal nc2'. Gate pattern 204g corresponds to transistor T9 of circuit F1, transistor T13 of stacked gate circuit F2 and transistor T18 of transmission gate H1.

Gate pattern 205g overlaps active region pattern 202d. Gate pattern 205g corresponds to node nc1/signal nc1'. Gate pattern 205g corresponds to transistor T17 of transmission gate H1.

Gate pattern 204f and gate pattern 205f are separated from each other in the second direction Y. Gate pattern 204g and gate pattern 205g are separated from each other in the second direction Y.

Gate pattern 204f and gate pattern 205g are not aligned in the second direction Y. Stated differently, gate pattern 204f and gate pattern 205g are not aligned with each other along a common axis that extends in the second direction Y. Stated differently, gate pattern 204f and gate pattern 205g are twisted with respect to each other. In some embodiments, twisted structures are two or more structures that have a same signal (nc1' or nc2'), but the two or more structures are not aligned in the second direction Y.

Within row 2, node nm1 in circuit F1 and node nm2 in circuit F1 are not aligned in the second direction Y across active region patterns 202a and 202b.

Within row 2, the node nl1 of circuit F1 is aligned in the second direction Y across active region patterns 202a and 202b, and a same MD contact pattern (e.g., contact pattern 206b) of circuit F1 is shared with stacked gate circuit F2, thereby allowing signal nc1' to be routed on gate pattern 204f across active region patterns 202a, 202b and 202c from row 2 to row 1, and thereby allowing signal nc2' to be routed on gate pattern 204g across active region patterns 202a, 202b and 202c from row 2 to row 1. Thus, signals nc1' and nc2' are routed across at least 3 active region patterns and across rows within cell 201 thereby maximizing vertical routing resource alignment like POLY or MD to reduce M0 usage in layout design 200. In some embodiments, by reducing M0 usage, layout design 200 offers more routing flexibility and more via landing spots, and thereby increasing routing resources compared to other approaches.

Within row 1, node nl2 of transmission gate H1 is aligned in the second direction Y across active region patterns 202c and 202d.

Within row 1, node nl3 of transmission gate H1 is aligned in the second direction Y across active region patterns 202c and 202d, and shares the MD region (e.g., contact pattern (not shown)) with the stacked gate circuit H2.

Within row 1, signal nc1' in transmission gate H1 and stacked gate circuit H2 are not routed on the same poly. Within row 1, signal nc1' is routed on gate patterns 204f and 205g.

Within row 1, signal nc2' in transmission gate H1 and stacked gate circuit H2 are not routed on the same poly. Within row 1, signal nc2' is routed on gate patterns 204g and 205f.

Other configurations, arrangements on other layout levels or quantities of patterns in the set of gate patterns 204 are within the scope of the present disclosure.

Layout design 200 further includes one or more contact patterns 206a, 206b, 206c, . . . , 206g (collectively referred to as a "set of contact patterns 206") extending in the second direction Y. For ease of illustration, the set of contact patterns 206 are shown only in row 2 of cell 201 in FIG. 2A, cell 201 further includes a set of contact patterns that are similar to the set of contact patterns 206, and similar detailed description and illustration is omitted for brevity.

Each of the contact patterns of the set of contact patterns 206 is separated from an adjacent contact pattern of the set of contact patterns 206 in at least the first direction X or the second direction Y. For ease of illustration, one or more contact patterns of the set of contact patterns 206 are not labelled.

The set of contact patterns 206 is usable to manufacture a corresponding set of contacts 306 of integrated circuit 300, 350, 400, 450, 500A-500B, 600, 700, 800A-800B, 900A-900B or 1000.

In some embodiments, contact pattern 206a, 206b, 206c, . . . , 206g of the set of contact patterns 206 is usable to manufacture corresponding contact 306a, 306b, 306c, . . . , 306g of the set of contacts 306.

In some embodiments, the set of contact patterns 206 is also referred to as a set of metal over diffusion (MD) patterns.

In some embodiments, at least one of contact pattern 206a, 206b, 206c, . . . , 206g of the set of contact patterns 206 is usable to manufacture source or drain terminals of one of the NMOS or PMOS transistors of integrated circuit 100A-100B, 300, 400, 500A-500B, 700, 800A-800B, 900A-900B or 1000.

Contact pattern 206b overlaps active region pattern 202a and 202b. Contact patterns 206a, 206c and 206d overlap active region pattern 202a. Contact patterns 206e, 206f and 206g overlap active region pattern 202b.

In some embodiments, the set of contact patterns 206 overlap the set of active region patterns 202. The set of contact patterns is located on a third layout level. In some embodiments, the third layout level is different from the first layout level. In some embodiments, the third layout level corresponds to the contact level or an MD level of one or more of layout design 200 or 250 or integrated circuit 300, 350, 400, 450, 500A-500B, 600, 700, 800A-800B, 900A-900B or 1000. In some embodiments, the MD level is above the OD level.

Other configurations, arrangements on other layout levels or quantities of patterns in the set of contact patterns 206 are within the scope of the present disclosure.

Layout design 200 further includes one or more conductive feature patterns 220a, 220b, . . . , 220e (collectively referred to as a "set of conductive feature patterns 220") or one or more conductive feature patterns 222a, 222b, . . . , 222e (collectively referred to as a "set of conductive feature patterns 222") extending in the first direction X.

The set of conductive feature patterns 220 is usable to manufacture a corresponding set of conductors 320 of integrated circuit 300, 350, 400, 450, 500A-500B, 600, 700, 800A-800B, 900A-900B or 1000. The set of conductive feature patterns 222 is usable to manufacture a corresponding set of conductors 322 of integrated circuit 300, 350, 400, 450, 500A-500B, 600, 700, 800A-800B, 900A-900B or 1000.

Conductive feature patterns 220a, 220b, . . . , 220e are usable to manufacture corresponding conductors 320a, 320b, . . . , 320e of a set of conductors 320 of integrated circuit 300, 350, 400, 450, 500A-500B, 600, 700, 800A-800B, 900A-900B or 1000. Conductive feature patterns 222a, 222b, . . . , 222e are usable to manufacture corresponding conductors 322a, 322b, . . . , 322e of a set of conductors 322 of integrated circuit 300, 350, 400, 450, 500A-500B, 600, 700, 800A-800B, 900A-900B or 1000.

The set of conductive feature patterns 220 are located in row 2 of cell 201. The set of conductive feature patterns 220 overlap active region patterns 202a and 202b, the set of gate patterns 204 and 205, the set of contacts 206 and the set of vias 210.

The set of conductive feature patterns 222 are located in row 1 of cell 201. The set of conductive feature patterns 222 overlap active region patterns 202c and 202d, the set of gate patterns 204 and 205, a set of contacts (not shown in FIG. 2A) and a set of vias (similar to set of vias 210).

In some embodiments, the set of conductive feature patterns 220 or the set of conductive feature patterns 222 are located on a fourth layout level. In some embodiments, the fourth layout level is different from the first layout level, the second layout level and the third layout level. In some embodiments, the fourth layout level corresponds to the M0 level of one or more of layout design 200 or 250 or integrated circuit 300, 350, 400, 450, 500A-500B, 600, 700, 800A-800B, 900A-900B or 1000. In some embodiments, the M0 level is above the OD level, the MD level, the POLY level and the VG level.

The set of conductive feature patterns 220 corresponds to 5 M0 routing tracks and the set of conductive feature patterns 222 corresponds to 5 M0 routing tracks.

In some embodiments, the set of conductive feature patterns 220 includes 4-5 M0 routing tracks and the set of conductive feature patterns 222 includes 4-5 5 M0 routing tracks. Other numbers of M0 routing tracks are within the scope of the present disclosure.

Other configurations, arrangements on other layout levels or quantities of patterns in the set of conductive feature patterns 220 or 222 are within the scope of the present disclosure.

Layout design 200 further includes one or more conductive feature patterns 230a, 230b or 230c (collectively referred to as a "set of conductive feature patterns 230") extending in at least the first direction X.

Each of conductive feature patterns 230a, 230b and 230c of the set of conductive feature patterns 230 are separated from each other in at least the second direction Y.

In some embodiments, conductive feature patterns 230a, 230b and 230c are referred to as a "set of power rail patterns 230." In some embodiments, conductive feature patterns 230a, 230b and 230c are referred to as corresponding power rail pattern 230a, 230b and 230c.

The set of conductive feature patterns 230 is usable to manufacture a corresponding set of conductors 330 of integrated circuit 300, 350, 400, 450, 500A-500B, 600, 700, 800A-800B, 900A-900B or 1000. In some embodiments, conductors 330a and 330b are referred to as a "set of power rails 330."

In some embodiments, conductive feature pattern 230a, 230b or 230c is usable to manufacture corresponding conductor 330a, 330b or 330c of the set of conductors 330 of integrated circuit 300, 350, 400, 450, 500A-500B, 600, 700, 800A-800B, 900A-900B or 1000. In some embodiments, conductors 330a, 330b and 330c are referred to as corresponding power rails 330a, 330b and 330c. In some embodiments, the set of conductors 330 are located on the front-side (not labelled) of integrated circuit 300.

The set of conductive feature patterns 230 overlap at least one of the set of contact patterns 206, the set of gate patterns 204, the set of gate patterns 205 or the set of active region patterns 202.

In some embodiments, the set of conductive feature patterns 230 is on the fourth layout level.

Other configurations, arrangements on other layout levels or quantities of patterns in the set of conductive feature patterns 230 are within the scope of the present disclosure.

Layout design 200 further includes one or more via patterns 210a or 210b (collectively referred to as a "set of via patterns 210"). For ease of illustration, the set of via patterns 210 are shown only in row 2 of cell 201 in FIG. 2A, cell 201 further includes a set of via patterns that are similar to the set of via patterns 210, and similar detailed description and illustration is omitted for brevity.

The set of via patterns 210 is usable to manufacture a corresponding set of vias 310 of integrated circuit 300, 350, 400, 450, 500A-500B, 600, 700, 800A-800B, 900A-900B or 1000.

In some embodiments, via patterns 210a, 210b of the set of via patterns 210 are usable to manufacture corresponding vias 310a, 310b of the set of vias 310 of integrated circuit 300, 350, 400, 450, 500A-500B, 600, 700, 800A-800B, 900A-900B or 1000.

In some embodiments, the set of via patterns 210 are between at least one of the set of gate patterns 204 or 205 and at least one of the set of conductive feature patterns 220 or 222.

The set of via patterns 210 is positioned at a via over gate (VG) level of one or more of layout designs 200 or 250 or integrated circuit 300, 350, 400, 450, 500A-500B, 600, 700, 800A-800B, 900A-900B or 1000. In some embodiments, the VG level is above the OD level, the MD level and the POLY level. In some embodiments, the VG level is between the POLY level and the M0 level. In some embodiments, the VG level is between the second layout level and the fourth layout level. Other layout levels are within the scope of the present disclosure.

Other configurations, arrangements on other layout levels or quantities of patterns in at least set of via patterns 210 are within the scope of the present disclosure.

Other configurations, arrangements on other layout levels or quantities of patterns in layout design 200 are within the scope of the present disclosure.

FIG. 2D is a diagram of a layout design 250 of an integrated circuit, in accordance with some embodiments. Layout design 250 is a layout diagram of at least integrated circuit 100A of FIG. 1A, integrated circuit 100B of FIG. 1B or integrated circuit 350 of FIG. 3D.

Layout design 250 is a variation of layout design 200 (FIGS. 2A-2C), and therefore similar detailed description is omitted. For example, layout design 250 illustrates an example where active region patterns 202a and 202d correspond to NMOS transistors, and active region patterns 202b and 202c correspond to PMOS transistors.

As shown in FIG. 2D, active region patterns 202a and 202d correspond to the reference supply voltage VSS (e.g., conductive feature patterns/power rail patterns 230a and 230c) and therefore active region patterns 202a and 202d correspond to NMOS transistors.

As shown in FIG. 2D, active region patterns 202b and 202c correspond to the supply voltage VDD (e.g., conductive feature pattern/power rail pattern 230b) and therefore active region patterns 202b and 202c correspond to PMOS transistors.

In some embodiments, active region patterns 202a and 202d are usable to manufacture source and drain regions of NMOS transistors of integrated circuits 350, 450, 500B, 600, 700, 800B, 900B or 1000, and active region patterns 202b and 202c are usable to manufacture source and drain regions of PMOS transistors of integrated circuits 350, 450, 500B, 600, 700, 800B, 900B or 1000.

In some embodiments, layout design 250 achieves one or more of the benefits discussed herein.

Other configurations, arrangements on other layout levels or quantities of patterns in layout design 250 are within the scope of the present disclosure.

Figure 3A:
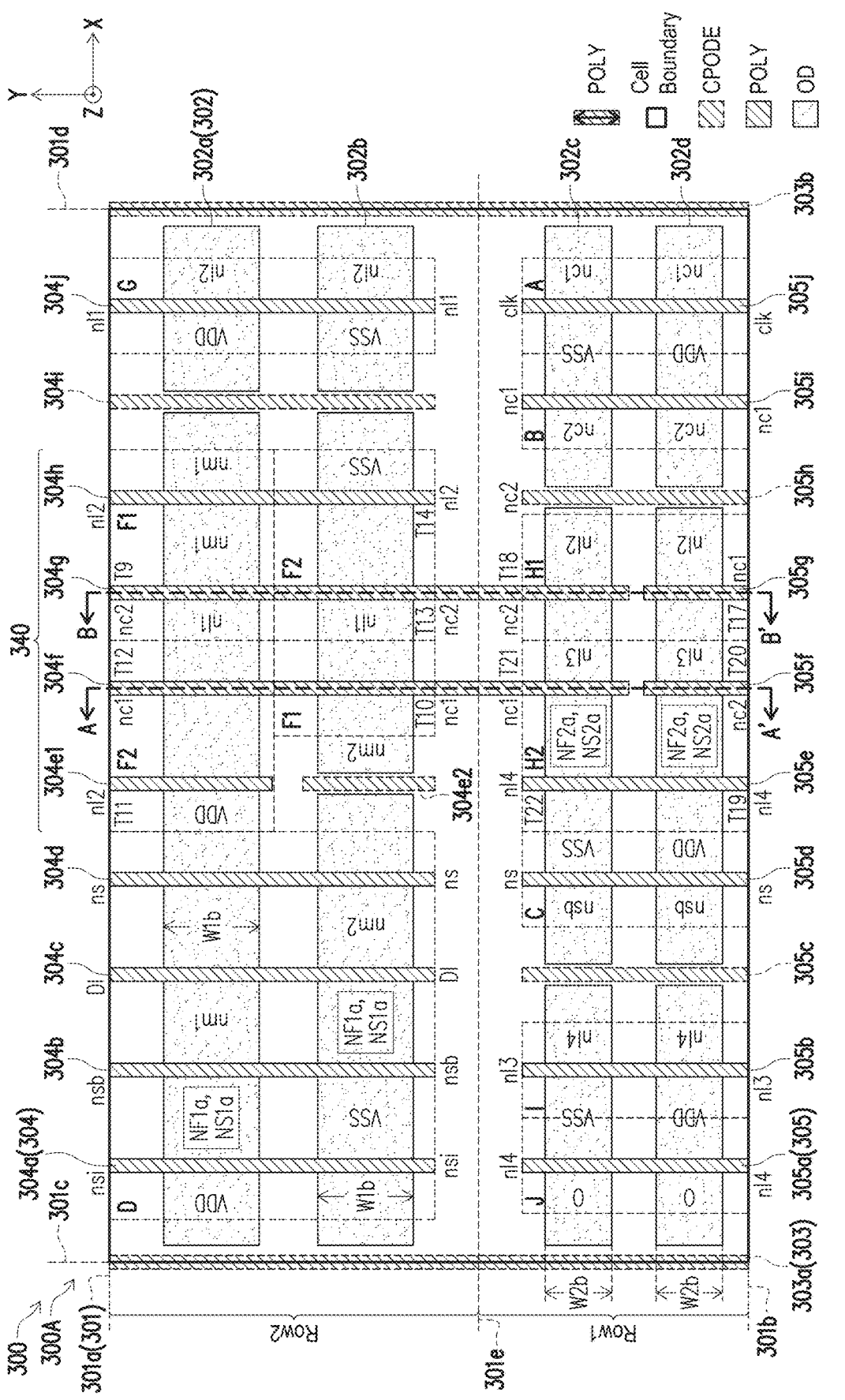
FIGS. 3A-3F are corresponding diagrams of a corresponding integrated circuit, in accordance with some embodiments.
Figure 3B:
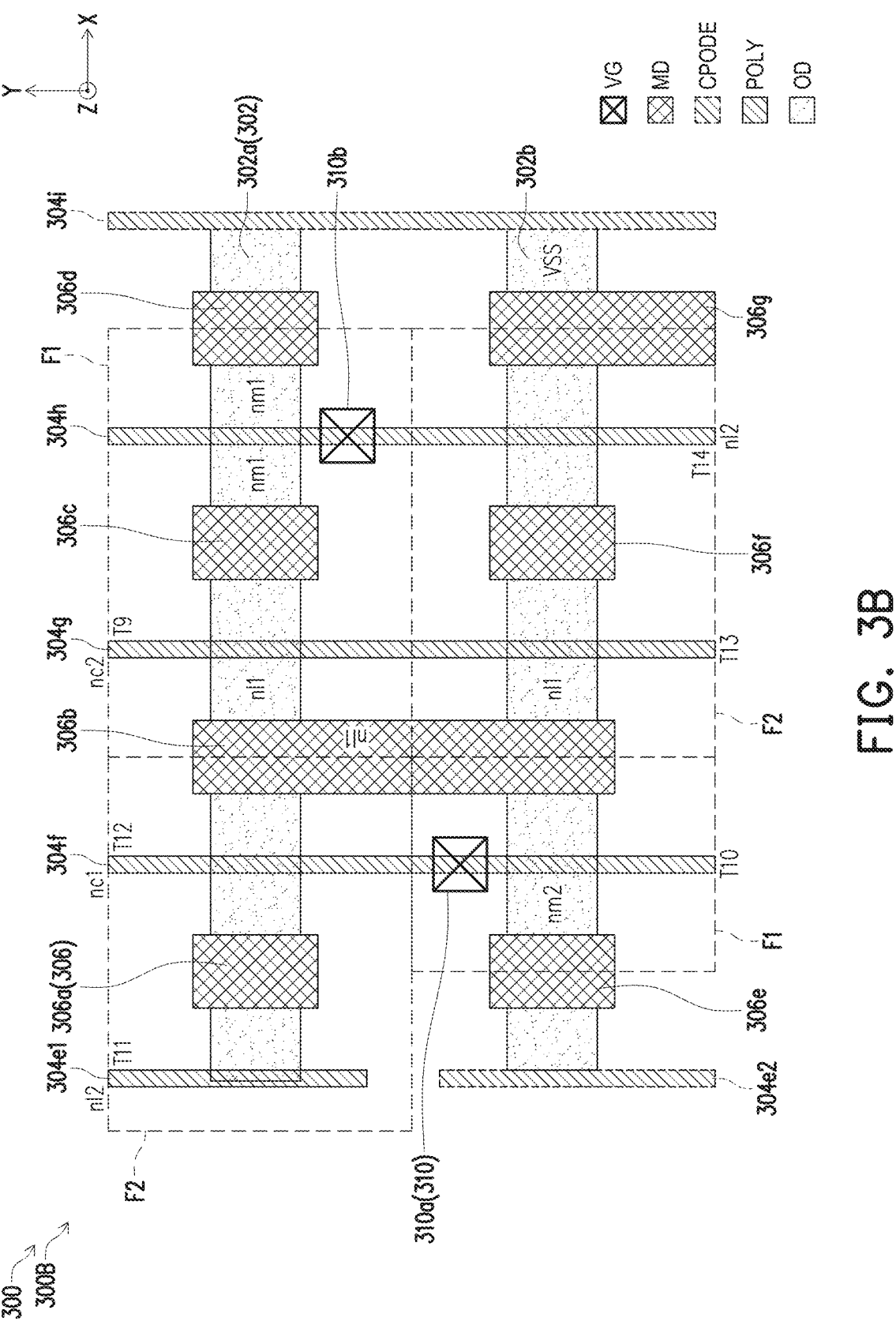
Figure 3C:
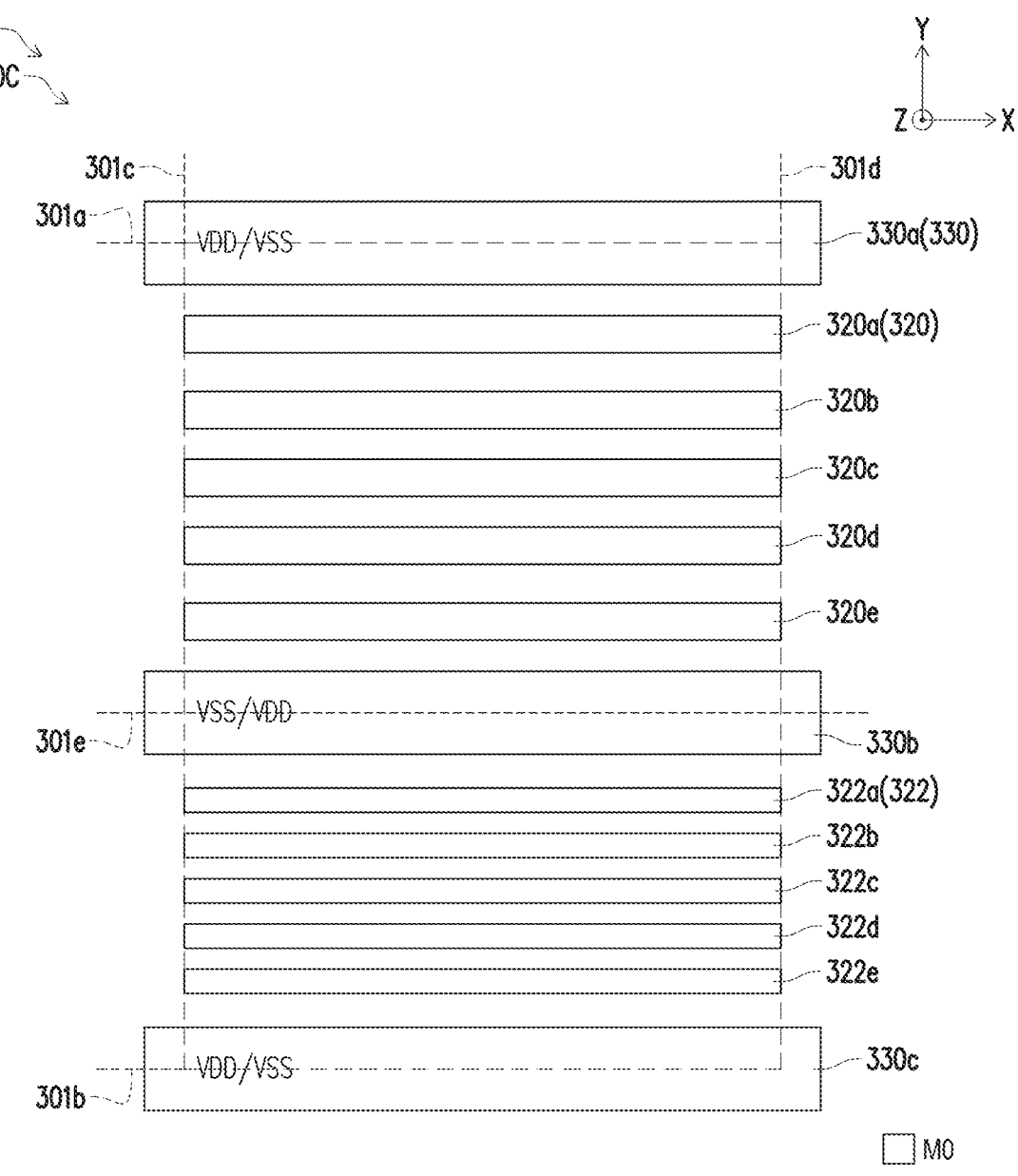

FIGS. 3A-3C are diagrams of an integrated circuit 300, in accordance with some embodiments.

Figure 3D:
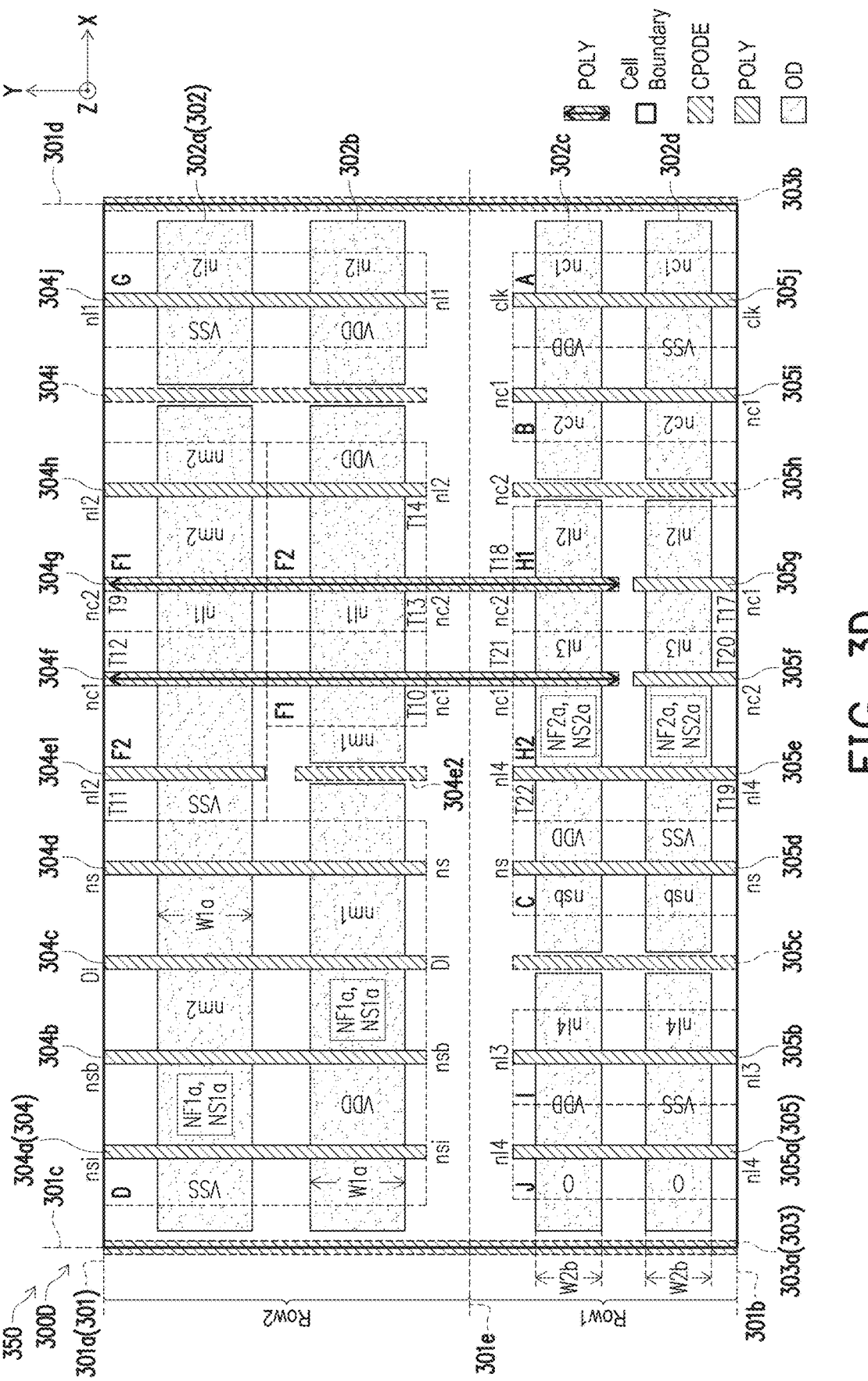

FIG. 3D is a diagram of an integrated circuit 350, in accordance with some embodiments.

Figures 3E, 3F:
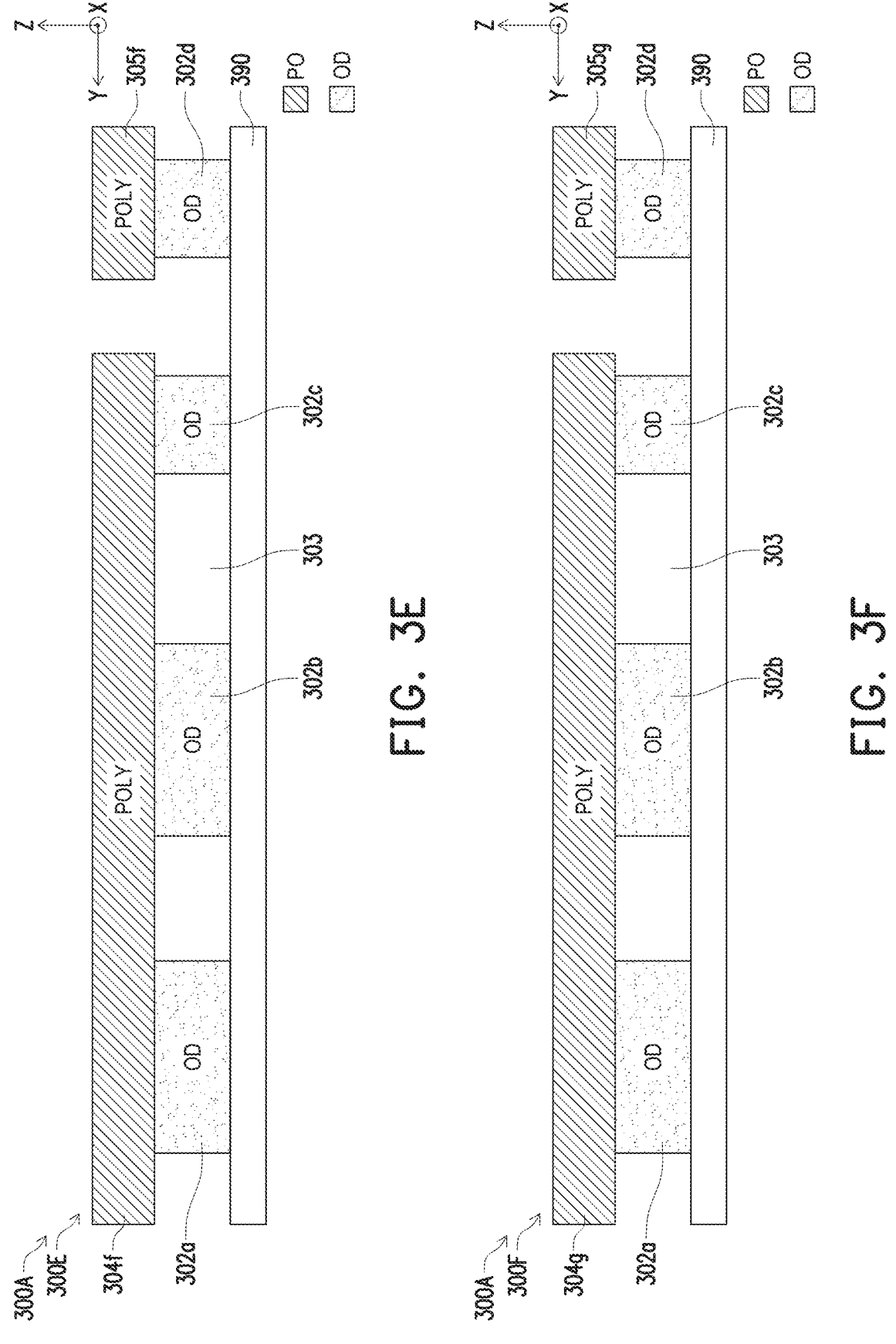

FIGS. 3E-3F are diagrams of an integrated circuit 300, in accordance with some embodiments.

FIGS. 3A-3C are corresponding diagrams of corresponding portions 300A-300C of an integrated circuit 300, simplified for ease of illustration. In some embodiments, portion 300B is a zoomed-in portion of region 340 of FIG. 3A, and similar detailed description is therefore omitted.

FIG. 3D is a diagram of a corresponding portion 300D of an integrated circuit 350, simplified for ease of illustration.

Portion 300A includes one or more features of integrated circuit 300 of the OD level, the POLY level, or the CPODE level. Portion 300A is manufactured by portion 200A.

Portion 300B includes one or more features of integrated circuit 300 of the OD level, the POLY level, the CPODE level, the MD level and the VG level. Portion 300B is manufactured by portion 200B.

Portion 300C includes one or more features of the M0 level of at least integrated circuit 300 or 350. Portion 300C is manufactured by portion 200C.

Portion 300D includes one or more features of integrated circuit 350 of the OD level, the POLY level and the CPODE level. Portion 300D is manufactured by portion 200D.

FIGS. 3E-3F are corresponding cross-sectional views of integrated circuit 300, in accordance with some embodiments. FIG. 3E is a cross-sectional view of portion 300A of integrated circuit 300 as intersected by plane A-A', in accordance with some embodiments. FIG. 3F is a cross-sectional view of portion 300A of integrated circuit 300 as intersected by plane B-B', in accordance with some embodiments.

Components that are the same or similar to those in one or more of FIGS. 1A-1D, 2A-2D, 3A-3F, 4A-4C, 5A-5B, 6-7, 8A-8B, 9A-9B and 10-15 are given the same reference numbers, and detailed description thereof is thus omitted.

Integrated circuit 300 is a top view of a diagram of at least integrated circuit 100A of FIG. 1A, integrated circuit 100B of FIG. 1B.

Integrated circuit 300 is manufactured by layout design 200. Structural relationships including alignment, lengths and widths, as well as configurations and layers of integrated circuit 300 are similar to the structural relationships and configurations and layers of layout design 200 of FIGS. 2A-2C and layout design 250 of FIG. 2D, and similar detailed description will not be described in at least FIGS. 3A-3F, for brevity. For example, in some embodiments, at least one or more widths, lengths or pitches of layout design 200 or 250 is similar to corresponding widths, lengths or pitches of integrated circuit 300 or 350, and similar detailed description is omitted for brevity. For example, in some embodiments, at least cell boundary 201a, 201b, 201c, 201d or line 201e of layout design 200 is similar to at least corresponding cell boundary 301a, 301b, 301c, 301d or line 301e of integrated circuit 300 or 350, and similar detailed description is omitted for brevity.

Integrated circuit 300 includes at least the set of active regions 302, the set of dummy gates 303, the set of gates 304 and 305, the set of contacts 306, the set of conductors 320, the set of conductors 322, the set of vias 310, the set of conductors 330, a substrate 390 and an insulating region 392.

The set of active regions 302 are embedded in substrate 390. Substrate 390 has a front-side and a back-side opposite from the front-side. In some embodiments, at least the set of active regions 302, the set of gates 304 and 305 or the set of contacts 306 are formed in the front-side of substrate 390.

In some embodiments, the set of active regions 302 corresponds to planar structures (not shown) of planar transistors. In some embodiments, the set of active regions 302 corresponds to fin structures (not shown) of finFETs.

In some embodiments, the set of active regions 302 corresponds to nanosheet structures (not labelled) of nanosheet transistors. In some embodiments, the set of active regions 302 include drain regions and source regions grown by an epitaxial growth process. In some embodiments, the set of active regions 302 include drain regions and source regions that are grown with an epitaxial material at the corresponding drain regions and source regions.

Other transistor types are within the scope of the present disclosure. For example, in some embodiments, the set of active regions 302 corresponds to nanowire structures (not shown) of nanowire transistors.

As shown in FIG. 3A, active regions 302a and 302d correspond to a supply voltage VDD (e.g., conductors/power rails 330a and 330c), and therefore active regions 302a and 302d correspond to PMOS transistors. As shown in FIG. 3A, active regions 302b and 302c correspond to a reference supply voltage VSS (e.g., conductor/power rail 330*b*) and therefore active regions 302*b* and 302*c* correspond to NMOS transistors.

In some embodiments, active regions 302*a* and 302*d* are source and drain regions of PMOS transistors of integrated circuit 300, 400A, 500A, 600, 700, 800A, 900A or 1000, and active regions 302*b* and 302*c* are source and drain regions of NMOS transistors of integrated circuits 300, 400A, 500A, 600, 700, 800A, 900A or 1000.

In some embodiments, active regions 302*a* and 302*d* are source and drain regions of NMOS transistors of integrated circuits 350, 450, 500B, 600, 700, 800B, 900B or 1000, and active regions 302*b* and 302*c* are source and drain regions of PMOS transistors of integrated circuits 350, 450, 500B, 600, 700, 800B, 900B or 1000.

In some embodiments, active regions 302*a*, 302*b*, 302*c* and 302*d* in FIGS. 3A-3F, 4A-4C, 5A-5B, 6-7, 8A-8B, 9A-9B and 10 are shown with corresponding node labels (e.g., nm1, nm2, nl1, nl2, nl3, nl4, D, O, nc1, nc2, nsb, VDD, VSS, etc.) that identify corresponding drain or source regions of corresponding transistors of FIGS. 1A-1D that are coupled to the corresponding node. For example, a source of transistor T1 of active region 302*a* is coupled to supply voltage VDD, and is labeled in FIG. 3A with "VDD." Similarly, a source of transistor T8 and a source of transistor T6 of active region 302*b* is coupled to reference supply voltage VSS, and is labeled in FIG. 3A with "VSS."

At least one of active region 302*a* or 302*b* has a width W1*b* in the second direction Y.

At least one of active region 302*c* or 302*d* has a width W2*b* in the second direction Y.

The width W1*b* is greater than width W2*b*. In some embodiments, the width W1*b* is equal to the width W2*b*.

In some embodiments, the width W1*b* of active regions 302*a* and 302*b* and the width W2*b* of active regions 302*c* and 302*d* is related to the number of conducting devices (e.g., transistors) of integrated circuit 300, and the corresponding speed, driving strength and power of the conducting devices (e.g., transistors) in the corresponding active regions 302*a* and 302*b* and corresponding active regions 302*c* and 302*d*.

In some embodiments, at least the width W1*b* of active regions 302*a* and 302*b* is directly related to the number of fins NF1*b* in active region 302*a* and 302*b*. In some embodiments, at least the width W2*b* of active regions 302*c* and 302*d* is directly related to the number of fins NF2*b* in active region 302*c* and 302*d*.

In some embodiments, active regions 302*a* and 302*b* have a number of nanosheets NS1*b* in active regions 302*a* and 302*b*. In some embodiments, active regions 302*c* and 302*d* have a number of nanosheets NS2*b* in active regions 302*c* and 302*d*.

The number of nanosheets NS1*b* in active regions 302*a* and 302*b* is greater than a number of nanosheets NS2*b* in active regions 302*c* and 302*d*. In some embodiments, the number of nanosheets NS1*b* in active regions 302*a* and 302*b* is equal to the number of nanosheets NS2*b* in active regions 302*c* and 302*d*.

Other configurations, arrangements on other layout levels or quantities of structures in the set of active regions 302 are within the scope of the present disclosure.

Insulating region 392 is configured to electrically isolate one or more elements of the set of active regions 302, the set of dummy gates 303, the set of gates 304 or 305, the set of contacts 306, the set of conductors 320, the set of conductors 322, the set of vias 310 or the set of conductors 330 from one another. In some embodiments, insulating region 392 includes multiple insulating regions deposited at different times from each other during method 1100 (FIG. 11). In some embodiments, insulating region is a dielectric material. In some embodiments, the dielectric material includes silicon dioxide, silicon oxy-nitride, or the like.

Other configurations, arrangements on other layout levels or other numbers of portions in insulating region 392 are within the scope of the present disclosure.

The set of gates 304 and 305 correspond to one or more gates of transistors T1-T32 of at least one of integrated circuit 100A-100D, 300, 350, 400, 450, 500A-500B, 600, 700, 800A-800B, 900A-900B or 1000. In some embodiments, each of the gates in the set of gates 304 and 305 are shown in FIGS. 3A-3F with labels "T1-T32" that identify corresponding transistors of FIGS. 1A-1D having corresponding gates in FIGS. 3A-3F, and are omitted for brevity.

In some embodiments, at least gate 304*e*2, 304*i*, 305*c* and 305*h* are dummy gates. In some embodiments, a dummy gate is a gate of a non-functional transistor.

In some embodiments, at least gate 303*a* or 303*b* corresponds to a dummy gate. In some embodiments, at least gate 303*a* or 303*b* corresponds to a CPODE region or a poly on OD edge (PODE) region. Other gates configured as dummy gates are within the scope of the present disclosure.

In some embodiments, gate 304*e*1 is a gate of transistor T11, gate 304*f* is a gate of transistors T12, T10 and T21, gate 304*g* is a gate of transistors T9, T13 and T18, gate 305*f* is a gate of transistor T20, and gate 305*g* is a gate of transistor T17.

In some embodiments, gate 304*h* is a gate of transistor T14.

In some embodiments, the portion of gate 304*h* that is over active region 302*a* corresponds to a PMOS dummy transistor with both the drain terminal and the source terminal coupled to nm1.

Gate 304*f* overlaps active regions 302*a*, 302*b* and 302*c*. Gate 304*f* corresponds to node nc1/signal nc1'. Gate 304*f* corresponds to transistor T12 of stacked gate circuit F2, transistor T10 of circuit F1 and transistor T21 of stacked gate circuit H2.

Gate 305*f* overlaps active region 302*d*. Gate 305*f* corresponds to node nc2/signal nc2'. Gate 305*f* corresponds to transistor T20 of stacked gate circuit H2.

Gate 304*g* overlaps active regions 302*a*, 302*b* and 302*c*. Gate 304*g* corresponds to node nc2/signal nc2'. Gate 304*g* corresponds to transistor T9 of circuit F1, transistor T13 of stacked gate circuit F2 and transistor T18 of transmission gate H1.

Gate 305*g* overlaps active region 302*d*. Gate 305*g* corresponds to node nc1/signal nc1'. Gate 305*g* corresponds to transistor T17 of transmission gate H1.

Gate 304*f* and gate 305*f* are aligned with each other along a common axis in the second direction Y, and are separated from each other in the second direction Y. Gate 304*g* and gate 305*g* are aligned with each other along a common axis in the second direction Y, and are separated from each other in the second direction Y.

Gate 304*f* and gate 305*g* are not aligned in the second direction Y. Stated differently, gate 304*f* and gate 305*g* are not aligned with each other along a common axis that extends in the second direction Y. Yet stated further differently, gate 304*f* and gate 305*g* are twisted with respect to each other. In some embodiments, twisted structures are two or more structures that have a same signal (nc1' or nc2'), but the two or more structures are not aligned in the second direction Y.

Within row 2, node nm1 in circuit F1 and node nm2 in circuit F1 are not aligned with each other along a common axis in the second direction Y across active regions 302a and 302b.

Within row 2, the nodes nl1 of circuit F1 is aligned along a common axis in the second direction Y across active regions 302a and 302b, and a same MD contact (e.g., contact 306b) of circuit F1 is shared with stacked gate circuit F2, thereby allowing signal nc1' to be routed on gate 304f across active regions 302a, 302b and 302c from row 2 to row 1, and thereby allowing signal nc2' to be routed on gate 304g across active regions 302a, 302b and 302c from row 2 to row 1. Thus, signals nc1' and nc2' are routed on corresponding gates 304f and 304g across at least 3 active regions and across rows within cell 301 thereby maximizing vertical routing resource alignment like POLY or MD to reduce M0 usage in integrated circuit 300. In some embodiments, by reducing M0 usage, integrated circuit 300 offers more routing flexibility and more via landing spots, and thereby increasing routing resources compared to other approaches.

Within row 1, node nl2 of transmission gate H1 is aligned along a common axis in the second direction Y across active regions 302c and 302d.

Within row 1, node nl3 of transmission gate H1 is aligned along a common axis in the second direction Y across active regions 302c and 302d, and shares the MD region (e.g., contact (not shown)) with the stacked gate circuit H2.

Within row 1, signal nc1' in transmission gate H1 and stacked gate circuit H2 are not routed on the same poly. Within row 1, signal nc1' is routed on gates 304f and 305g.

Within row 1, signal nc2' in transmission gate H1 and stacked gate circuit H2 are not routed on the same poly. Within row 1, signal nc2' is routed on gates 304g and 305f.

Other configurations, arrangements on other layout levels or quantities of gates in the set of dummy gates 303, and the set of gates 304 and 305 are within the scope of the present disclosure.

Each contact of the set of contacts 306 corresponds to one or more drain or source terminals of transistors T1-T32 of at least one of integrated circuit 100A-100D, 300, 350, 400, 450, 500A-500B, 600, 700, 800A-800B, 900A-900B or 1000. In some embodiments, one or more contacts of the set of contacts 306 overlaps a pair of active regions of the set of active regions 302, thereby electrically coupling the pair of active regions of the set of active regions 302 and the source or drain of the corresponding transistors.

In some embodiments, contact 306b corresponds to the drain terminals of transistors T9 and T10 of circuit F1 and the drain terminals of transistors T12 and T13 of stacked gate circuit F2. In some embodiments, contact 306b electrically couples the drain terminals of transistors T9 and T10 of circuit F1 and the drain terminals of transistors T12 and T13 of stacked gate circuit F2 together.

Other configurations, arrangements on other layout levels or quantities of contacts in the set of contacts 306 are within the scope of the present disclosure.

The set of conductors 320 and 322 are M0 routing tracks. In some embodiments, the set of conductors 320 and 322 are routing tracks in other layers. In some embodiments, the set of conductors 320 corresponds to 5 M0 routing tracks, and the set of conductors 322 correspond to 5 M0 routing tracks. Other numbers of routing tracks are within the scope of the present disclosure.

Other configurations, arrangements on other layout levels or quantities of conductors in the set of conductors 320 and 322 are within the scope of the present disclosure.

The set of vias 310 is configured to electrically couple one or more gates of the set of gates 304 or 305 to the set of conductors 320, 322 or 330, and vice versa. The set of vias 310 are between the set of gates 304 or 305 and the set of conductors 320, 322 or 330.

Other configurations, arrangements on other layout levels or quantities of vias in the set of vias 310 are within the scope of the present disclosure.

The set of conductors 330 are configured to provide power to the set of active regions 302 of at least one of integrated circuit 100A-100D, 300, 350, 400, 450, 500A-500B, 600, 700, 800A-800B, 900A-900B or 1000.

In some embodiments, the set of conductors 330 is configured to provide a first supply voltage of a voltage supply VDD and a second supply voltage of a reference voltage supply VSS to at least one of integrated circuit 100A-100D, 300, 350, 400, 450, 500A-500B, 600, 700, 800A-800B, 900A-900B or 1000. In some embodiments, the first supply voltage is different from the second supply voltage.

Portion 300B can be combined with at least one of integrated circuit 300, 350, 400, 450, 500A-500B, 600, 700, 800A-800B, 900A-900B or 1000.

Figure 4A:
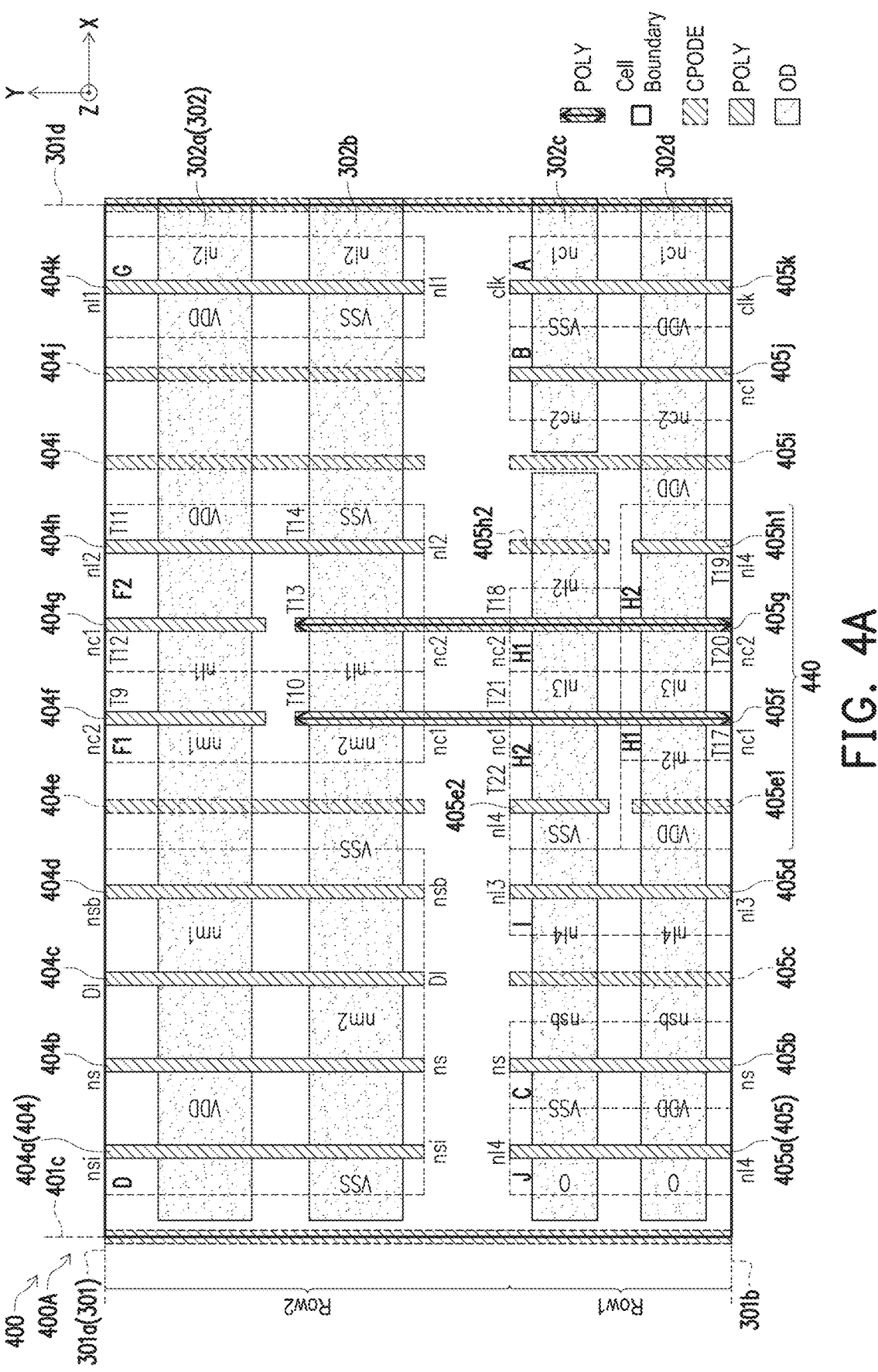
FIGS. 4A-4C are corresponding diagrams of a corresponding integrated circuit, in accordance with some embodiments.
Figure 5A:
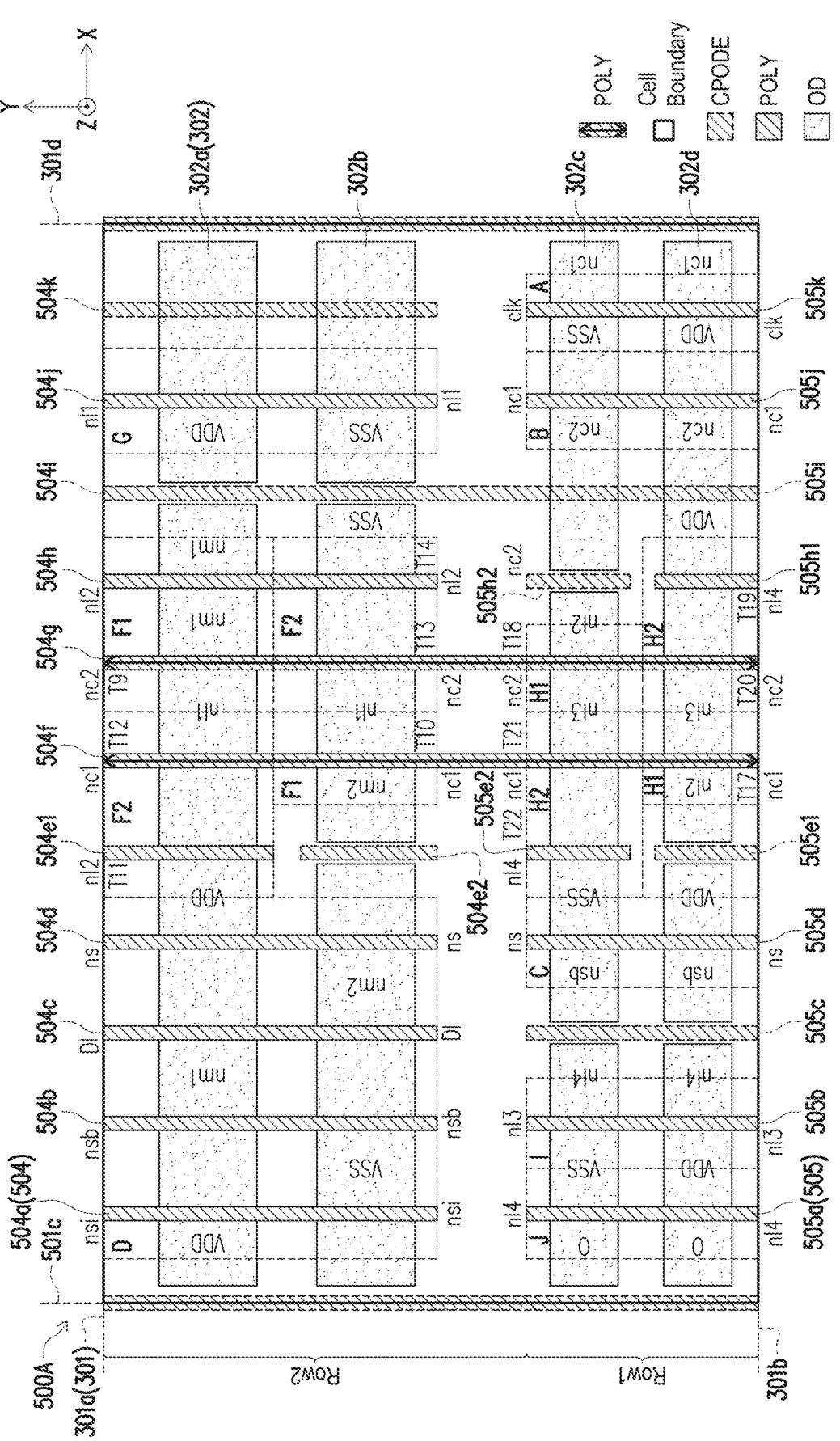
FIGS. 5A-5B are corresponding diagrams of corresponding integrated circuits, in accordance with some embodiments.
Figure 6:
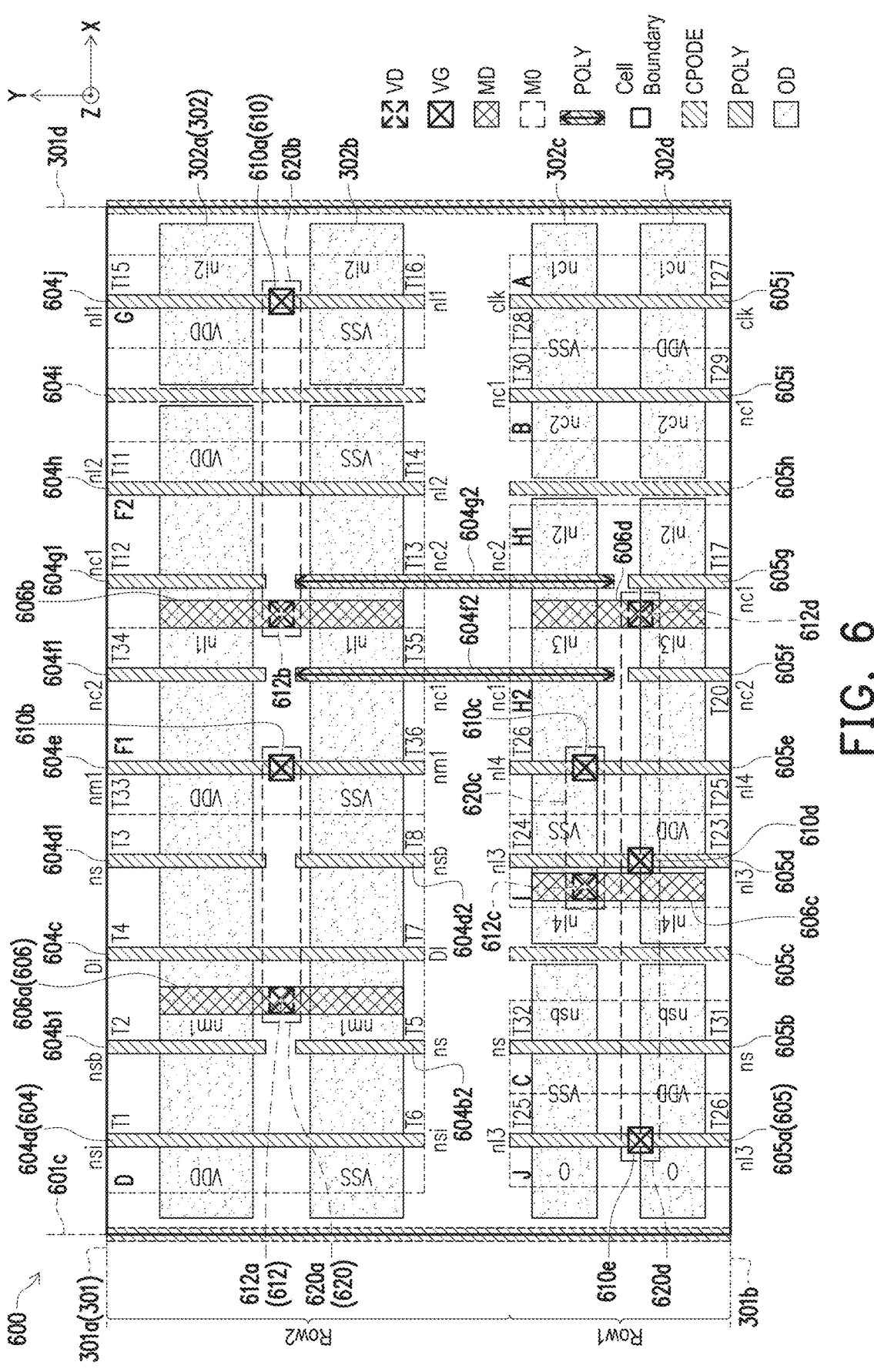
FIG. 6 is a diagram of an integrated circuit, in accordance with some embodiments.
Figure 7:
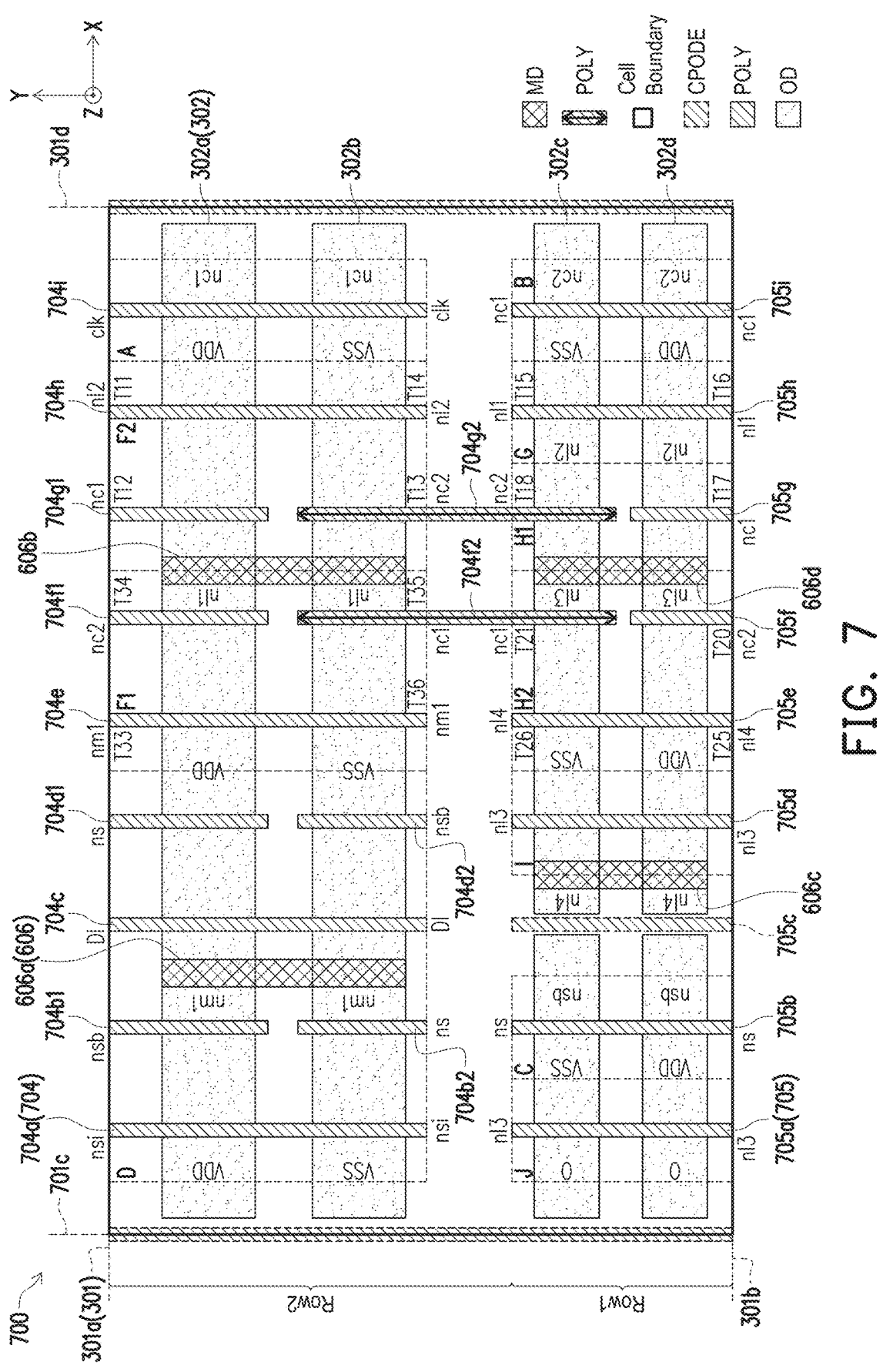
FIG. 7 is a diagram of an integrated circuit, in accordance with some embodiments.
Figure 8A:
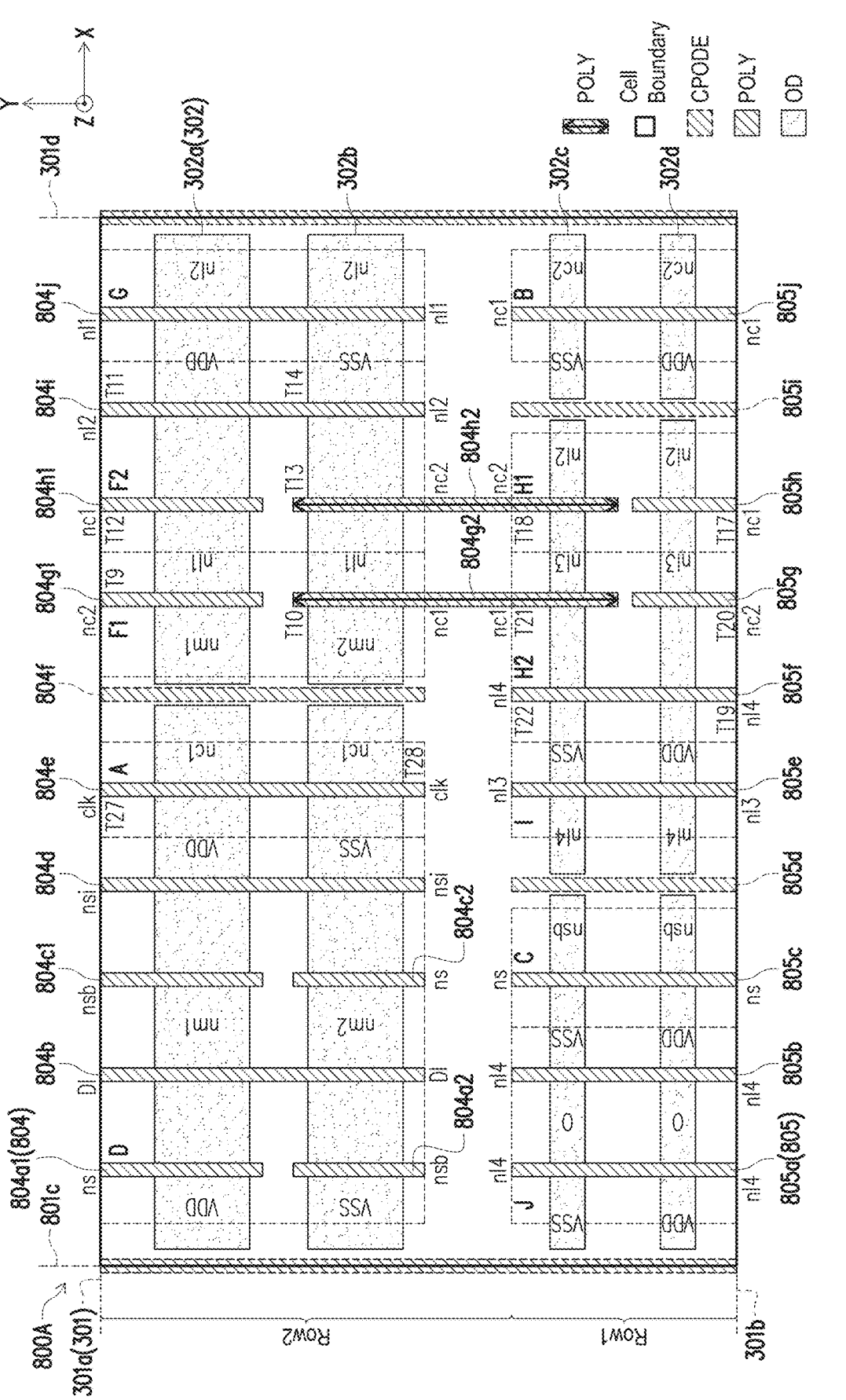
FIGS. 8A-8B are corresponding diagrams of corresponding integrated circuits, in accordance with some embodiments.
Figure 9A:
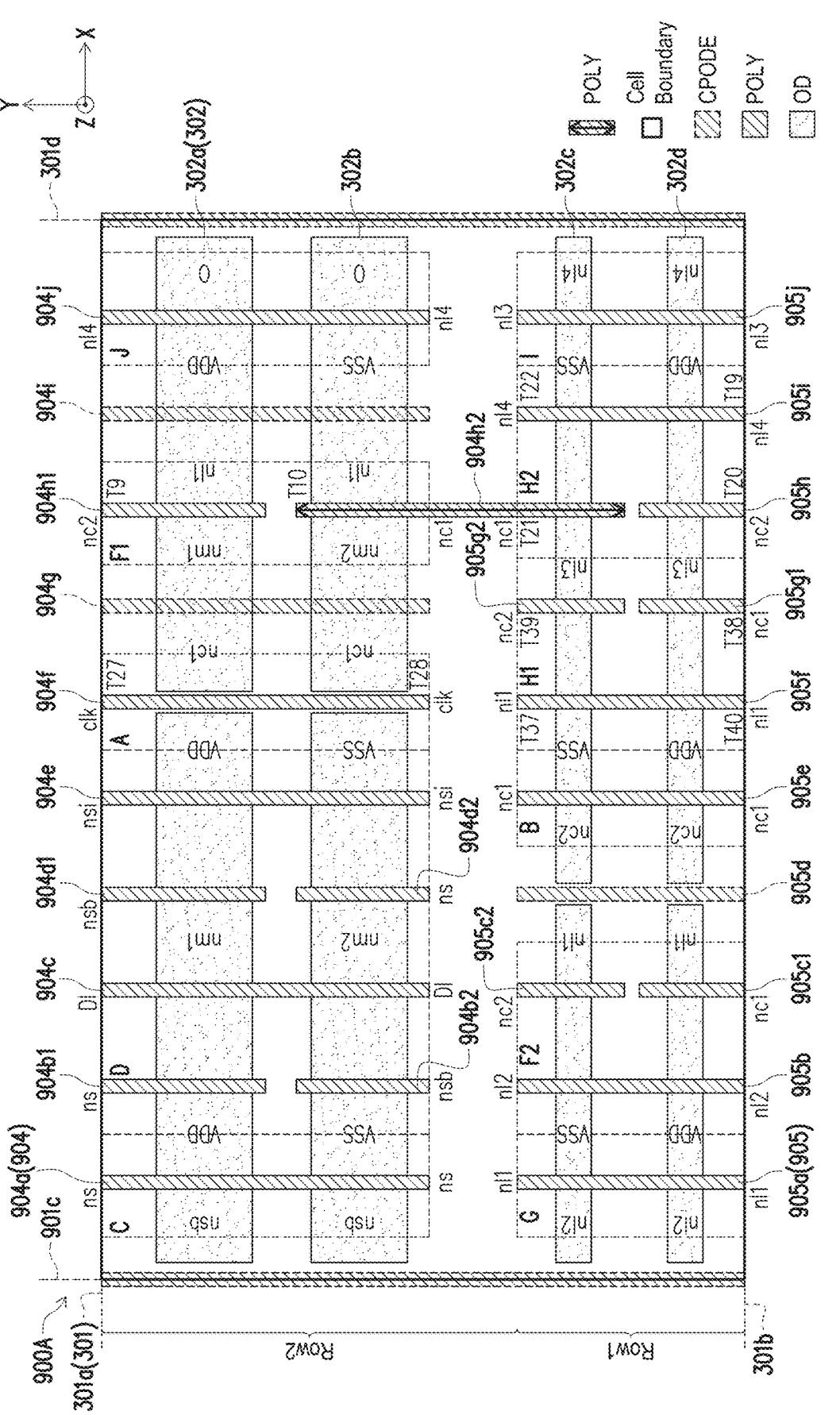
FIGS. 9A-9B are corresponding diagrams of corresponding integrated circuits, in accordance with some embodiments.
Figure 10:
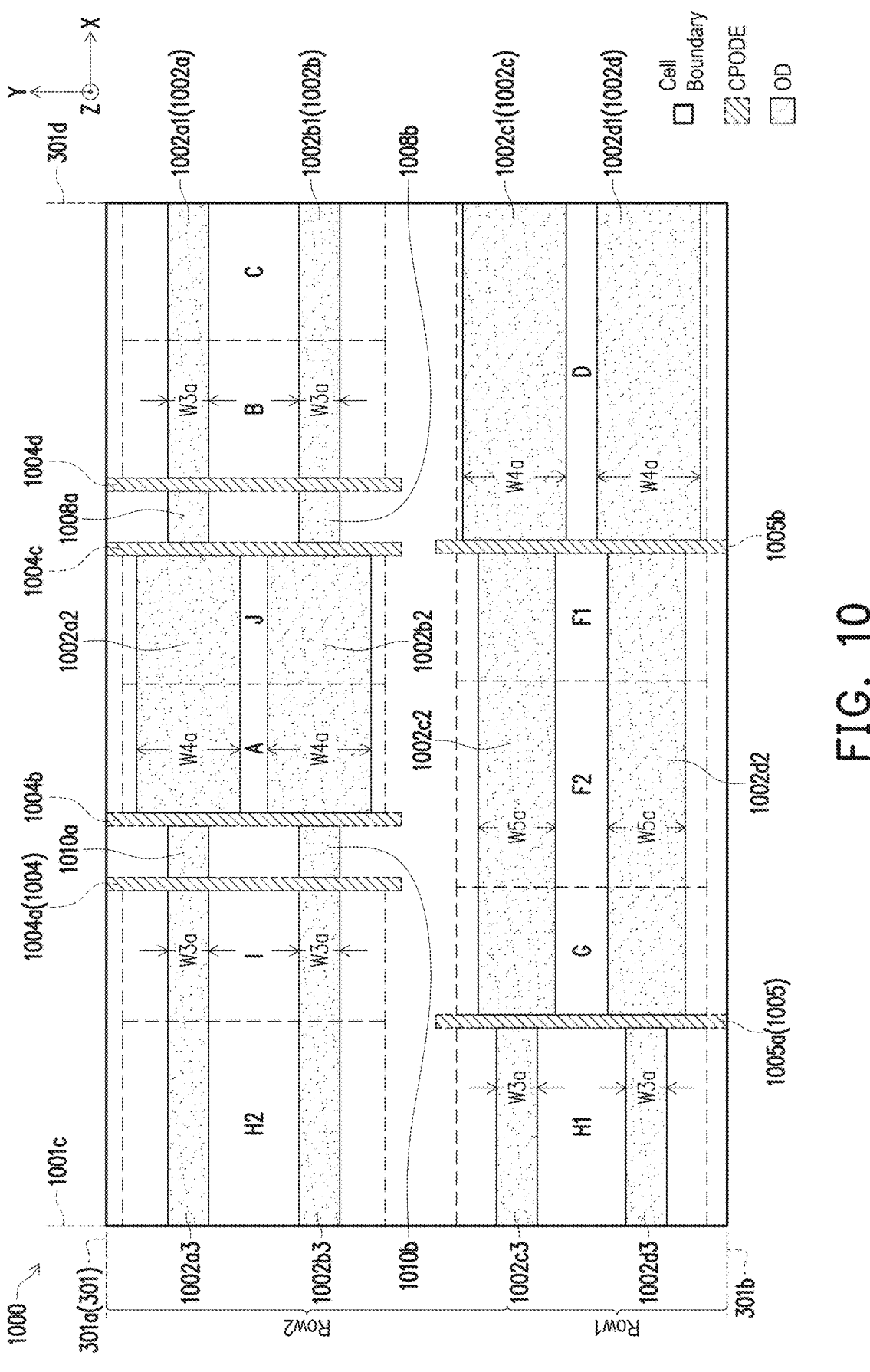
FIG. 10 is a diagram of an integrated circuit, in accordance with some embodiments.

For example, in some embodiments, when portion 300B is combined with integrated circuit 300 of FIG. 3A, 400A of FIG. 4A, 500A of FIG. 5A, 600 of FIG. 6, 700 of FIG. 7, 800A of FIG. 8A, 900A of FIG. 9A or 1000 of FIG. 10, at least conductor 330a and 330c is configured to provide the first supply voltage of voltage supply VDD to active regions 302a and 302d, and conductor 330b is configured to provide the second supply voltage of reference voltage supply VSS to active regions 302b and 302c.

Figure 4B:
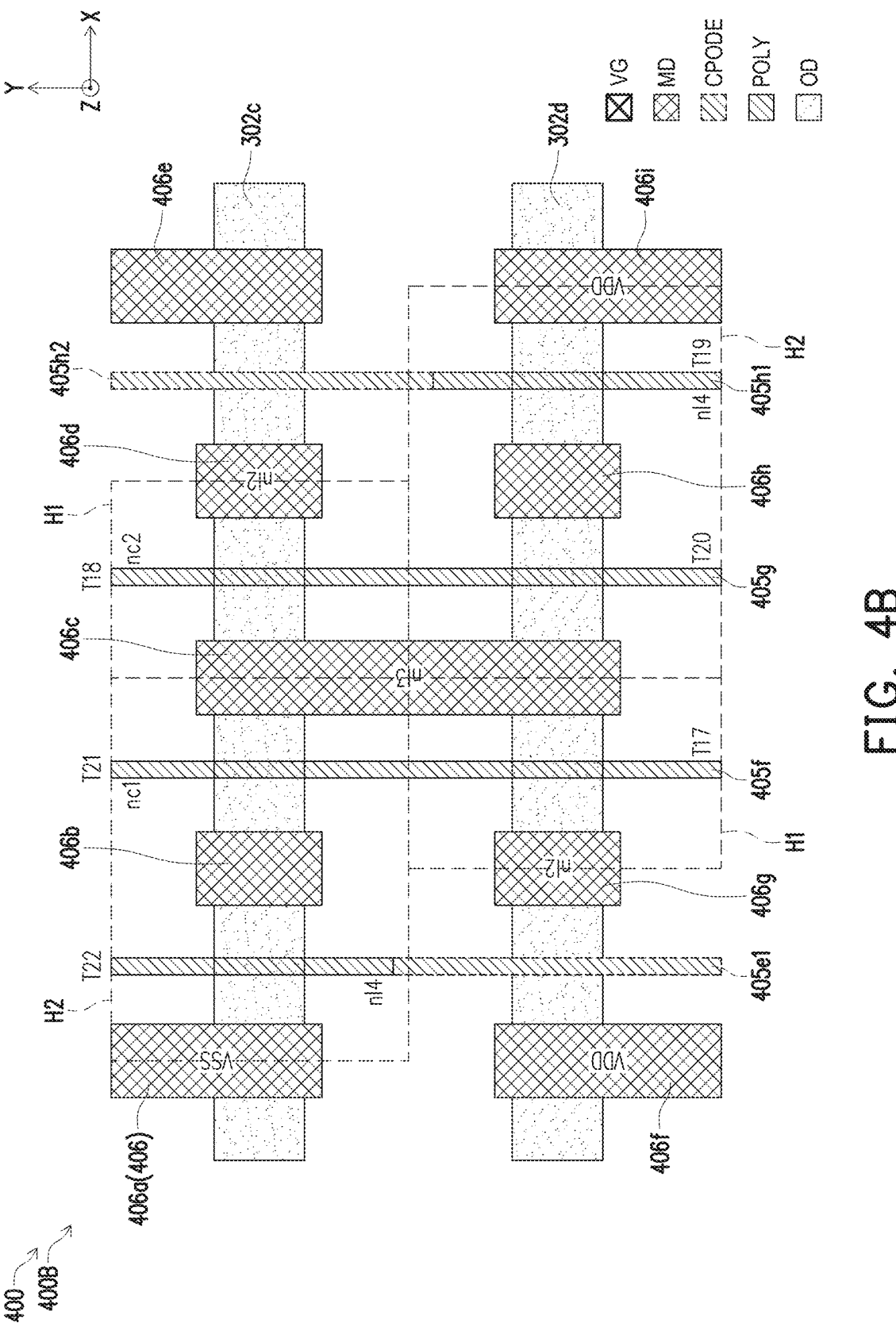
Figure 5B:
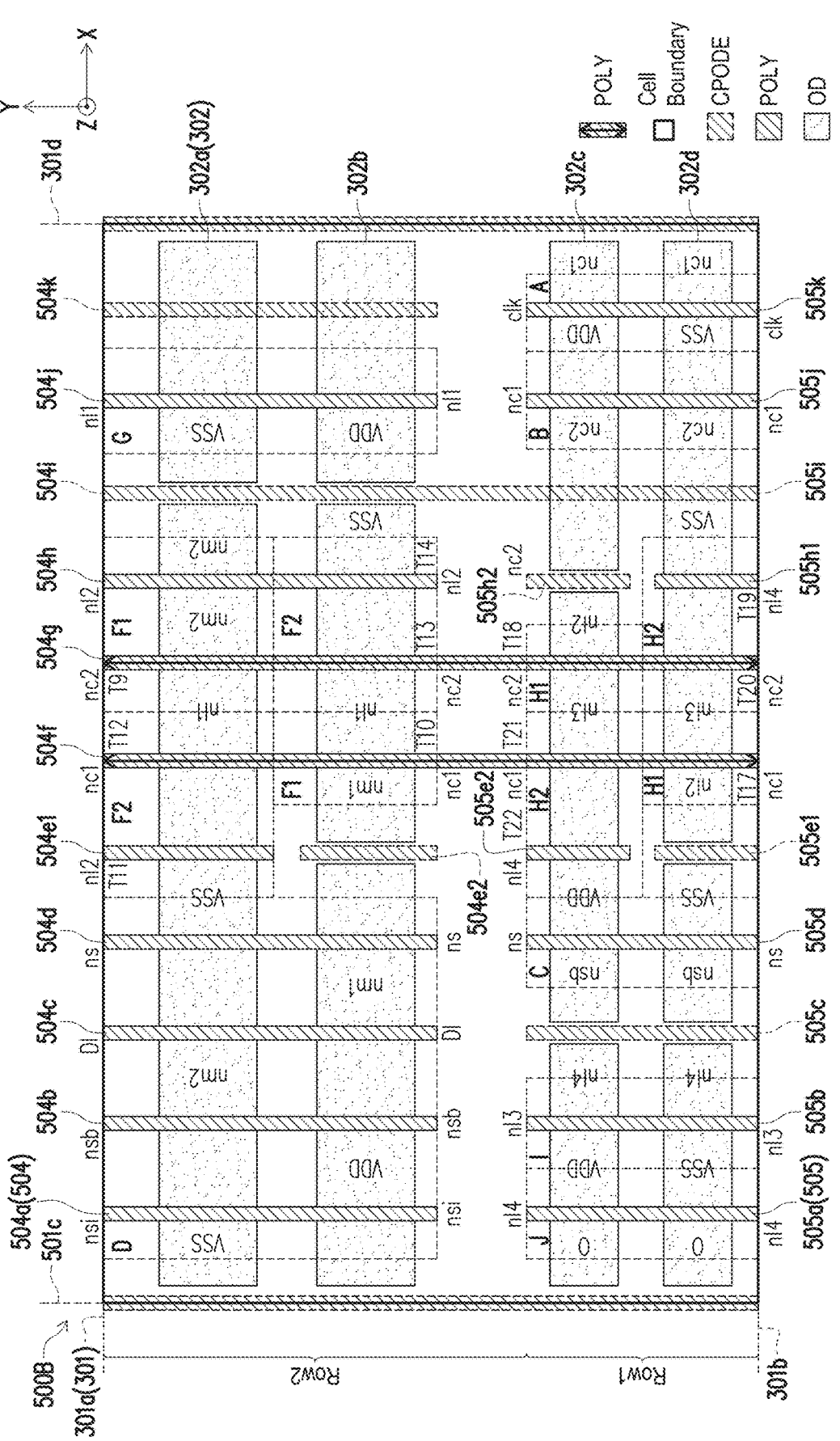
Figure 8B:
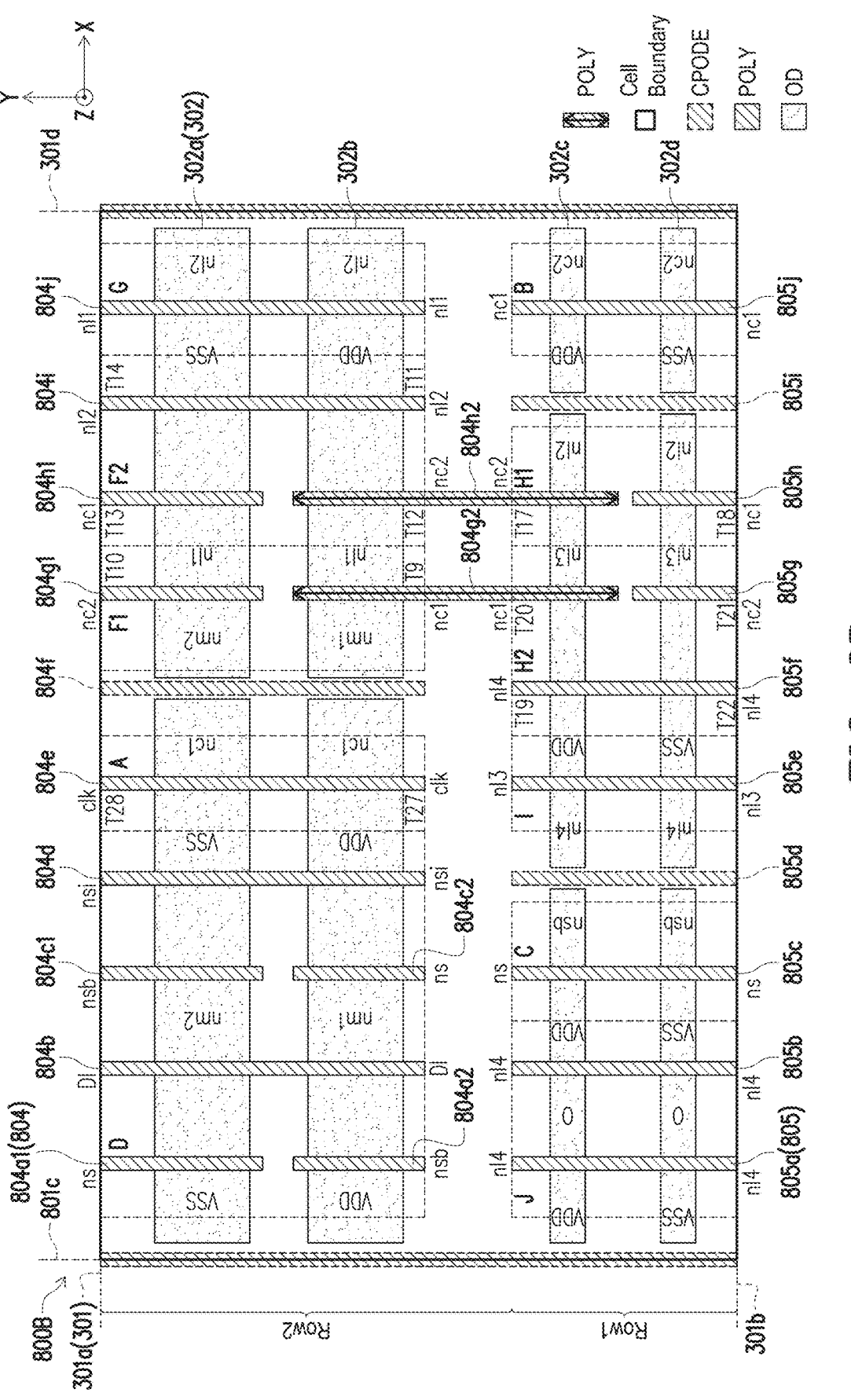
Figure 9B:
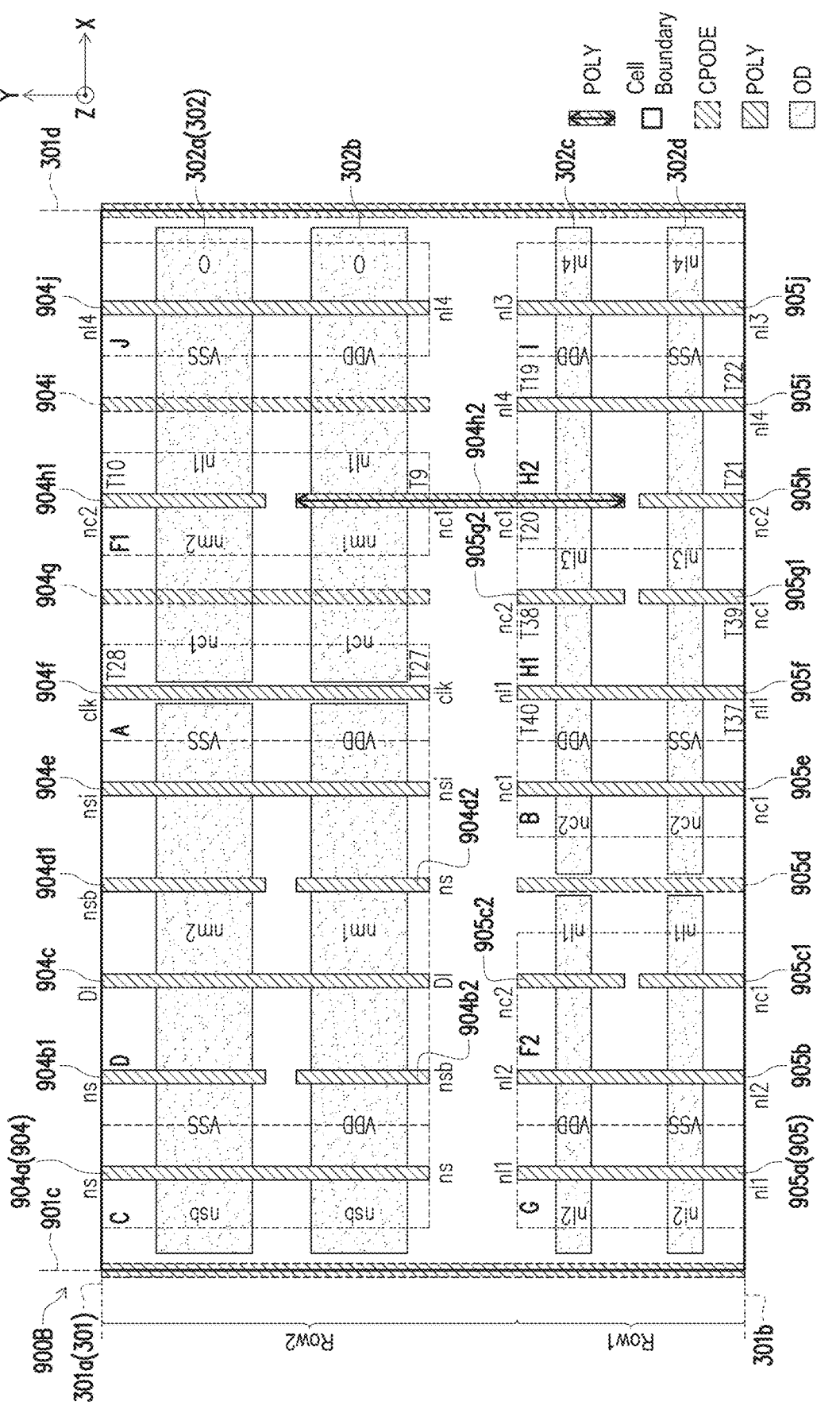

For example, in some embodiments, when portion 300B is combined with integrated circuit 350 of FIG. 3D, 400B of FIG. 4B, 500B of FIG. 5B, 600 of FIG. 6, 700 of FIG. 7, 800B of FIG. 8B, 900B of FIG. 9B or 1000 of FIG. 10, at least conductor 330a or 330c is configured to provide the second supply voltage of reference voltage supply VSS to active regions 302a and 302d, and conductor 330b is configured to provide the first supply voltage of voltage supply VDD to active regions 302b and 302c.

Other configurations, arrangements on other layout levels or quantities of conductors in the set of conductors 330 are within the scope of the present disclosure.

In some embodiments, at least one gate of the set of dummy gates 303 or the set of gates 304 or 305 are formed using a doped or non-doped polycrystalline silicon (or polysilicon). In some embodiments, at least one gate of the set of dummy gates 303 or the set of gates 304 or 305 include a metal, such as Al, Cu, W, Ti, Ta, TiN, TaN, NiSi, CoSi, other suitable conductive materials, or combinations thereof.

In some embodiments, at least one contact of the set of contacts 306, or at least one conductor of the set of conductors 320, the set of conductors 322 or the set of conductors 330 or at least one via of the set of vias 310, 610 or 612 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

In some embodiments, integrated circuit 300 achieves one or more of the benefits discussed herein.

Other configurations or arrangements of integrated circuit 300 are within the scope of the present disclosure.

FIG. 3D is a diagram of an integrated circuit 350, in accordance with some embodiments.

Integrated circuit 350 is a top view of a diagram of at least integrated circuit 100A of FIG. 1A, integrated circuit 100B of FIG. 1B.

Integrated circuit 350 is a variation of integrated circuit 300 (FIGS. 3A-3C), and therefore similar detailed description is omitted. For example, integrated circuit 350 illustrates an example where active regions 302a and 302d correspond to NMOS transistors, and active regions 302b and 302c correspond to PMOS transistors.

As shown in FIG. 3D, active regions 302a and 302d correspond to the reference supply voltage VSS (e.g., conductors/power rails 330a and 330c) and therefore active regions 302a and 302d correspond to NMOS transistors.

As shown in FIG. 3D, active regions 302b and 302c correspond to the supply voltage VDD (e.g., conductor/power rail 330b) and therefore active regions 302b and 302c correspond to PMOS transistors.

In some embodiments, active regions 302a and 302d are source and drain regions of NMOS transistors of integrated circuits 350, 450, 500B, 600, 700, 800B, 900B or 1000, and active regions 302b and 302c are source and drain regions of PMOS transistors of integrated circuits 350, 450, 500B, 600, 700, 800B, 900B or 1000.

In some embodiments, integrated circuit 350 achieves one or more of the benefits discussed herein.

Other configurations, arrangements on other layout levels or quantities of structures in integrated circuit 350 are within the scope of the present disclosure.

FIGS. 4A-4B are diagrams of an integrated circuit 400, in accordance with some embodiments.

Figure 4C:
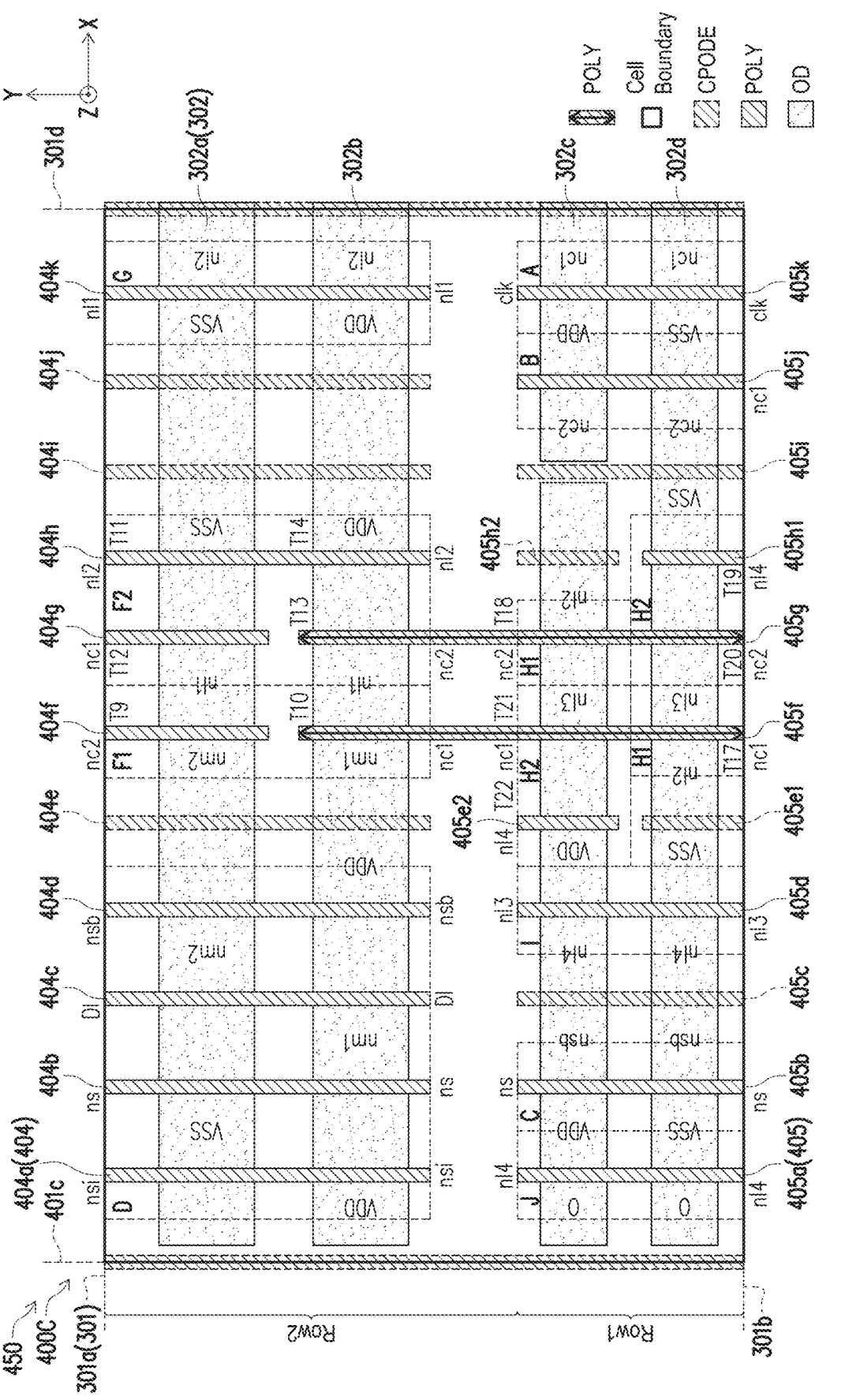

FIG. 4C is a diagram of an integrated circuit 450, simplified for ease of illustration.

FIGS. 4A-4B are corresponding diagrams of corresponding portions 400A-400B of an integrated circuit 400, simplified for ease of illustration. In some embodiments, portion 400B is a zoomed-in portion of region 440 of FIG. 4A, and similar detailed description is therefore omitted.

FIG. 4C is a diagram of a corresponding portion 400C of an integrated circuit 450, simplified for ease of illustration.

Portion 400A includes one or more features of integrated circuit 400 of the OD level, the POLY level, or the CPODE level. Portion 400A is similar to portion 300A of FIGS. 3A-3C, and similar detailed description is omitted.

Portion 400B includes one or more features of integrated circuit 400 of the OD level, the POLY level, the CPODE level, the MD level and the VG level. Portion 400B is similar to portion 300B of FIG. 3B, and similar detailed description is omitted.

Portion 400C includes one or more features of integrated circuit 450 of the OD level, the POLY level and the CPODE level. Portion 400C is similar to portion 300D of FIG. 3D, and similar detailed description is omitted.

Integrated circuit 400 is a top view of a diagram of at least integrated circuit 100A of FIG. 1A, integrated circuit 100B of FIG. 1B.

Integrated circuit 400 is an embodiment of integrated circuit 100A of FIG. 1A or integrated circuit 100B of FIG. 1B, and similar detailed description is omitted.

Integrated circuit 400 or 450 is manufactured by a corresponding layout design similar to integrated circuit 400 or 450. Integrated circuit 400 or 450 is an embodiment of integrated circuit 100A or 100B, and similar detailed description is omitted. For brevity FIGS. 4A-4C are described as integrated circuit 400 or 450, but in some embodiments, FIGS. 4A-4C also correspond to layout designs similar to layout design 200 or 250, structural elements of integrated circuit 400 or 450 also correspond to layout patterns, and structural relationships including alignment, lengths and widths, as well as configurations and layers of a corresponding layout design of integrated circuit 400 or 450 are similar to the structural relationships and configurations and layers of integrated circuit 400 or 450, and similar detailed description will not be described for brevity.

In some embodiments, integrated circuit 400 is manufactured by a layout design similar to layout design 200, and similar detailed description is omitted for brevity.

Integrated circuit 400 is a variation of integrated circuit 300 (FIGS. 3A-3C and 3E-3F). For example, integrated circuit 400 illustrates an example of where parallel gates 405f and 405g of the set of gate 405 extend across active regions 302b, 302c and 302d.

Integrated circuit 400 includes at least the set of active regions 302, the set of dummy gates 303, a set of gates 404 and 405, a set of contacts 406, the set of conductors 320, the set of conductors 322, the set of vias 310, the set of conductors 330, the substrate 390 and the insulating region 392.

In row 2, circuit F1 and stacked gate circuit F2 are between multiplexer D and inverter G.

In row 1, transmission gate H1 and stacked gate circuit H2 are between inverters A and J.

In comparison with integrated circuit 300 of FIGS. 3A-C and 3E-3F, set of gates 404 of integrated circuit 400 replaces the set of gates 304, set of gates 405 of integrated circuit 400 replaces the set of gates 305, and set of contacts 406 of integrated circuit 400 replaces the set of contacts 306, and similar detailed description is therefore omitted.

Set of gates 404 includes at least gate 404a, 404b, 404c, 404d, 404e, 404f, 404g, 404h, 404i, 404j or 404k.

Set of gates 405 includes at least gate 405a, 405b, 405c, 405d, 405e1, 405e2, 405f, 405g, 405h1, 405h2, 405i, 405j or 405k.

In comparison with integrated circuit 300 of FIGS. 3A-C and 3E-3F, at least one or more of gate 404a, 404b, 404c, 404d, 404e, 404f, 404g, 404h, 404i, 404j or 404k replaces at least one or more of gate 304a, 304b, . . . , 304j, and similar detailed description is therefore omitted.

In comparison with integrated circuit 300 of FIGS. 3A-C and 3E-3F, at least one or more of gate 405a, 405b, 405c, 405d, 405e1, 405e2, 405f, 405g, 405h1, 405h2, 405i, 405j or 405k replaces at least one or more of gate 305a, 305b, . . . , 305j, and similar detailed description is therefore omitted.

In some embodiments, at least gate 404e, 404i, 404j, 405c, 405e1, 405h2 and 405i are dummy gates.

In some embodiments, gate 404f is a gate of transistor T9, gate 404g is a gate of transistor T12, gate 405f is a gate of transistors T10, T21 and T17, gate 405g is a gate of transistors T13, T18 and T20, gate 405e2 is a gate of transistor T22, and gate 405h1 is a gate of transistor T19.

Gate 404f overlaps active region 302a. Gate 404f corresponds to node nc2/signal nc2'. Gate 404f corresponds to transistor T9 of circuit F1.

Gate 404g overlaps active region 302a. Gate 404g corresponds to node nc1/signal nc1'. Gate 404g corresponds to transistor T12 of stacked gate circuit F2.

Gate 405f overlaps active regions 302b, 302c and 302d. Gate 405f corresponds to node nc1/signal nc1'. Gate 405f corresponds to transistor T10 of circuit F1, transistor T21 of stacked gate circuit H2 and transistor T17 of transmission gate H1.

Gate 405g overlaps active regions 302b, 302c and 302d. Gate 405g corresponds to node nc2/signal nc2'. Gate 405g corresponds to transistor T13 of stacked gate circuit F2, transistor T18 of transmission gate H1, and transistor T20 of stacked gate circuit H2.

Gate 404f and gate 405f are aligned with each other along a common axis in the second direction Y, and are separated from each other in the second direction Y. Gate 404g and gate 405g are aligned with each other along a common axis in the second direction Y, and are separated from each other in the second direction Y.

Gate 404f and gate 405g are not aligned in the second direction Y. Stated differently, gate 404f and gate 405g are not aligned with each other along a common axis that extends in the second direction Y. Yet stated further differently, gate 404f and gate 405g are twisted with respect to each other.

Within row 2, node nm1 in circuit F1 and node nm2 in circuit F1 are aligned with each other along a common axis in the second direction Y across active regions 302a and 302b.

Within row 2, the node nl1 of circuit F1 is aligned along a common axis in the second direction Y across active regions 302a and 302b, and a same MD contact (e.g., contact (not labelled)) of circuit F1 is shared with stacked gate circuit F2.

Within row 1, the nodes nl2 of transmission gate H1 are not aligned with each other along a common axis in the second direction Y across active regions 302c and 302d.

Within row 1, the node nl3 of transmission gate H1 is aligned along a common axis in the second direction Y across active regions 302c and 302d, and a same MD contact (e.g., contact 406c) of transmission gate H1 is shared with stacked gate circuit H2, thereby allowing signal nc1' to be routed on gate 405f across active regions 302b, 302c and 302d from row 2 to row 1, and thereby allowing signal nc2' to be routed on gate 405g across active regions 302b, 302c and 302d from row 2 to row 1. Thus, signals nc1' and nc2' are routed on corresponding gates 405f and 405g across at least 3 active regions and across rows within cell 401 thereby maximizing vertical routing resource alignment like POLY or MD to reduce M0 usage in integrated circuit 400. In some embodiments, by reducing M0 usage, integrated circuit 400 offers more routing flexibility and more via landing spots, and thereby increasing routing resources compared to other approaches.

Within row 2, signal nc2' in circuit F1 and stacked gate circuit F2 are not routed on the same poly. Within row 2, signal nc2' is routed on gates 404f and 405g.

Within row 2, signal nc1' in circuit F1 and stacked gate circuit F2 are not routed on the same poly. Within row 2, signal nc1' is routed on gates 404g and 405f.

Other configurations, arrangements on other layout levels or quantities of gates in the set of gates 404 and 405 are within the scope of the present disclosure.

Set of contacts 406 includes at least contact 406a, 406b, . . . , 406i.

In comparison with integrated circuit 300 of FIGS. 3A-C and 3E-3F, at least one or more of contact 406a, 406b, . . . , 406i replaces at least one or more of contact 306a, 306b, . . . , 306g, and similar detailed description is therefore omitted.

In some embodiments, contact 406c corresponds to the drain/source terminals of transistors T17 and T18 of transmission gate H1 and the drain terminals of transistors T20 and T21 of stacked gate circuit H2. In some embodiments, contact 406c electrically couples the drain/source terminals of transistors T17 and T18 of transmission gate H1 and the drain terminals of transistors T20 and T21 of stacked gate circuit H2 together.

Other configurations, arrangements on other layout levels or quantities of contacts in the set of contacts 406 are within the scope of the present disclosure.

Other configurations or arrangements of integrated circuit 400 are within the scope of the present disclosure.

FIG. 4C is a diagram of an integrated circuit 450, in accordance with some embodiments.

Integrated circuit 450 is a top view of a diagram of at least integrated circuit 100A of FIG. 1A, integrated circuit 100B of FIG. 1B.

Integrated circuit 450 is a variation of integrated circuit 400 (FIGS. 4A-4C), and therefore similar detailed description is omitted. For example, integrated circuit 450 illustrates an example where active regions 302a and 302d correspond to NMOS transistors, and active regions 302b and 302c correspond to PMOS transistors.

As shown in FIG. 4C, active regions 302a and 302d correspond to the reference supply voltage VSS (e.g., conductors/power rails 330a and 330c), and therefore active regions 302a and 302d are source and drain regions of NMOS transistors.

As shown in FIG. 4C, active regions 302b and 302c correspond to the supply voltage VDD (e.g., conductor/power rail 330b), and therefore active regions 302b and 302c are source and drain regions of PMOS transistors.

In some embodiments, integrated circuit 450 achieves one or more of the benefits discussed herein.

Other configurations, arrangements on other layout levels or quantities of structures in integrated circuit 450 are within the scope of the present disclosure.

FIG. 5A is a diagram of an integrated circuit 500A, in accordance with some embodiments.

FIG. 5B is a diagram of an integrated circuit 500B, in accordance with some embodiments.

Integrated circuits 500A and 500B includes one or more features of the OD level, the POLY level, or the CPODE level.

Integrated circuit 500A is similar to integrated circuit 400 of FIG. 4A, and similar detailed description is omitted. Integrated circuit 500B is similar to integrated circuit 450 of FIG. 4C, and similar detailed description is omitted.

Integrated circuit 500A is a top view of a diagram of at least integrated circuit 100A of FIG. 1A, integrated circuit 100B of FIG. 1B.

Integrated circuit 500A is an embodiment of integrated circuit 100A of FIG. 1A or integrated circuit 100B of FIG. 1B, and similar detailed description is omitted.

Integrated circuit 500A or 500B is manufactured by a corresponding layout design similar to integrated circuit 500A or 500B. Integrated circuit 500A or 500B is an embodiment of integrated circuit 100A or 100B, and similar detailed description is omitted. For brevity FIGS. 5A-5B are described as integrated circuit 500A or 500B, but in some embodiments, FIGS. 5A-5B also correspond to layout designs similar to layout design 200 or 250, structural elements of integrated circuit 500A or 500B also correspond to layout patterns, and structural relationships including alignment, lengths and widths, as well as configurations and layers of a corresponding layout design of integrated circuit 500A or 500B are similar to the structural relationships and configurations and layers of integrated circuit 500A or 500B, and similar detailed description will not be described for brevity.

In some embodiments, integrated circuit 500A is manufactured by a layout design similar to layout design 200, and similar detailed description is omitted for brevity.

Integrated circuit 500A is a variation of integrated circuit 300 (FIGS. 3A-3C and 3E-3F) or integrated circuit 400 (FIGS. 4A-4B). For example, integrated circuit 500A illustrates an example of where parallel gates 504f and 504g of the set of gate 504 extend across active regions 302a, 302b, 302c and 302d.

In some embodiments, each of the gates in the set of gates 304 and 305 are shown in FIGS. 5A-5B with labels "T1-T32" that identify corresponding transistors of FIGS. 1A-1B having corresponding gates in FIGS. 5A-5B, and are omitted for brevity.

Integrated circuit 500A includes at least the set of active regions 302, the set of dummy gates 303, a set of gates 504 and 505, a set of contacts (not shown) similar to the set of contacts 306 or 406, the set of conductors 320, the set of conductors 322, the set of vias 310, the set of conductors 330, the substrate 390 and the insulating region 392.

In row 2, circuit F1 and stacked gate circuit F2 are between multiplexer D and inverter G.

In row 1, transmission gate H1 and stacked gate circuit H2 are between inverters A and J.

In comparison with integrated circuit 300 of FIGS. 3A-C and 3E-3F, set of gates 504 of integrated circuit 500A replaces the set of gates 304, set of gates 505 of integrated circuit 500A replaces the set of gates 305, and similar detailed description is therefore omitted.

Set of gates 504 includes at least gate 504a, 504b, 504c, 504d, 504e1, 504e2, 504f, 504g, 504h, 504i, 504j or 504k.

Set of gates 505 includes at least gate 505a, 505b, 505c, 505d, 505e1, 505e2, 505h1, 505h2, 505i, 505j or 505k.

In comparison with integrated circuit 300 of FIGS. 3A-3C, at least one or more of gate 504a, 504b, 504c, 504d, 504e1, 504e2, 504f, 504g, 504h, 504i, 504j or 504k replaces at least one or more of gate 304a, 304b, . . . , 304j, and similar detailed description is therefore omitted.

In comparison with integrated circuit 300 of FIGS. 3A-3C, at least one or more of gate 505a, 505b, 505c, 505d, 505e1, 505e2, 505h1, 505h2, 505i, 505j or 505k replaces at least one or more of gate 305a, 305b, . . . , 305j, and similar detailed description is therefore omitted.

In some embodiments, at least gate 504e2, 504i, 504k, 505c, 505e1 and 505h2 are dummy gates.

In some embodiments, gate 504e1 is a gate of transistor T11, gate 504f is a gate of transistors T12, T10, T21 and T17, gate 504g is a gate of transistors T9, T13, T18 and T20, gate 505e2 is a gate of transistor T22, and gate 505h1 is a gate of transistor T19.

In some embodiments, gate 504h is a gate of transistor T14.

In some embodiments, the portion of gate 504h that is over active region 302a corresponds to a PMOS dummy transistor with both the drain terminal and the source terminal coupled to nm1.

Gate 504f overlaps active regions 302a, 302b, 302c and 302d. Gate 504f corresponds to node nc1/signal nc1'. Gate 504f corresponds to transistor T12 of stacked gate circuit F2, transistor T10 of circuit F1, transistor T21 of stacked gate circuit H2, and transistor T17 of transmission gate H1.

Gate 504g overlaps active regions 302a, 302b, 302c and 302d. Gate 504g corresponds to node nc2/signal nc2'. Gate 504g corresponds to transistor T9 of circuit F1, transistor T13 of stacked gate circuit F2, transistor T18 of transmission gate H1 and transistor T20 of stacked gate circuit H2.

In some embodiments, by having each of gate 504f and gate 504g overlap each of active regions 302a, 302b, 302c and 302d, gate 504f and gate 504g have a corresponding signal nc1' and nc2' applied to the corresponding gate 504f and gate 504g across 4 active regions, thereby maximizing vertical routing resource alignment like POLY or MD to reduce M0 usage in integrated circuit 500A.

Within row 2, node nm1 in circuit F1 and node nm2 in circuit F1 are not aligned with each other along a common axis in the second direction Y across active regions 302a and 302b.

Within row 2, the nodes nl1 of circuit F1 is aligned along a common axis in the second direction Y across active regions 302a and 302b, and a same MD contact (e.g., not shown, but similar to contact 306b) of circuit F1 is shared with stacked gate circuit F2.

Within row 1, the node nl3 of transmission gate H1 is aligned along a common axis in the second direction Y across active regions 302c and 302d, and a same MD contact (e.g., not shown, but similar to contact 406c) of transmission gate H1 is shared with stacked gate circuit H2.

Signal nc1' is routed on gate 504f across active regions 302a, 302b, 302c and 302d from row 2 to row 1. Signal nc2' is routed on gate 504g across active regions 302a, 302b, 302c and 302d from row 2 to row 1. Thus, signals nc1' and nc2' are routed on corresponding gates 504f and 504g across at least 4 active regions and across rows within cell 501 thereby maximizing vertical routing resource alignment like POLY or MD to reduce M0 usage in integrated circuit 500A. In some embodiments, by reducing M0 usage, integrated circuit 500A offers more routing flexibility and more via landing spots, and thereby increasing routing resources compared to other approaches.

Within row 1, the nodes nl2 of transmission gate H1 are not aligned with each other along a common axis in the second direction Y across active regions 302c and 302d.

Other configurations, arrangements on other layout levels or quantities of gates in the set of gates 504 and 505 are within the scope of the present disclosure.

Other configurations or arrangements of integrated circuit 500A are within the scope of the present disclosure.

FIG. 5B is a diagram of an integrated circuit 500B, in accordance with some embodiments.

Integrated circuit 500B is a top view of a diagram of at least integrated circuit 100A of FIG. 1A, integrated circuit 100B of FIG. 1B.

Integrated circuit 500B is a variation of integrated circuit 500A (FIG. 5A), and therefore similar detailed description is omitted. For example, integrated circuit 500B illustrates an example where active regions 302a and 302d correspond to NMOS transistors, and active regions 302b and 302c correspond to PMOS transistors.

As shown in FIG. 5B, active regions 302a and 302d correspond to the reference supply voltage VSS (e.g., conductors/power rails 330a and 330c), and therefore active regions 302a and 302d are source and drain regions of NMOS transistors.

As shown in FIG. 5B, active regions 302b and 302c correspond to the supply voltage VDD (e.g., conductor/power rail 330b), and therefore active regions 302b and 302c are source and drain regions of PMOS transistors.

In some embodiments, integrated circuit 500B achieves one or more of the benefits discussed herein.

Other configurations, arrangements on other layout levels or quantities of structures in integrated circuit 500B are within the scope of the present disclosure.

FIG. 6 is a diagram of an integrated circuit 600, in accordance with some embodiments.

Integrated circuit 600 includes one or more features of the OD level, the POLY level, or the CPODE level.

Integrated circuit 600 is similar to integrated circuit 400 of FIG. 4A, and similar detailed description is omitted.

Integrated circuit 600 is a top view of a diagram of at least integrated circuit 100C of FIG. 1C.

Integrated circuit 600 is an embodiment of integrated circuit 100C of FIG. 1C, and similar detailed description is omitted.

Integrated circuit 600 is manufactured by a corresponding layout design similar to integrated circuit 600. Integrated circuit 600 is an embodiment of integrated circuit 100C, and similar detailed description is omitted. For brevity FIG. 6 is described as integrated circuit 600, but in some embodiments, FIG. 6 also corresponds to layout designs similar to layout design 200 or 250, structural elements of integrated circuit 600 also correspond to layout patterns, and structural relationships including alignment, lengths and widths, as well as configurations and layers of a corresponding layout design of integrated circuit 600 are similar to the structural relationships and configurations and layers of integrated circuit 600, and similar detailed description will not be described for brevity.

In some embodiments, integrated circuit 600 is manufactured by a layout design similar to layout design 200, and similar detailed description is omitted for brevity.

Integrated circuit 600 is a variation of integrated circuit 300 (FIGS. 3A-3C and 3E-3F), or integrated circuit 400 (FIGS. 4A-4B) or integrated circuit 500 (FIGS. 5A-5B). For example, integrated circuit 600 illustrates an example of where parallel gates 604f2 and 604g2 of the set of gate 604 extend across active regions 302b and 302c.

Integrated circuit 600 includes at least the set of active regions 302, the set of dummy gates 303, a set of gates 604 and 605, a set of contacts 606, a set of conductors 620, the set of conductors 320 and 322, a set of vias 610, a set of vias 612, the set of conductors 330, the substrate 390 and the insulating region 392.

In row 2, circuit F1 and stacked gate circuit F2 are between multiplexer D and inverter G.

In row 1, transmission gate H1 and stacked gate circuit H2 are between inverters A and J.

In comparison with integrated circuit 300 of FIGS. 3A-3C and 3E-3F, set of gates 604 of integrated circuit 600 replaces the set of gates 304, set of gates 605 of integrated circuit 600 replaces the set of gates 305, and similar detailed description is therefore omitted.

Set of gates 604 includes at least gate 604a, 604b1, 604b2, 604c, 604d1, 604d2, 604e, 604f1, 604f2, 604g1, 604g2, 604h, 604i or 604j.

Set of gates 605 includes at least gate 605a, 605b, 605c, 605d, 605e, 605f, 605g, 605h, 605i or 605j.

In comparison with integrated circuit 300 of FIGS. 3A-3C, at least one or more of gate 604a, 604b1, 604b2, 604c, 604d1, 604d2, 604e, 604f1, 604f2, 604g1, 604g2, 604h, 604i or 604j replaces at least one or more of gate 304a, 304b, . . . , 304j, and similar detailed description is therefore omitted.

In comparison with integrated circuit 300 of FIGS. 3A-3C, at least one or more of gate 605a, 605b, 605c, 605d, 605e, 605f, 605g, 605h, 605i or 605j replaces at least one or more of gate 305a, 305b, . . . , 305j, and similar detailed description is therefore omitted.

In some embodiments, at least gate 604i, 605c, and 605h are dummy gates.

In some embodiments, gate 604e is a gate of transistors T33 and T36, gate 604f1 is a gate of transistor T34, gate 604f2 is a gate of transistors T35 and T21, gate 604g1 is a gate of transistor T12, gate 604g2 is a gate of transistors T13 and T18, gate 605f is a gate of transistor T20, and gate 605g is a gate of transistor T17.

In some embodiments, gate 604h is a gate of transistors T14 and T11.

Gate 604f1 overlaps active region 302a. Gate 604f1 corresponds to node nc2/signal nc2'. Gate 604f1 corresponds to transistor T34 of stacked gate circuit 130 (F1).

Gate 604f2 overlaps active regions 302b and 302c. Gate 604f2 corresponds to node nc1/signal nc1'. Gate 604f2 corresponds to transistor T35 of stacked gate circuit 130 (F1) and transistor T21 of stacked gate circuit H2.

Gate 604g1 overlaps active region 302a. Gate 604g1 corresponds to node nc1/signal nc1'.

Gate 604g1 corresponds to transistor T12 of stacked gate circuit F2.

Gate 604g2 overlaps active regions 302b and 302c. Gate 604g2 corresponds to node nc2/signal nc2'. Gate 604g2 corresponds to transistor T13 of stacked gate circuit F2 and transistor T18 of transmission gate H1.

Gate 605f overlaps active region 302d. Gate 605f corresponds to node nc2/signal nc2'. Gate 605f corresponds to transistor T20 of stacked gate circuit H2.

Gate 605g overlaps active region 302d. Gate 605g corresponds to node nc1/signal nc1'. Gate 605g corresponds to transistor T17 of transmission gate H1.

In some embodiments, by having each of gate 604f2 and gate 604g2 overlap each of active regions 302b and 302c, gate 604f2 and gate 604g2 have a corresponding signal nc1' and nc2' applied to the corresponding gate 604f2 and gate 604g2 across 2 active regions, thereby maximizing vertical routing resource alignment like POLY or MD to reduce M0 usage in integrated circuit 600.

Within row 2, the nodes nm1 of multiplexer D is aligned along a common axis in the second direction Y across active region patterns 302a and 302b, and a same MD contact (e.g., contact 606a) of transistors T2, T4, T5 and T7 of multiplexer D is shared.

Within row 2, the nodes nl1 of circuit F1 is aligned along a common axis in the second direction Y across active region patterns 302a and 302b, and a same MD contact (e.g., contact 606b) of stacked gate circuit 130 (F1) is shared with stacked gate circuit F2.

Within row 1, the nodes nl4 of inverter I is aligned along a common axis in the second direction Y across active region patterns 302c and 302d, and a same MD contact (e.g., contact 606c) of transistors T24 and T23 of inverter is shared.

Within row 1, the nodes nl3 of transmission gate H1 and stacked gate circuit H2 are aligned along a common axis in the second direction Y across active region patterns 302c and 302d, and a same MD contact (e.g., contact 606d) of transmission gate H1 is shared with stacked gate circuit H2.

Within row 2, signal nc2' in stacked gate circuit 130 (F1) and stacked gate circuit F2 are not routed on the same poly. Within row 2, signal nc2' is routed on gates 604f1 and 604g2.

Within row 2, signal nc1' in stacked gate circuit 130 (F1) and stacked gate circuit F2 are not routed on the same poly. Within row 2, signal nc1' is routed on gates 604g1 and 604f2.

Signal nc1' is routed on gate 604f2 across active regions 302b and 302c from row 2 to row 1.

Signal nc2' is routed on gate 604g2 across active regions 302b and 302c from row 2 to row 1. Thus, signals nc1' and nc2' are routed on corresponding gates 604f2 and 604g2 across at least 2 active regions and across rows within cell 601 thereby maximizing vertical routing resource alignment like POLY or MD to reduce M0 usage in integrated circuit 600. In some embodiments, by reducing M0 usage, integrated circuit 600 offers more routing flexibility and more via landing spots, and thereby increasing routing resources compared to other approaches.

Within row 1, signal nc1' in stacked gate circuit H2 and transmission gate H1 are not routed on the same poly. Within row 1, signal nc1' is routed on gates 604f2 and 605g.

Within row 1, signal nc2' in stacked gate circuit H2 and transmission gate H1 are not routed on the same poly. Within row 1, signal nc2' is routed on gates 604g2 and 605f.

Other configurations, arrangements on other layout levels or quantities of gates in the set of gates 604 and 605 are within the scope of the present disclosure.

Set of contacts 606 includes at least contact 606a, 606b, . . . , 606d.

In comparison with integrated circuit 300 of FIGS. 3A-3C and 3E-3F, at least one or more of contact 606a, 606b, 606c or 606d replaces at least one or more of contact 306a, 306b, . . . , 306g, and similar detailed description is therefore omitted.

In some embodiments, contact 606a corresponds to the drain terminals of transistors T2 and T4 of multiplexer D and the drain terminals of transistors T5 and T7 of multiplexer D. In some embodiments, contact 606a electrically couples the drain terminals of transistors T2 and T4 of multiplexer D and the drain terminals of transistors T5 and T7 of multiplexer D together.

In some embodiments, contact 606b corresponds to the drain terminal of transistor T34 of stacked gate circuit (130) F1, the drain terminal of transistor T12 of stacked gate circuit F2, the drain terminal of transistor T35 of stacked gate circuit (130) F1, the drain terminal of transistor T13 of stacked gate circuit F2. In some embodiments, contact 606b electrically couples the drain terminal of transistor T34 of stacked gate circuit (130) F1, the drain terminal of transistor T12 of stacked gate circuit F2, the drain terminal of transistor T35 of stacked gate circuit (130) F1, the drain terminal of transistor T13 of stacked gate circuit F2 together.

In some embodiments, contact 606c corresponds to the drain terminals of transistors T23 and T24 of inverter I. In some embodiments, contact 606c electrically couples the drain terminals of transistors T23 and T24 of inverter I together.

In some embodiments, contact 606d corresponds to the drain terminal of transistor T21 of stacked gate circuit H2, the drain terminal of transistor T18 of transmission gate H1, the drain terminal of transistor T20 of stacked gate circuit H2, the drain terminal of transistor T17 of transmission gate H1. In some embodiments, contact 606d electrically couples the drain terminal of transistor T21 of stacked gate circuit H2, the drain terminal of transistor T18 of transmission gate H1, the drain terminal of transistor T20 of stacked gate circuit H2, the drain terminal of transistor T17 of transmission gate H1 together.

In some embodiments, by at least including the set of contacts 606 in integrated circuit 600, integrated circuit 600 is configured with a different multiplexer than other approaches, thereby reducing routing complexity and resource usage while maintaining performance, power, and area compared to other approaches.

Other configurations, arrangements on other layout levels or quantities of contacts in the set of contacts 606 are within the scope of the present disclosure.

Set of vias 610 includes at least via 610a, 610b, . . . , 610e.

In comparison with integrated circuit 300 of FIGS. 3A-3C and 3E-3F, at least one or more of via 610a, 610b, . . . , 610e replaces at least one or more of via 310a, 310b, and similar detailed description is therefore omitted.

Via 610a is configured to electrically couple gate 604j and conductor 620b.

Via 610b is configured to electrically couple gate 604e and conductor 620a.

Via 610c is configured to electrically couple gate 605e and conductor 620c.

Via 610d is configured to electrically couple gate 605d and conductor 620d.

Via 610e is configured to electrically couple gate 605a and conductor 620d.

Other configurations, arrangements on other layout levels or quantities of vias in the set of vias 610 are within the scope of the present disclosure.

Set of vias 612 includes at least via 612a, 612b, . . . , 612e.

In comparison with integrated circuit 300 of FIGS. 3A-3C and 3E-3F, at least one or more of via 612a, 612b, . . . , 612e is similar to at least one or more of via 310a, 310b, and similar detailed description is therefore omitted.

In some embodiments, the set of vias 612 are between at least one of the contacts of the set of contacts 606 and at least one of the set of conductors 620, 320 or 322.

The set of vias 612 is positioned at a via over diffusion (VD) level of one or more of integrated circuit 600, 700, 800A-800B, 900A-900B or 1000. In some embodiments, the VD level is above the OD level, the MD level and the POLY level. In some embodiments, the VD level is between the MD level and the M0 level. In some embodiments, the VD level is between the third layout level and the fourth layout level. Other layout levels are within the scope of the present disclosure.

Via 612a is configured to electrically couple contact 606a and conductor 620a.

Via 612b is configured to electrically couple contact 606b and conductor 620b.

Via 612c is configured to electrically couple contact 606c and conductor 620c.

Via 612d is configured to electrically couple contact 606d and conductor 620d.

Other configurations, arrangements on other layout levels or quantities of vias in the set of vias 612 are within the scope of the present disclosure.

Set of conductors 620 includes at least conductor 620a, 620b, 620c or 620d.

In comparison with integrated circuit 300 of FIGS. 3A-3C and 3E-3F, at least one or more of conductor 620a, 620b, 620c or 620d is similar to at least one or more of conductor 320a, 320b, 320c, 320d, 320e or 320f, or one or more of conductor 322a, 322b, 322c, 322d, 322e or 322f, and similar detailed description is therefore omitted.

In comparison with integrated circuit 300 of FIGS. 3A-3C and 3E-3F, at least one or more of conductor 620a, 620b, 620c or 620d is in a same M0 routing track as one or more conductors in the set of conductors 320 or 322, and thereby replaces the one or more conductors in the set of conductors 320 or 322, and similar detailed description is therefore omitted.

Conductor 620a is configured to electrically couple gate 604e and contact 606a together.

Conductor 620b is configured to electrically couple gate 604j and contact 606b together.

Conductor 620c is configured to electrically couple gate 605e and contact 606c together.

Conductor 620d is configured to electrically couple gate 605a, gate 605d and contact 606d together.

Other configurations, arrangements on other layout levels or quantities of conductors in the set of conductors 620 are within the scope of the present disclosure.

Other configurations or arrangements of integrated circuit 600 are within the scope of the present disclosure.

FIG. 7 is a diagram of an integrated circuit 700, in accordance with some embodiments.

Integrated circuit 700 includes one or more features of the OD level, the POLY level, or the CPODE level.

Integrated circuit 700 is similar to integrated circuit 600 of FIG. 6, and similar detailed description is omitted.

Integrated circuit 700 is a top view of a diagram of at least integrated circuit 100C of FIG. 1C.

Integrated circuit 700 is an embodiment of integrated circuit 100C of FIG. 1C, and similar detailed description is omitted.

Integrated circuit 700 is manufactured by a corresponding layout design similar to integrated circuit 700. Integrated circuit 700 is an embodiment of integrated circuit 100C, and similar detailed description is omitted. For brevity FIG. 7 is described as integrated circuit 700, but in some embodiments, FIG. 7 also corresponds to layout designs similar to layout design 200 or 250, structural elements of integrated circuit 700 also correspond to layout patterns, and structural relationships including alignment, lengths and widths, as well as configurations and layers of a corresponding layout design of integrated circuit 700 are similar to the structural relationships and configurations and layers of integrated circuit 700, and similar detailed description will not be described for brevity.

In some embodiments, integrated circuit 700 is manufactured by a layout design similar to layout design 200, and similar detailed description is omitted for brevity.

Integrated circuit 700 is a variation of integrated circuit 300 (FIGS. 3A-3C and 3E-3F), or integrated circuit 400 (FIGS. 4A-4B), integrated circuit 500 (FIGS. 5A-5B) or integrated circuit 600 (FIG. 6). For example, integrated circuit 700 illustrates an example of where parallel gates 704f2 and 704g2 of the set of gate 704 extend across active regions 302b and 302c.

Integrated circuit 700 includes at least the set of active regions 302, the set of dummy gates 303, a set of gates 704 and 705, the set of contacts 606, the set of conductors 620 (not shown), the set of conductors 320 and 322, the set of vias 310 and 610 (not shown), the set of vias 612 (not shown), the set of conductors 330, the substrate 390 and the insulating region 392.

In row 2, circuit F1 and stacked gate circuit F2 are between multiplexer D and inverter A.

In row 1, transmission gate H1 and stacked gate circuit H2 are between inverters B and J.

In comparison with integrated circuit 300 of FIGS. 3A-3C and 3E-3F, set of gates 704 of integrated circuit 700 replaces the set of gates 304, set of gates 705 of integrated circuit 700 replaces the set of gates 305, and similar detailed description is therefore omitted.

Set of gates 704 includes at least gate 704a, 704b1, 704b2, 704c, 704d1, 704d2, 704e, 704f1, 704f2, 704g1, 704g2, 704h or 704i.

Set of gates 705 includes at least gate 705a, 705b, 705c, 705d, 705e, 705f, 705g, 705h or 705i.

In comparison with integrated circuit 300 of FIGS. 3A-3C, at least one or more of gate 704a, 704b1, 704b2, 704c, 704d1, 704d2, 704e, 704f1, 704f2, 704g1, 704g2, 704h or 704i replaces at least one or more of gate 304a, 304b, . . . , 304j, and similar detailed description is therefore omitted.

In comparison with integrated circuit 300 of FIGS. 3A-3C, at least one or more of gate 705a, 705b, 705c, 705d, 705e, 705f, 705g, 705h or 705i replaces at least one or more of gate 305a, 305b, . . . , 305j, and similar detailed description is therefore omitted.

In some embodiments, at least gate 705c is a dummy gate.

In some embodiments, gate 704e is a gate of transistors T33 and T36, gate 704f1 is a gate of transistor T34, gate 704f2 is a gate of transistors T35 and T21, gate 704g1 is a gate of transistor T12, gate 704g2 is a gate of transistors T13 and T18, gate 705f is a gate of transistor T20, and gate 705g is a gate of transistor T17.

In some embodiments, gate 704h is a gate of transistors T14 and T11.

Gate 704f1 overlaps active region 302a. Gate 704f1 corresponds to node nc2/signal nc2'. Gate 704f1 corresponds to transistor T34 of stacked gate circuit 130 (F1).

Gate 704f2 overlaps active regions 302b and 302c. Gate 704f2 corresponds to node nc1/signal nc1'. Gate 704f2 corresponds to transistor T35 of stacked gate circuit 130 (F1) and transistor T21 of stacked gate circuit H2.

Gate 704g1 overlaps active region 302a. Gate 704g1 corresponds to node nc1/signal nc1'. Gate 704g1 corresponds to transistor T12 of stacked gate circuit F2.

Gate 704g2 overlaps active regions 302b and 302c. Gate 704g2 corresponds to node nc2/signal nc2'. Gate 704g2 corresponds to transistor T13 of stacked gate circuit F2 and transistor T18 of transmission gate H1.

Gate 705f overlaps active region 302d. Gate 705f corresponds to node nc2/signal nc2'. Gate 705f corresponds to transistor T20 of stacked gate circuit H2.

Gate 705g overlaps active region 302d. Gate 705g corresponds to node nc1/signal nc1'. Gate 705g corresponds to transistor T17 of transmission gate H1.

In some embodiments, by having each of gate 704f2 and gate 704g2 overlap each of active regions 302b and 302c, gate 704f2 and gate 704g2 have a corresponding signal nc1' and nc2' applied to the corresponding gate 704f2 and gate 704g2 across 2 active regions, thereby maximizing vertical routing resource alignment like POLY or MD to reduce M0 usage in integrated circuit 700.

Within row 2, the nodes nm1 of multiplexer D is aligned along a common axis in the second direction Y across active region patterns 302a and 302b, and a same MD contact (e.g., contact 606a) of transistors T2, T4, T5 and T7 of multiplexer D is shared.

Within row 2, the nodes nl1 of circuit F1 is aligned along a common axis in the second direction Y across active region patterns 302a and 302b, and a same MD contact (e.g., contact 606b) of stacked gate circuit 130 (F1) is shared with stacked gate circuit F2.

Within row 1, the nodes nl4 of inverter I is aligned along a common axis in the second direction Y across active region patterns 302c and 302d, and a same MD contact (e.g., contact 606c) is shared.

Within row 1, the nodes nl3 of transmission gate H1 and stacked gate circuit H2 are aligned along a common axis in the second direction Y across active region patterns 302c and 302*d*, and a same MD contact (e.g., contact 606*d*) of transmission gate H1 is shared with stacked gate circuit H2.

Within row 1, the nodes nl2 of inverter G and transmission gate H1 are aligned along a common axis in the second direction Y across active region patterns 302*c* and 302*d*, and a same MD contact (e.g., not shown) of inverter G is shared with transmission gate H1.

Within row 2, signal nc2' in stacked gate circuit 130 (F1) and stacked gate circuit F2 are not routed on the same poly. Within row 2, signal nc2' is routed on gates 704*f*1 and 704*g*2.

Within row 2, signal nc1' in stacked gate circuit 130 (F1) and stacked gate circuit F2 are not routed on the same poly. Within row 2, signal nc1' is routed on gates 704*g*1 and 704*f*2.

Signal nc1' is routed on gate 704*f*2 across active regions 302*b* and 302*c* from row 2 to row 1.

Signal nc2' is routed on gate 704*g*2 across active regions 302*b* and 302*c* from row 2 to row 1. Thus, signals nc1' and nc2' are routed on corresponding gates 704*f*2 and 704*g*2 across at least 2 active regions and across rows within cell 701 thereby maximizing vertical routing resource alignment like POLY or MD to reduce M0 usage in integrated circuit 700. In some embodiments, by reducing M0 usage, integrated circuit 700 offers more routing flexibility and more via landing spots, and thereby increasing routing resources compared to other approaches.

Within row 1, signal nc1' in stacked gate circuit H2 and transmission gate H1 are not routed on the same poly. Within row 1, signal nc1' is routed on gates 704*f*2 and 705*g*.

Within row 1, signal nc2' in stacked gate circuit H2 and transmission gate H1 are not routed on the same poly. Within row 1, signal nc2' is routed on gates 704*g*2 and 705*f*.

Other configurations, arrangements on other layout levels or quantities of gates in the set of gates 704 and 705 are within the scope of the present disclosure.

Other configurations or arrangements of integrated circuit 700 are within the scope of the present disclosure.

FIG. 8A is a diagram of an integrated circuit 800A, in accordance with some embodiments.

FIG. 8B is a diagram of an integrated circuit 800B, in accordance with some embodiments.

Integrated circuits 800A and 800B includes one or more features of the OD level, the POLY level, or the CPODE level.

Integrated circuit 800A is similar to integrated circuit 400 of FIG. 4A, and similar detailed description is omitted. Integrated circuit 800B is similar to integrated circuit 450 of FIG. 4C, and similar detailed description is omitted.

Integrated circuit 800A is a top view of a diagram of at least integrated circuit 100A of FIG. 1A, integrated circuit 100B of FIG. 1B.

Integrated circuit 800A is an embodiment of integrated circuit 100A of FIG. 1A or integrated circuit 100B of FIG. 1B, and similar detailed description is omitted.

Integrated circuit 800A or 800B is manufactured by a corresponding layout design similar to integrated circuit 800A or 800B. Integrated circuit 800A or 800B is an embodiment of integrated circuit 100A or 100B, and similar detailed description is omitted. For brevity FIGS. 8A-8B are described as integrated circuit 800A or 800B, but in some embodiments, FIGS. 8A-8B also correspond to layout designs similar to layout design 200 or 250, structural elements of integrated circuit 800A or 800B also correspond to layout patterns, and structural relationships including alignment, lengths and widths, as well as configurations and layers of a corresponding layout design of integrated circuit 800A or 800B are similar to the structural relationships and configurations and layers of integrated circuit 800A or 800B, and similar detailed description will not be described for brevity.

In some embodiments, integrated circuit 800A is manufactured by a layout design similar to layout design 200, and similar detailed description is omitted for brevity.

Integrated circuit 800A is a variation of integrated circuit 300 (FIGS. 3A-3C and 3E-3F), or integrated circuit 400 (FIGS. 4A-4B), integrated circuit 500 (FIGS. 5A-5B), integrated circuit 600 (FIG. 6) or integrated circuit 700 (FIG. 7). For example, integrated circuit 800A illustrates an example of where parallel gates 804*g*2 and 804*h*2 of the set of gate 804 extend across active regions 302*b* and 302*c*.

Integrated circuit 800 includes at least the set of active regions 302, the set of dummy gates 303, a set of gates 804 and 805, a set of contacts (not shown), a set of conductors (not shown) similar to the set of conductors 320, 322 or 620, the set of vias 310 and 610 (not shown), the set of vias 612 (not shown), the set of conductors 330, the substrate 390 and the insulating region 392.

In row 2, circuit F1 and stacked gate circuit F2 are between multiplexer D and inverter G.

In row 1, transmission gate H1 and stacked gate circuit H2 are between inverters B and J.

In comparison with integrated circuit 300 of FIGS. 3A-3C and 3E-3F, set of gates 804 of integrated circuit 800 replaces the set of gates 304, set of gates 805 of integrated circuit 800 replaces the set of gates 305, and similar detailed description is therefore omitted.

Set of gates 804 includes at least gate 804*a*1, 804*a*2, 804*b*, 804*c*1, 804*c*2, 804*d*, 804*e*, 804*f*, 804*g*1, 804*g*2, 804*h*1, 804*h*2, 804*i* or 804*j*.

Set of gates 805 includes at least gate 805*a*, 805*b*, 805*c*, 805*d*, 805*e*, 805*f*, 805*g*, 805*h*, 805*i* or 805*j*.

In comparison with integrated circuit 300 of FIGS. 3A-3C, at least one or more of gate 804*a*1, 804*a*2, 804*b*, 804*c*1, 804*c*2, 804*d*, 804*e*, 804*f*, 804*g*1, 804*g*2, 804*h*1, 804*h*2, 804*i* or 804*j* replaces at least one or more of gate 304*a*, 304*b*, . . . , 304*j*, and similar detailed description is therefore omitted.

In comparison with integrated circuit 300 of FIGS. 3A-3C, at least one or more of gate 805*a*, 805*b*, 805*c*, 805*d*, 805*e*, 805*f*, 805*g*, 805*h*, 805*i* or 805*j* replaces at least one or more of gate 305*a*, 305*b*, . . . , 305*j*, and similar detailed description is therefore omitted.

In some embodiments, at least gate 804*f*, 805*d* and 805*i* are dummy gates.

In some embodiments, gate 804*e* is a gate of transistors T27 and T28, gate 804*g*1 is a gate of transistor T9, gate 804*g*2 is a gate of transistors T10 and T21, gate 804*h*1 is a gate of transistor T12, gate 804*h*2 is a gate of transistors T13 and T18, gate 804*i* is a gate of transistors T11 and T14, gate 805*f* is a gate of transistors T22 and T19, gate 805*g* is a gate of transistor T20, and gate 805*h* is a gate of transistor T17.

Gate 804*g*1 overlaps active region 302*a*. Gate 804*g*1 corresponds to node nc2/signal nc2'. Gate 804*g*1 corresponds to transistor T9 of circuit F1.

Gate 804*h*1 overlaps active region 302*a*. Gate 804*h*1 corresponds to node nc1/signal nc1'. Gate 804*h*1 corresponds to transistor T12 of stacked gate circuit F2.

Gate 804*g*2 overlaps active regions 302*b* and 302*c*. Gate 804*g*2 corresponds to node nc1/signal nc1'. Gate 804*g*2 corresponds to transistor T10 of circuit F1 and transistor T21 of stacked gate circuit H2.

Gate 804*h*2 overlaps active regions 302*b* and 302*c*. Gate 804*h*2 corresponds to node nc2/signal nc2'. Gate 804*h*2 corresponds to transistor T13 of stacked gate circuit F2 and transistor T18 of transmission gate H1.

Gate 805g overlaps active region 302d. Gate 805g corresponds to node nc2/signal nc2'. Gate 805g corresponds to transistor T20 of stacked gate circuit H2.

Gate 805h overlaps active region 302d. Gate 805h corresponds to node nc1/signal nc1'. Gate 805h corresponds to transistor T17 of transmission gate H1.

In some embodiments, by having each of gate 804g2 and gate 804h2 overlap each of active regions 302b and 302c, gate 804g2 and gate 804h2 have a corresponding signal nc1' and nc2' applied to the corresponding gate 804g2 and gate 804h2 across 2 active regions, thereby maximizing vertical routing resource alignment like POLY or MD to reduce M0 usage in integrated circuit 800.

Within row 2, node nm1 in circuit F1 and node nm2 in circuit F1 are aligned with each other along a common axis in the second direction Y across active regions 302a and 302b.

Within row 2, the node nl1 of circuit F1 is aligned along a common axis in the second direction Y across active regions 302a and 302b, and a same MD contact (e.g., contact (not shown)) of circuit F1 is shared with stacked gate circuit F2.

Within row 1, the nodes nl2 of transmission gate H1 are aligned along a common axis in the second direction Y across active region patterns 302c and 302d, and a same MD contact (e.g., not shown) is shared.

Within row 1, the nodes nl3 of transmission gate H1 and stacked gate circuit H2 are aligned along a common axis in the second direction Y across active region patterns 302c and 302d, and a same MD contact (e.g., not shown, but similar to contact 606d) of transmission gate H1 is shared with stacked gate circuit H2.

Within row 1, the nodes nl4 of inverter I is aligned along a common axis in the second direction Y across active region patterns 302c and 302d, and a same MD contact (e.g., not shown, but similar to contact 606c) is shared.

Within row 2, signal nc2' in circuit F1 and stacked gate circuit F2 are not routed on the same poly. Within row 2, signal nc2' is routed on gates 804g1 and 804h2.

Within row 2, signal nc1' in circuit F1 and stacked gate circuit F2 are not routed on the same poly. Within row 2, signal nc1' is routed on gates 804h1 and 804g2.

Signal nc1' is routed on gate 804g2 across active regions 302b and 302c from row 2 to row 1. Signal nc2' is routed on gate 804h2 across active regions 302b and 302c from row 2 to row 1. Thus, signals nc1' and nc2' are routed on corresponding gates 804g2 and 804h2 across at least 2 active regions and across rows within cell 801 thereby maximizing vertical routing resource alignment like POLY or MD to reduce M0 usage in integrated circuit 800. In some embodiments, by reducing M0 usage, integrated circuit 800 offers more routing flexibility and more via landing spots, and thereby increasing routing resources compared to other approaches.

Within row 1, signal nc1' in stacked gate circuit H2 and transmission gate H1 are not routed on the same poly. Within row 1, signal nc1' is routed on gates 804g2 and 805h.

Within row 1, signal nc2' in stacked gate circuit H2 and transmission gate H1 are not routed on the same poly. Within row 1, signal nc2' is routed on gates 804h2 and 805g.

Other configurations, arrangements on other layout levels or quantities of gates in the set of gates 804 and 805 are within the scope of the present disclosure.

In some embodiments, the set of active regions 302 have mixed channel dimensions (e.g., fin count, OD width, nanosheet count) in a single cell (e.g., cell 801) that allows the design of integrated circuit 800A or 800B to balance performance, power, and area for double height cell layout designs.

Other configurations or arrangements of integrated circuit 800A are within the scope of the present disclosure.

FIG. 8B is a diagram of an integrated circuit 800B, in accordance with some embodiments.

Integrated circuit 800B is a top view of a diagram of at least integrated circuit 100A of FIG. 1A, integrated circuit 100B of FIG. 1B.

Integrated circuit 800B is a variation of integrated circuit 800A (FIG. 8A), and therefore similar detailed description is omitted. For example, integrated circuit 800B illustrates an example where active regions 302a and 302d correspond to NMOS transistors, and active regions 302b and 302c correspond to PMOS transistors.

As shown in FIG. 8B, active regions 302a and 302d correspond to the reference supply voltage VSS (e.g., conductors/power rails 330a and 330c), and therefore active regions 302a and 302d are source and drain regions of NMOS transistors.

As shown in FIG. 8B, active regions 302b and 302c correspond to the supply voltage VDD (e.g., conductor/power rail 330b), and therefore active regions 302b and 302c are source and drain regions of PMOS transistors.

In some embodiments, integrated circuit 800B achieves one or more of the benefits discussed herein.

Other configurations or arrangements of integrated circuit 800B are within the scope of the present disclosure.

FIG. 9A is a diagram of an integrated circuit 900A, in accordance with some embodiments.

FIG. 9B is a diagram of an integrated circuit 900B, in accordance with some embodiments.

Integrated circuits 900A and 900B includes one or more features of the OD level, the POLY level, or the CPODE level.

Integrated circuit 900A is similar to integrated circuit 400 of FIG. 4A, and similar detailed description is omitted. Integrated circuit 900B is similar to integrated circuit 450 of FIG. 4C, and similar detailed description is omitted.

Integrated circuit 900A is a top view of a diagram of at least integrated circuit 100D of FIG. 1D.

Integrated circuit 900A is an embodiment of integrated circuit 100D of FIG. 1D, and similar detailed description is omitted.

Integrated circuit 900A or 900B is manufactured by a corresponding layout design similar to integrated circuit 900A or 900B. Integrated circuit 900A or 900B is an embodiment of integrated circuit 100A or 100B, and similar detailed description is omitted. For brevity FIGS. 9A-9B are described as integrated circuit 900A or 900B, but in some embodiments, FIGS. 9A-9B also correspond to layout designs similar to layout design 200 or 250, structural elements of integrated circuit 900A or 900B also correspond to layout patterns, and structural relationships including alignment, lengths and widths, as well as configurations and layers of a corresponding layout design of integrated circuit 900A or 900B are similar to the structural relationships and configurations and layers of integrated circuit 900A or 900B, and similar detailed description will not be described for brevity.

In some embodiments, integrated circuit 900A is manufactured by a layout design similar to layout design 200, and similar detailed description is omitted for brevity.

Integrated circuit 900A is a variation of integrated circuit 300 (FIGS. 3A-3C and 3E-3F), integrated circuit 400 (FIGS.

4A-4B), integrated circuit 500 (FIGS. 5A-5B), integrated circuit 600 (FIG. 6), integrated circuit 700 (FIG. 7) and integrated circuit 800A (FIG. 8A). For example, integrated circuit 900A illustrates an example of where gate 904*h2* of the set of gates 904 extends across active regions 302*b* and 302*c*.

Integrated circuit 900 includes at least the set of active regions 302, the set of dummy gates 303, a set of gates 904 and 905, a set of contacts (not shown), a set of conductors (not shown) similar to the set of conductors 320, 322 or 620, the set of vias 310 and 610 (not shown), the set of vias 612 (not shown), the set of conductors 330, the substrate 390 and the insulating region 392.

In row 2, circuit F1 is between inverter C and inverter J.

In row 1, stacked gate circuit 126 (H1) and stacked gate circuit H2 are between inverters G and I.

In comparison with integrated circuit 300 of FIGS. 3A-3C and 3E-3F, set of gates 904 of integrated circuit 900 replaces the set of gates 304, set of gates 905 of integrated circuit 900 replaces the set of gates 305, and similar detailed description is therefore omitted.

Set of gates 904 includes at least gate 904*a*, 904*b1*, 904*b2*, 904*c*, 904*d1*, 904*d2*, 904*e*, 904*f*, 904*g*, 904*h1*, 904*h2*, 904*i* or 904*j*.

Set of gates 905 includes at least gate 905*a*, 905*b*, 905*c1*, 905*c2*, 905*d*, 905*e*, 905*f*, 905*g1*, 905*g2*, 905*h*, 905*i* or 905*j*.

In comparison with integrated circuit 300 of FIGS. 3A-3C, at least one or more of gate 904*a*, 904*b1*, 904*b2*, 904*c*, 904*d1*, 904*d2*, 904*e*, 904*f*, 904*g*, 904*h1*, 904*h2*, 904*i* or 904*j* replaces at least one or more of gate 304*a*, 304*b*, . . . , 304*j*, and similar detailed description is therefore omitted.

In comparison with integrated circuit 300 of FIGS. 3A-3C, at least one or more of gate 905*a*, 905*b*, 905*c1*, 905*c2*, 905*d*, 905*e*, 905*f*, 905*g1*, 905*g2*, 905*h*, 905*i* or 905*j* replaces at least one or more of gate 305*a*, 305*b*, . . . , 305*j*, and similar detailed description is therefore omitted.

In some embodiments, at least gate 904*g*, 904*i* and 905*d* are dummy gates.

In some embodiments, gate 904*f* is a gate of transistors T27 and T28, gate 904*h1* is a gate of transistor T9, gate 904*h2* is a gate of transistors T10 and T21, gate 905*f* is a gate of transistors T37 and T40, gate 905*g1* is a gate of transistor T38, gate 905*g2* is a gate of transistor T39, gate 905*h* is a gate of transistor T20, and gate 905*i* is a gate of transistors T22 and T19.

Gate 904*h1* overlaps active region 302*a*. Gate 904*h1* corresponds to node nc2/signal nc2'. Gate 904*h1* corresponds to transistor T9 of circuit F1.

Gate 904*h2* overlaps active regions 302*b* and 302*c*. Gate 904*h2* corresponds to node nc1/signal nc1'. Gate 904*h2* corresponds to transistor T10 of circuit F1 and transistor T21 of stacked gate circuit H2.

Gate 905*f* overlaps active regions 302*c* and 302*d*. Gate 905*f* corresponds to node nl1/signal nl1'. Gate 905*f* corresponds to transistors T37 and T40 of stacked gate circuit 126 (H1).

Gate 905*g1* overlaps active region 302*d*. Gate 905*g1* corresponds to node nc1/signal nc1'. Gate 905*g1* corresponds to transistor T38 of stacked gate circuit 126 (H1).

Gate 905*g2* overlaps active region 302*c*. Gate 905*g2* corresponds to node nc2/signal nc2'. Gate 905*g2* corresponds to transistor T39 of stacked gate circuit 126 (H1).

Gate 905*h* overlaps active region 302*d*. Gate 905*h* corresponds to node nc2/signal nc2'. Gate 905*h* corresponds to transistor T20 of stacked gate circuit H2.

Gate 905*i* overlaps active regions 302*c* and 302*d*. Gate 905*i* corresponds to node nl4/signal nl4'. Gate 905*i* corresponds to transistors T22 and T19 of stacked gate circuit H2.

In some embodiments, by having gate 904*h2* overlap each of active regions 302*b* and 302*c*, gate 904*h2* has a signal nc1' applied to the gate 904*h2* across 2 active regions, thereby maximizing vertical routing resource alignment like POLY or MD to reduce M0 usage in integrated circuit 900.

Within row 2, node nm1 in circuit F1 and node nm2 in circuit F1 are aligned with each other along a common axis in the second direction Y across active regions 302*a* and 302*b*.

Within row 2, the node nl1 of circuit F1 is aligned along a common axis in the second direction Y across active regions 302*a* and 302*b*, and a same MD contact (e.g., contact (not shown)) of circuit F1 is shared.

Within row 1, the nodes nl2 of inverter G is aligned along a common axis in the second direction Y across active regions 302*c* and 302*d*, and a same MD contact (e.g., not shown, but similar to contact 606*c*) is shared.

Within row 1, the nodes nl3 of stacked gate circuit 126 (H1) and stacked gate circuit H2 are aligned along a common axis in the second direction Y across active regions 302*c* and 302*d*, and a same MD contact (e.g., not shown, but similar to contact 606*d*) of stacked gate circuit 126 (H1) is shared with stacked gate circuit H2.

Within row 1, the nodes nl4 of inverter I is aligned along a common axis in the second direction Y across active regions 302*c* and 302*d*, and a same MD contact (e.g., not shown, but similar to contact 606*c*) is shared.

Signal nc1' is routed on gate 904*h2* across active regions 302*b* and 302*c* from row 2 to row 1. Thus, signal nc1' is routed on gate 904*h2* across at least 2 active regions and across rows within cell 901 thereby maximizing vertical routing resource alignment like POLY or MD to reduce M0 usage in integrated circuit 900. In some embodiments, by reducing M0 usage, integrated circuit 900 offers more routing flexibility and more via landing spots, and thereby increasing routing resources compared to other approaches.

Within row 1, signal nc1' in stacked gate circuit H1 (126) and stacked gate circuit H2 are not routed on the same poly. Within row 1, signal nc1' is routed on gates 904*h2* and 905*g1*.

Within row 1, signal nc2' in stacked gate circuit H1 (126) and stacked gate circuit H2 are not routed on the same poly. Within row 1, signal nc2' is routed on gates 905*g2* and 905*h*.

Other configurations, arrangements on other layout levels or quantities of gates in the set of gates 904 and 905 are within the scope of the present disclosure.

In some embodiments, the set of active regions 302 have mixed channel dimensions (e.g., fin count, OD width, nanosheet count) in a single cell (e.g., cell 901) that allows the design of integrated circuit 900A or 900B to balance performance, power, and area for double height cell layout designs.

Other configurations or arrangements of integrated circuit 900A are within the scope of the present disclosure.

FIG. 9B is a diagram of an integrated circuit 900B, in accordance with some embodiments.

Integrated circuit 900B is a top view of a diagram of at least integrated circuit 100D of FIG. 1D.

Integrated circuit 900B is a variation of integrated circuit 900A (FIG. 9A), and therefore similar detailed description is omitted. For example, integrated circuit 900B illustrates an example where active regions 302*a* and 302*d* correspond to NMOS transistors, and active regions 302*b* and 302*c* correspond to PMOS transistors.

As shown in FIG. 9B, active regions 302a and 302d correspond to the reference supply voltage VSS (e.g., conductors/power rails 330a and 330c), and therefore active regions 302a and 302d are source and drain regions of NMOS transistors.

As shown in FIG. 9B, active regions 302b and 302c correspond to the supply voltage VDD (e.g., conductor/power rail 330b), and therefore active regions 302b and 302c are source and drain regions of PMOS transistors.

In some embodiments, integrated circuit 900B achieves one or more of the benefits discussed herein. Other configurations or arrangements of integrated circuit 900B are within the scope of the present disclosure.

FIG. 10 is a diagram of an integrated circuit 1000, in accordance with some embodiments.

Integrated circuit 1000 includes one or more features of the OD level, the POLY level, or the CPODE level.

Integrated circuit 1000 is similar to integrated circuit 300 (FIGS. 3A-3C and 3E-3F), or integrated circuit 400 (FIGS. 4A-4B), integrated circuit 500 (FIGS. 5A-5B), and similar detailed description is omitted.

Integrated circuit 1000 is a top view of a diagram of at least integrated circuit 100A of FIG. 1A or integrated circuit 100B of FIG. 1B.

Integrated circuit 1000 is an embodiment of integrated circuit 100A of FIG. 1A or integrated circuit 100B of FIG. 1B, and similar detailed description is omitted.

Integrated circuit 1000 is manufactured by a corresponding layout design similar to integrated circuit 1000. Integrated circuit 1000 is an embodiment of integrated circuit 100C, and similar detailed description is omitted. For brevity FIG. 10 is described as integrated circuit 1000, but in some embodiments, FIG. 10 also corresponds to layout designs similar to layout design 200 or 250, structural elements of integrated circuit 1000 also correspond to layout patterns, and structural relationships including alignment, lengths and widths, as well as configurations and layers of a corresponding layout design of integrated circuit 1000 are similar to the structural relationships and configurations and layers of integrated circuit 1000, and similar detailed description will not be described for brevity.

In some embodiments, integrated circuit 1000 is manufactured by a layout design similar to layout design 200, and similar detailed description is omitted for brevity.

Integrated circuit 1000 is a variation of integrated circuit 300 (FIGS. 3A-3C and 3E-3F), or integrated circuit 400 (FIGS. 4A-4B), integrated circuit 500 (FIGS. 5A-5B) or integrated circuit 600 (FIG. 6). For example, integrated circuit 1000 illustrates an example of where one or more active regions 1002a, 1002b, 1002c or 1002d include regions with different widths in the second direction Y.

Integrated circuit 1000 includes at least a set of active regions 1002, the set of dummy gates 303, a set of gates 1004 and 1005, the substrate 390 and the insulating region 392.

For ease of illustration other elements are not shown, but are similar to at least one of the set of contacts 606, the set of conductors 620, the set of conductors 320 and 322, the set of vias 310 and 610, the set of vias 612, and the set of conductors 330.

In row 2, inverters I, A, J and B are between stacked gate circuit H2 and inverter C.

In row 1, inverter G, stacked gate circuit F2 and circuit F1 are between transmission gate H1 and multiplexer D.

In comparison with integrated circuit 300 of FIGS. 3A-3C and 3E-3F, a set of active regions 1002 of integrated circuit 1000 replaces the set of active regions 302, and similar detailed description is therefore omitted.

In comparison with integrated circuit 300 of FIGS. 3A-3C and 3E-3F, a set of gates 1004 of integrated circuit 1000 replaces one or more gates of the set of gates 304, and a set of gates 1005 of integrated circuit 1000 replaces one or more gates of the set of gates 305, and similar detailed description is therefore omitted.

The set of gates 1004 is a set of dummy gates. The set of gates 1005 is a set of dummy gates.

Set of active regions 1002 includes at least one or more of active region 1002a, 1002b, 1002c or 1002d.

The set of active regions 1002 extends in the first direction X. Each active region 1002a, 1002b, 1002c or 1002d of the set of active regions 1002 are separated from one another in the second direction Y. Each active region 1002a, 1002b, 1002c or 1002d of the set of active regions 1002 corresponds to a set of transistors.

Active region 1002a includes at least active region 1002a1, 1002a2 or 1002a3. Each active region 1002a1, 1002a2 or 1002a3 is separated from one another in the first direction X.

Active region 1002b includes at least active region 1002b1, 1002b2 or 1002b3. Each active region 1002b1, 1002b2 or 1002b3 is separated from one another in the first direction X.

Active region 1002a1 is separated from active region 1002a2 in the first direction X by gate 1004d, gate 1004c and a region 1008a. In some embodiments, region 1008a is a shallow trench isolation (STI) region. In some embodiments, region 1008a is an active region.

Active region 1002b1 is separated from active region 1002b2 in the first direction X by gate 1004d, gate 1004c and a region 1008b. In some embodiments, region 1008b is an STI region. In some embodiments, region 1008b is an active region.

Active regions 1002a1 and 1002b1 correspond to the active region of inverter B and inverter C. At least one of active region 1002a1 or 1002b1 has a width W3a in the second direction Y.

Active region 1002a2 is separated from active region 1002a3 in the first direction X by gate 1004a, gate 1004b and a region 1010a. In some embodiments, region 1010a is an STI region. In some embodiments, region 1010a is an active region.

Active region 1002b2 is separated from active region 1002b3 in the first direction X by gate 1004a, gate 1004b and a region 1010b. In some embodiments, region 1010b is an STI region. In some embodiments, region 1010b is an active region.

Active regions 1002a2 and 1002b2 correspond to the active region of inverter A and inverter J. At least one of active region 1002a2 or 1002b2 has a width W4a in the second direction Y.

Active regions 1002a3 and 1002b3 correspond to the active region of stacked gate circuit H2 and inverter I. At least one of active region 1002a3 or 1002b3 has a width W3a in the second direction Y.

Active region 1002c includes at least active region 1002c1, 1002c2 or 1002c3. Each active region 1002c1, 1002c2 or 1002c3 is separated from one another in the first direction X.

Active region 1002d includes at least active region 1002d1, 1002d2 or 1002d3. Each active region 1002d1, 1002d2 or 1002d3 is separated from one another in the first direction X.

Active region 1002*c*1 is separated from active region 1002*c*2 in the first direction X by gate 1005*b*. Active region 1002*d*1 is separated from active region 1002*d*2 in the first direction X by gate 1005*b*.

Active regions 1002*c*1 and 1002*d*1 correspond to the active region of multiplexer D. At least one of active region 1002*c*1 or 1002*d*1 has a width W4*a* in the second direction Y.

Active region 1002*c*2 is separated from active region 1002*c*3 in the first direction X by gate 1005*a*. Active region 1002*d*2 is separated from active region 1002*d*3 in the first direction X by gate 1005*a*.

Active regions 1002*c*2 and 1002*d*2 correspond to the active region of inverter G, stacked gate circuit F2 and circuit F1. At least one of active region 1002*c*2 or 1002*d*2 has a width W5*a* in the second direction Y.

Active regions 1002*c*3 and 1002*d*3 correspond to the active region of transmission gate H1.

At least one of active region 1002*c*3 or 1002*d*3 has a width W3*a* in the second direction Y.

The width W4*a* is greater than the width W5*a* and width W3*a*. The width W5*a* is greater than the width W3*a*.

In some embodiments, the width W4*a* of active regions 1002*a*2, 1002*b*2, 1002*c*1 and 1002*d*1 is related to the number of conducting devices (e.g., transistors) of corresponding active regions 1002*a*2, 1002*b*2, 1002*c*1 and 1002*d*1, and the corresponding speed, driving strength and power of the conducting devices (e.g., transistors) in the corresponding active regions 1002*a*2, 1002*b*2, 1002*c*1 and 1002*d*1.

In some embodiments, the width W5*a* of active regions 1002*c*2 and 1002*d*2 is related to the number of conducting devices (e.g., transistors) of corresponding active regions 1002*c*2 and 1002*d*2, and the corresponding speed, driving strength and power of the conducting devices (e.g., transistors) in the corresponding active regions 1002*c*2 and 1002*d*2.

In some embodiments, the width W3*a* of active regions 1002*a*1, 1002*a*3, 1002*b*1, 1002*b*3, 1002*c*3 and 1002*d*3 is related to the number of conducting devices (e.g., transistors) of corresponding active regions 1002*a*1, 1002*a*3, 1002*b*1, 1002*b*3, 1002*c*3 and 1002*d*3, and the corresponding speed, driving strength and power of the conducting devices (e.g., transistors) in the corresponding active regions 1002*a*1, 1002*a*3, 1002*b*1, 1002*b*3, 1002*c*3 and 1002*d*3.

In some embodiments, by including the set of gates 1004 and 1005 in integrated circuit 1000, active regions of different widths (e.g., OD jog) can be grouped into the same row thereby allowing integrated circuit 1000 to have a more flexible design compared with other approaches by trading off power and speed within the same row of integrated circuit 1000.

For example, in some embodiments, each of multiplexer D, inverter A, inverter J have width W4*a* of active regions 1002*a*2, 1002*b*2, 1002*c*1 and 1002*d*1, and maximize speed with no power tradeoff. For example, in some embodiments, each of circuit F1, stacked gate circuit F2, inverter G have width W5*a* of active regions 1002*c*2 and 1002*d*2, and tradeoff some speed for a reduction in power. For example, in some embodiments, each of transmission gate H1, stacked gate circuit H2, inverter I, inverter B, and inverter C has width W3*a* of active regions 1002*a*1, 1002*a*3, 1002*b*1, 1002*b*3, 1002*c*3 and 1002*d*3, and maximize a reduction in power for a reduction in speed.

In some embodiments, by including the set of gates 1004 and 1005 in integrated circuit 1000, active regions of different widths (e.g., OD jog) can be grouped into the same row thereby allowing integrated circuit 1000 to have reduced power compared with other approaches.

Set of gates 1004 includes at least gate 1004*a*, 1004*b*, 1004*c* or 1004*d*.

Set of gates 1005 includes at least gate 1005*a* or 1005*b*.

In comparison with integrated circuit 300 of FIGS. 3A-3C, at least one or more of gate 1004*a*, 1004*b*, 1004*c* or 1004*d* replaces at least one or more of gate 304*a*, 304*b*, . . . , 304*j*, and similar detailed description is therefore omitted.

In comparison with integrated circuit 300 of FIGS. 3A-3C, at least one or more of gate 1005*a* or 1005*b* replaces at least one or more of gate 305*a*, 305*b*, . . . , 305*j*, and similar detailed description is therefore omitted.

Gate 1004*a* separates active region 1002*a*3 or 1002*b*3 from region 1010*a* or 1010*b*.

Gate 1004*b* separates region 1010*a* or 1010*b* from active region 1002*a*2 or 1002*b*2.

Gate 1004*c* separates active region 1002*a*2 or 1002*b*2 from region 1008*a* or 1008*b*.

Gate 1004*d* separates region 1008*a* or 1008*b* from active region 1002*a*1 or 1002*b*1.

Gate 1005*a* separates active region 1002*c*3 or 1002*d*3 from corresponding active region 1002*c*2 or 1002*d*2.

Gate 1005*b* separates active region 1002*c*1 or 1002*d*1 from corresponding active region 1002*c*2 or 1002*d*2.

In some embodiments, integrated circuit 1000 achieves one or more of the benefits discussed herein. Other configurations or arrangements of other positions of circuit components in integrated circuit 1000 are within the scope of the present disclosure.

FIG. 11 is a functional flow chart of a method 1100 of manufacturing an IC device, in accordance with some embodiments. It is understood that additional operations may be performed before, during, and/or after the method 1100 depicted in FIG. 11, and that some other processes may only be briefly described herein.

In some embodiments, other order of operations of method 1100-1300 are within the scope of the present disclosure. Method 1100-1300 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of at least method 1100, 1200 or 1300 is not performed.

In some embodiments, method 1100 is an embodiment of operation 1204 of method 1200. In some embodiments, the methods 1100-1300 are usable to manufacture or fabricate at least integrated circuit 300, 350, 400, 450, 500A-500B, 600, 700, 800A-800B, 900A-900B or 1000, or an integrated circuit with similar features as at least layout design 200 or 250.

In operation 1102 of method 1100, a set of active regions 302 or 1002 of a set of transistors is formed in a front-side (e.g., first level) of a substrate 390. In some embodiments, the set of transistors of at least method 1100 includes one or more transistors in the set of active regions 302 or 1002. In some embodiments, the set of transistors of at least method 1100 includes one or more transistors described herein.

In some embodiments, the set of active regions of method 1100 includes a first active region, a second active region, a third active region and a fourth active region in the first level (e.g., OD) of substrate 390.

In some embodiments, the first active region corresponds to a first set of transistors of a first type (e.g., p-type or n-type). In some embodiments, the second active region corresponds to a second set of transistors of a second type (e.g., n-type or p-type) different from the first type. In some embodiments, the third active region corresponds to a third set of transistors of the second type. In some embodiments, the fourth active region corresponds to a fourth set of transistors of the first type.

In some embodiments, operation 1102 further includes at least operation 1102a. In some embodiments, operation 1102a (not shown) includes fabricating source and drain regions of the set of transistors in a first well. In some embodiments, the first well comprises p-type dopants. In some embodiments, the p-dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1\times10^{12}$ atoms/cm$^3$ to $1\times10^{14}$ atoms/cm$^3$. Other dopant concentrations are in the scope of the present disclosure.

In some embodiments, the first well comprises n-type dopants. In some embodiments, the n-type dopants include phosphorus, arsenic or other suitable n-type dopants. In some embodiments, the n-type dopant concentration ranges from about $1\times10^{12}$ atoms/cm$^3$ to about $1\times10^{14}$ atoms/cm$^3$. Other dopant concentrations are in the scope of the present disclosure.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/ or combination thereof. In some embodiments, source/drain features are further exposed to annealing processes after forming source/drain features and/or after the subsequent doping process.

In operation 1104 of method 1100, a first conductive material is deposited over source/drain regions of at least one of the first, second, third or fourth set of transistors on a second level thereby forming a set of contacts of the set of transistors. In some embodiments, the second level of at least method 1100 includes the MD level.

In some embodiments, the set of contacts overlap at least the first active region, the second active region, the third active region or the fourth active region. In some embodiments, the set of contacts includes a first contact that overlaps a first region of the first active region and a first region of the second active region. In some embodiments, the first contact electrically coupling the first region of the first active region and the first region of the second active region together.

In some embodiments, the source/drain regions of the set of transistors of at least method 1100 includes the source/ drain regions of one or more transistors in the set of active regions 302 or 1002. In some embodiments, the set of contacts of at least method 1100 include at least the set of contacts 306, 406 or 606. In some embodiments, the set of contacts of at least method 1100 includes features in the MD level.

In operation 1106 of method 1100, a set of gate structures of the set of transistors is formed on a third level. In some embodiments, the set of gate structures of at least method 1100 includes at least one or more of gates of the set of gates 303, 304, 305, 404, 405, 504, 505, 604, 605, 704, 705, 804, 805, 904, 905, 1004 or 1005. In some embodiments, the third level of at least method 1100 includes the POLY level.

In some embodiments, the set of gate structures includes a first gate structure that overlaps at least the second active region 302b and the third active region 302c.

In some embodiments, a gate region of one or more gates of the set of gates is between the drain region and the source region. In some embodiments, the gate region is over the first well and the substrate. In some embodiments, fabricating the gate regions of operation 1106 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 1108 of method 1100, a first set of vias and a second set of vias are formed.

In some embodiments, the first set of vias of at least method 1100 are in the VG level. In some embodiments, the first set of vias of at least method 1100 includes at least the set of vias 310 or 610. In some embodiments, the first set of vias are formed over the set of gates.

In some embodiments, the second set of vias of at least method 1100 are in the VD level. In some embodiments, the second set of vias of at least method 1100 includes at least the set of vias 612. In some embodiments, the second set of vias are formed over the set of contacts.

In some embodiments, operation 1108 includes forming a first and second set of self-aligned contacts (SACs) in the insulating layer over the front-side of the wafer. In some embodiments, the first and second set of vias are electrically coupled to at least the set of transistors.

In operation 1110 of method 1100, a second conductive material is deposited on a fourth level thereby forming a first set of conductors. In some embodiments, the fourth level of at least method 1100 includes the M0 layer. In some embodiments, operation 1110 includes at least depositing a first set of conductive regions over the front-side of the integrated circuit.

In some embodiments, the first set of conductors of at least method 1100 includes one or more portions of at least the set of conductors 320, 322, 330 or 620.

In some embodiments, the set of conductors is electrically coupled to at least the set of contacts by the second set of vias. In some embodiments, the first set of conductors is electrically coupled to at least the set of gates by the first set of vias.

In some embodiments, one or more of operations 1104, 1106, 1108 or 1110 of method 1100 include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 15:
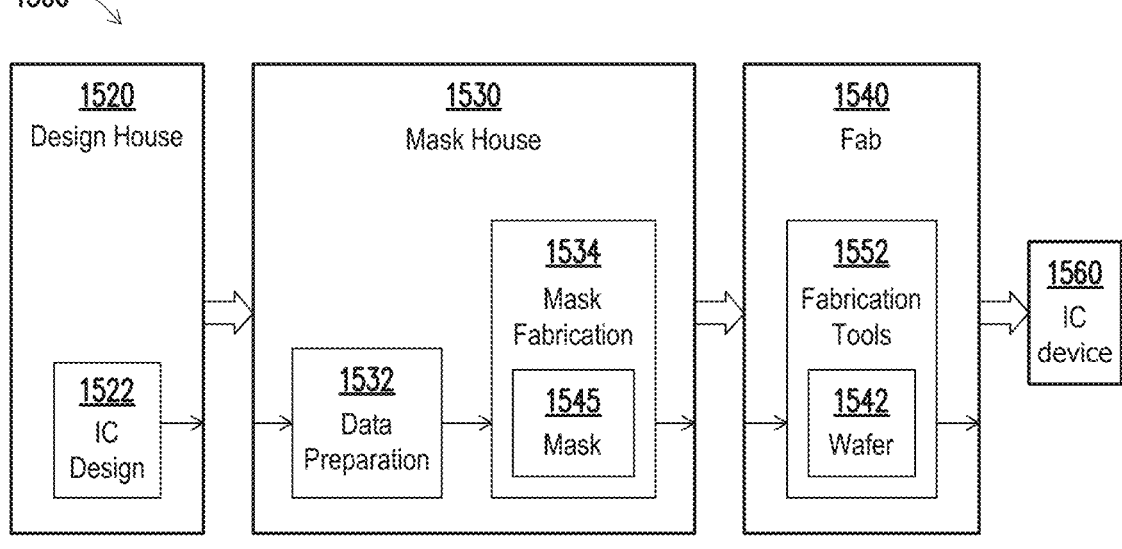
FIG. 15 is a block diagram of an IC manufacturing system, and an IC manufacturing flow associated therewith, in accordance with at least one embodiment of the present disclosure.

In some embodiments, at least one or more operations of method 1100 is performed by system 1500 of FIG. 15. In some embodiments, at least one method(s), such as method 1100 discussed above, is performed in whole or in part by at least one manufacturing system, including system 1500. One or more of the operations of method 1100 is performed by IC fab 1540 (FIG. 15) to fabricate IC device 1560. In some embodiments, one or more of the operations of method 1100 is performed by fabrication tools 1552 to fabricate wafer 1542.

In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in one or more of operations 1104, 1106, 1108 or 1110, the conductive material is planarized to provide a level surface for subsequent steps.

In some embodiments, one or more of the operations of method 1100, 1200 or 1300 is not performed.

One or more of the operations of methods 1200-1300 is performed by a processing device configured to execute instructions for manufacturing an integrated circuit, such as at least integrated circuit 100A-100D, 300, 350, 400, 450, 500A-500B, 600, 700, 800A-800B, 900A-900B or 1000. In some embodiments, one or more operations of methods 1200-1300 is performed using a same processing device as that used in a different one or more operations of methods 1200-1300. In some embodiments, a different processing device is used to perform one or more operations of methods 1200-1300 from that used to perform a different one or more operations of methods 1200-1300. In some embodiments, other order of operations of method 1100, 1200 or 1300 is within the scope of the present disclosure. Method 1100, 1200 or 1300 includes exemplary operations, but the operations are not necessarily performed in the order shown. Operations in method 1100, 1200 or 1300 may be added, replaced, changed order, and/or eliminated as appropriate, in accordance with the spirit and scope of disclosed embodiments.

FIG. 12 is a flowchart of a method 1200 of forming or manufacturing an integrated circuit in accordance with some embodiments. It is understood that additional operations may be performed before, during, and/or after the method 1200 depicted in FIG. 12, and that some other operations may only be briefly described herein. In some embodiments, the method 1200 is usable to form integrated circuits, such as at least integrated circuit 300, 350, 400, 450, 500A-500B, 600, 700, 800A-800B, 900A-900B or 1000. In some embodiments, the method 1200 is usable to form integrated circuits having similar features and similar structural relationships as one or more of layout design 200 or 250.

In operation 1202 of method 1200, a layout design of an integrated circuit is generated. Operation 1202 is performed by a processing device (e.g., processor 1402 (FIG. 14)) configured to execute instructions for generating a layout design. In some embodiments, the layout design of method 1200 includes one or more patterns of at least layout design 200 or 250, or one or more features similar to at least integrated circuit 300, 350, 400, 450, 500A-500B, 600, 700, 800A-800B, 900A-900B or 1000. In some embodiments, the layout design of the present application is in a graphic database system (GDSII) file format.

In operation 1204 of method 1200, the integrated circuit is manufactured based on the layout design. In some embodiments, operation 1204 of method 1200 comprises manufacturing at least one mask based on the layout design, and manufacturing the integrated circuit based on the at least one mask. In some embodiments, operation 1204 corresponds to method 1100 of FIG. 11.

FIG. 13 is a flowchart of a method 1300 of generating a layout design of an integrated circuit, in accordance with some embodiments. It is understood that additional operations may be performed before, during, and/or after the method 1300 depicted in FIG. 13, and that some other processes may only be briefly described herein. In some embodiments, method 1300 is an embodiment of operation 1202 of method 1200. In some embodiments, method 1300 is usable to generate one or more layout patterns of at least layout design 200 or 250, or one or more features similar to at least integrated circuit 300, 350, 400, 450, 500A-500B, 600, 700, 800A-800B, 900A-900B or 1000.

In some embodiments, method 1300 is usable to generate one or more layout patterns having structural relationships including alignment, lengths and widths, as well as configurations and layers of at least layout design 200 or 250, or one or more features similar to at least integrated circuit 300, 350, 400, 450, 500A-500B, 600, 700, 800A-800B, 900A-900B or 1000, and similar detailed description will not be described in FIG. 13, for brevity.

In operation 1302 of method 1300, a set of active region patterns is generated or placed on the layout design. In some embodiments, the set of active region patterns of method 1300 includes at least portions of one or more patterns of set of active region patterns 202. In some embodiments, the set of active region patterns of method 1300 includes one or more regions similar to the set of active regions 302 or 1002.

In operation 1304 of method 1300, a set of gate patterns is generated or placed on the layout design. In some embodiments, the set of gate patterns of method 1300 includes at least portions of one or more patterns of set of gate patterns 203, 204 or 205. In some embodiments, the set of gate patterns of method 1300 includes one or more gates similar to the set of gates 303, 304, 305, 404, 405, 504, 505, 604, 605, 704, 705, 804, 805, 904, 905, 1004 or 1005. In some embodiments, the set of gate patterns of method 1300 includes one or more patterns or similar gates in the POLY layer.

In operation 1306 of method 1300, a set of contact patterns is generated or placed on the layout design. In some embodiments, the set of contact patterns of method 1300 includes at least portions of one or more patterns of set of contact patterns 206. In some embodiments, the set of contact patterns of method 1300 includes one or more contact patterns similar to the set of contacts 306, 406 or 606. In some embodiments, the set of contact patterns of method 1300 includes one or more patterns or similar contacts in the MD layer.

In operation 1308 of method 1300, a first set of via patterns and a second set of via patterns are generated or placed on the layout design.

In some embodiments, the first set of via patterns of method 1300 includes at least portions of one or more patterns of set of via patterns 210. In some embodiments, the first set of via patterns of method 1300 includes one or more via patterns similar to at least the set of vias 310 or 610. In some embodiments, the first set of via patterns of method 1300 includes one or more patterns or similar vias in the VG layer.

In some embodiments, the second set of via patterns of method 1300 includes one or more via patterns similar to at least the set of vias 612. In some embodiments, the second set of via patterns of method 1300 includes one or more patterns or similar vias in the VD layer.

In operation 1310 of method 1300, a first set of conductive feature patterns is generated or placed on the layout design. In some embodiments, the first set of conductive feature patterns of method 1300 includes at least portions of one or more patterns of at least the set of conductive feature patterns 220, 222 or 230.

In some embodiments, the first set of conductive feature patterns of method 1300 includes one or more conductive feature patterns similar to at least the set of conductors 320, 322, 330 or 620. In some embodiments, the first set of conductive feature patterns of method 1300 includes one or more patterns or similar conductors in the M0 layer.

Figure 14:
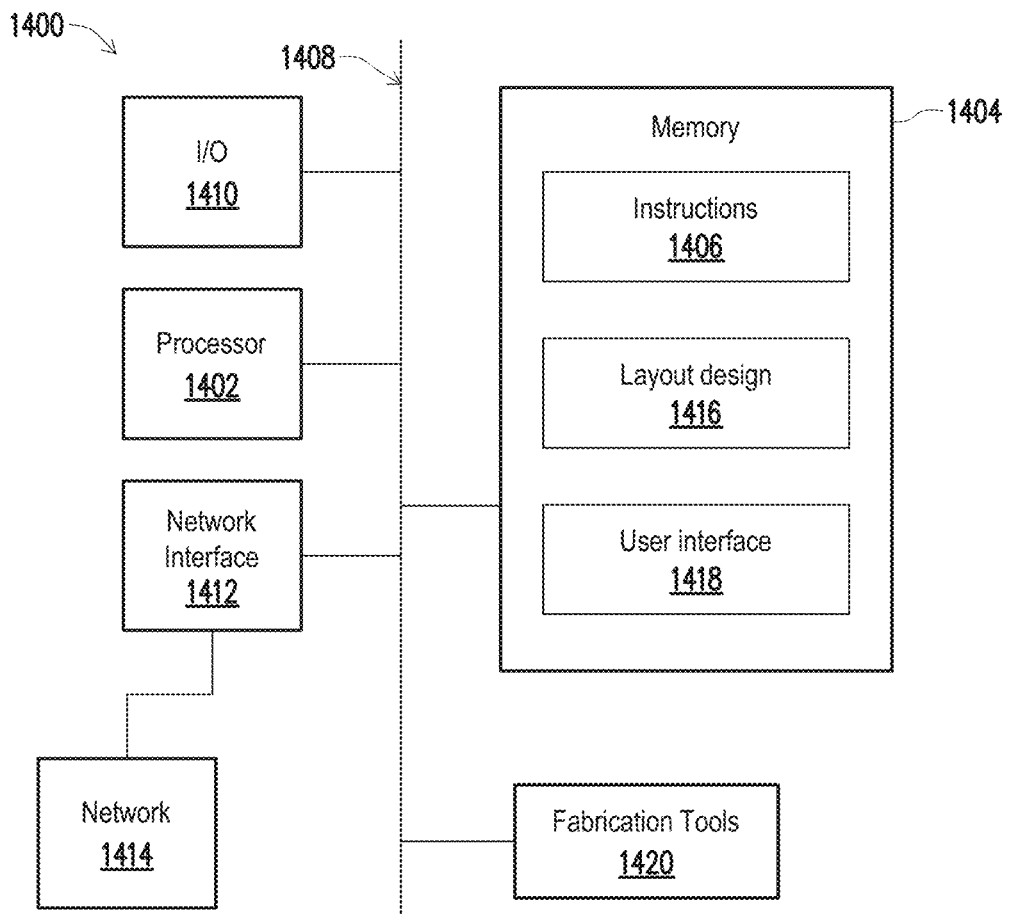
FIG. 14 is a schematic view of a system for designing an IC layout design and manufacturing an IC circuit, in accordance with some embodiments.

FIG. 14 is a schematic view of a system 1400 for designing an IC layout design and manufacturing an IC circuit in accordance with some embodiments.

In some embodiments, system 1400 generates or places one or more IC layout designs described herein. System 1400 includes a hardware processor 1402 and a non-transitory, computer readable storage medium 1404 (e.g., memory 1404) encoded with, i.e., storing, the computer program code 1406, i.e., a set of executable instructions 1406. Computer readable storage medium 1404 is configured for interfacing with manufacturing machines for producing the integrated circuit. The processor 1402 is electrically coupled to the computer readable storage medium 1404 via a bus 1408. The processor 1402 is also electrically coupled to an I/O interface 1410 by bus 1408. A network interface 1412 is also electrically connected to the processor 1402 via bus 1408. Network interface 1412 is connected to a network 1414, so that processor 1402 and computer readable storage medium 1404 are capable of connecting to external elements via network 1414. The processor 1402 is configured to execute the computer program code 1406 encoded in the computer readable storage medium 1404 in order to cause system 1400 to be usable for performing a portion or all of the operations as described in method 1200-1300.

In some embodiments, the processor 1402 is a central processing unit (CPU), a multi-processor, a distributed processing system, an application specific integrated circuit (ASIC), and/or a suitable processing unit.

In some embodiments, the computer readable storage medium 1404 is an electronic, magnetic, optical, electromagnetic, infrared, and/or a semiconductor system (or apparatus or device). For example, the computer readable storage medium 1404 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1404 includes a compact disk-read only memory (CD-ROM), a compact disk-read/write (CD-R/W), and/or a digital video disc (DVD).

In some embodiments, the storage medium 1404 stores the computer program code 1406 configured to cause system 1400 to perform method 1200-1300. In some embodiments, the storage medium 1404 also stores information needed for performing method 1200-1300 as well as information generated during performing method 1200-1300, such as layout design 1416, user interface 1418 and fabrication tool 1420, and/or a set of executable instructions to perform the operation of method 1200-1300. In some embodiments, layout design 1416 comprises one or more of layout patterns of at least layout design 200 or 250 or features similar to at least integrated circuit 300, 350, 400, 450, 500A-500B, 600, 700, 800A-800B, 900A-900B or 1000.

In some embodiments, the storage medium 1404 stores instructions (e.g., computer program code 1406) for interfacing with manufacturing machines. The instructions (e.g., computer program code 1406) enable processor 1402 to generate manufacturing instructions readable by the manufacturing machines to effectively implement method 1200-1300 during a manufacturing process.

System 1400 includes I/O interface 1410. I/O interface 1410 is coupled to external circuitry. In some embodiments, I/O interface 1410 includes a keyboard, keypad, mouse, trackball, trackpad, and/or cursor direction keys for communicating information and commands to processor 1402.

System 1400 also includes network interface 1412 coupled to the processor 1402. Network interface 1412 allows system 1400 to communicate with network 1414, to which one or more other computer systems are connected. Network interface 1412 includes wireless network interfaces such as BLUETOOTH, WIFI, WIMAX, GPRS, or WCDMA; or wired network interface such as ETHERNET, USB, or IEEE-2094. In some embodiments, method 1200-1300 is implemented in two or more systems 1400, and information such as layout design, and user interface are exchanged between different systems 1400 by network 1414.

System 1400 is configured to receive information related to a layout design through I/O interface 1410 or network interface 1412. The information is transferred to processor 1402 by bus 1408 to determine a layout design, such as at least layout design 200 or 250, for producing at least integrated circuit 300, 350, 400, 450, 500A-500B, 600, 700, 800A-800B, 900A-900B or 1000. The layout design is then stored in computer readable medium 1404 as layout design 1416. System 1400 is configured to receive information related to a user interface through I/O interface 1410 or network interface 1412. The information is stored in computer readable medium 1404 as user interface 1418. System 1400 is configured to receive information related to a fabrication tool 1420 through I/O interface 1410 or network interface 1412. The information is stored in computer readable medium 1404 as fabrication tool 1420. In some embodiments, the fabrication tool 1420 includes fabrication information utilized by system 1400. In some embodiments, the fabrication tool 1420 corresponds to mask fabrication 1534 of FIG. 15.

In some embodiments, method 1200-1300 is implemented as a standalone software application for execution by a processor. In some embodiments, method 1200-1300 is implemented as a software application that is a part of an additional software application. In some embodiments, method 1200-1300 is implemented as a plug-in to a software application. In some embodiments, method 1200-1300 is implemented as a software application that is a portion of an EDA tool. In some embodiments, method 1200-1300 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 1200-1300 is implemented by a manufacturing device to manufacture an integrated circuit using a set of masks manufactured based on one or more layout designs generated by system 1400. In some embodiments, system 1400 is a manufacturing device configured to manufacture an integrated circuit using a set of masks manufactured based on one or more layout designs of the present disclosure. In some embodiments, system 1400 of FIG. 14 generates layout designs of an integrated circuit that are smaller than other approaches. In some embodiments, system 1400 of FIG. 14 generates layout designs of integrated circuit structure that occupy less area and provide better routing resources than other approaches.

FIG. 15 is a block diagram of an integrated circuit (IC) manufacturing system 1500, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 1500.

In FIG. 15, IC manufacturing system 1500 (hereinafter "system 1500") includes entities, such as a design house 1520, a mask house 1530, and an IC manufacturer/fabricator ("fab") 1540, that interact with one another in the design, development, and manufacturing cycles and/or services related to manufacturing an IC device 1560. The entities in system 1500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 1520, mask house 1530, and IC fab 1540 is owned by a single larger company. In some embodiments, one or more of design house 1520, mask house 1530, and IC fab 1540 coexist in a common facility and use common resources.

Design house (or design team) 1520 generates an IC design layout 1522. IC design layout 1522 includes various geometrical patterns designed for an IC device 1560. The geometrical patterns correspond to patterns of metal, oxide, or semiconductor layers that make up the various components of IC device 1560 to be fabricated. The various layers combine to form various IC features. For example, a portion of IC design layout 1522 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1520 implements a proper design procedure to form IC design layout 1522. The design procedure includes one or more of logic design, physical design or place and route. IC design layout 1522 is presented in one or more data files having information of the geometrical patterns. For example, IC design layout 1522 can be expressed in a GDSII file format or DFII file format.

Mask house 1530 includes data preparation 1532 and mask fabrication 1534. Mask house 1530 uses IC design layout 1522 to manufacture one or more masks 1545 to be used for fabricating the various layers of IC device 1560 according to IC design layout 1522. Mask house 1530 performs mask data preparation 1532, where IC design layout 1522 is translated into a representative data file (RDF). Mask data preparation 1532 provides the RDF to mask fabrication 1534. Mask fabrication 1534 includes a mask writer. A mask writer converts the RDF to an image on a substrate, such as a mask (reticle) 1545 or a semiconductor wafer 1542. The design layout 1522 is manipulated by mask data preparation 1532 to comply with particular characteristics of the mask writer and/or requirements of IC fab 1540. In FIG. 15, mask data preparation 1532 and mask fabrication 1534 are illustrated as separate elements. In some embodiments, mask data preparation 1532 and mask fabrication 1534 can be collectively referred to as mask data preparation.

In some embodiments, mask data preparation 1532 includes optical proximity correction (OPC) which uses lithography enhancement techniques to compensate for image errors, such as those that can arise from diffraction, interference, other process effects and the like. OPC adjusts IC design layout 1522. In some embodiments, mask data preparation 1532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1532 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1534, which may undo part of the modifications performed by OPC in order to meet mask creation rules.

In some embodiments, mask data preparation 1532 includes lithography process checking (LPC) that simulates processing that will be implemented by IC fab 1540 to fabricate IC device 1560. LPC simulates this processing based on IC design layout 1522 to create a simulated manufactured device, such as IC device 1560. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1522.

It should be understood that the above description of mask data preparation 1532 has been simplified for the purposes of clarity. In some embodiments, data preparation 1532 includes additional features such as a logic operation (LOP) to modify the IC design layout according to manufacturing rules. Additionally, the processes applied to IC design layout 1522 during data preparation 1532 may be executed in a variety of different orders.

After mask data preparation 1532 and during mask fabrication 1534, a mask 1545 or a group of masks 1545 are fabricated based on the modified IC design layout 1522. In some embodiments, mask fabrication 1534 includes performing one or more lithographic exposures based on IC design layout 1522. In some embodiments, an electron-beam (e-beam) or a mechanism of multiple e-beams is used to form a pattern on a mask (photomask or reticle) 1545 based on the modified IC design layout 1522. The mask 1545 can be formed in various technologies. In some embodiments, the mask 1545 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 1545 includes a transparent substrate (e.g., fused quartz) and an opaque material (e.g., chromium) coated in the opaque regions of the binary mask. In another example, the mask 1545 is formed using a phase shift technology. In the phase shift mask (PSM) version of mask 1545, various features in the pattern formed on the mask are configured to have proper phase difference to enhance the resolution and imaging quality. In various examples, the phase shift mask can be attenuated PSM or alternating PSM. The mask(s) generated by mask fabrication 1534 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1540 is an IC fabrication entity that includes one or more manufacturing facilities for the fabrication of a variety of different IC products. In some embodiments, IC Fab 1540 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1540 includes wafer fabrication tools 1552 (hereinafter "fabrication tools 1552") configured to execute various manufacturing operations on semiconductor wafer 1542 such that IC device 1560 is fabricated in accordance with the mask(s), e.g., mask 1545. In various embodiments, fabrication tools 1552 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1540 uses mask(s) 1545 fabricated by mask house 1530 to fabricate IC device 1560. Thus, IC fab 1540 at least indirectly uses IC design layout 1522 to fabricate IC device 1560. In some embodiments, a semiconductor wafer 1542 is fabricated by IC fab 1540 using mask(s) 1545 to form IC device 1560. In some embodiments, the IC fabrication includes performing one or more lithographic exposures based at least indirectly on IC design layout 1522. Semiconductor wafer 1542 includes a silicon substrate or other proper substrate having material layers formed thereon. Semiconductor wafer 1542 further includes one or more of various doped regions, dielectric features, multilevel interconnects, and the like (formed at subsequent manufacturing steps).

System 1500 is shown as having design house 1520, mask house 1530 or IC fab 1540 as separate components or entities. However, it is understood that one or more of design house 1520, mask house 1530 or IC fab 1540 are part of the same component or entity.

One aspect of this description relates to a flip-flop. In some embodiments, the flip-flop includes a first active region extending in a first direction, and being on a first level of a substrate, the first active region corresponding to a first set of transistors of a first type. In some embodiments, the flip-flop further includes a second active region extending in the first direction, being on the first level, and being separated from the first active region in a second direction different from the first direction, the second active region corresponding to a second set of transistors of a second type different from the first type. In some embodiments, the flip-flop further includes a third active region extending in the first direction, being on the first level, and being separated from the first active region and the second active region in the second direction, the third active region corresponding to a third set of transistors of the second type. In some embodiments, the flip-flop further includes a fourth active region extending in the first direction, being on the first level, and being separated from the first active region, the second active region and the third active region in the second direction, the fourth active region corresponding to a fourth set of transistors of the first type. In some embodiments, the flip-flop further includes a first gate structure extending in the second direction, overlapping at least the second active region and the third active region, and being on a second level different from the first level, the first gate structure being configured to receive a first clock signal.

Another aspect of this description relates to a flip-flop. In some embodiments, the flip-flop includes a first active region extending in a first direction, and being on a first level, the first active region corresponding to a first row of a first set of transistors of a first type. In some embodiments, the first active region includes a first portion of the first active region having a first width in a second direction different from the first direction, and a second portion of the first active region having a second width in the second direction, the second width being different from the first width. In some embodiments, the flip-flop further includes a second active region extending in the first direction, being on the first level, and being separated from the first active region in the second direction, the second active region corresponding to a second row of a second set of transistors of a second type different from the first type. In some embodiments, the second active region includes a first portion of the second active region having the first width in the second direction, and a second portion of the second active region having the second width in the second direction. In some embodiments, the flip-flop further includes a first dummy gate extending in the second direction, being located on a second level different from the first level, and the first dummy gate separating at least the first portion of the first active region from the second portion of the first active region, or the first portion of the second active region from the second portion of the second active region.

Still another aspect of this description relates to a method of fabricating a flip-flop. In some embodiments, the method includes forming a first active region, a second active region, a third active region and a fourth active region in a first level of a substrate, the first active region, the second active region, the third active region and the fourth active region extending in a first direction, the first active region corresponding to a first set of transistors of a first type, the second active region corresponding to a second set of transistors of a second type different from the first type, the third active region corresponding to a third set of transistors of the second type, and the fourth active region corresponding to a fourth set of transistors of the first type. In some embodiments, the method further includes depositing a first conductive material on a second level thereby forming a set of contacts, the second level being above the first level, the set of contacts extending in a second direction different from the first direction, and overlapping at least the first active region, the second active region, the third active region or the fourth active region, the set of contacts including a first contact that overlaps a first region of the first active region and a first region of the second active region, the first contact electrically coupling the first region of the first active region and the first region of the second active region together. In some embodiments, the method further includes fabricating a set of gate structures on a third level above the first level, the set of gate structures extending in the second direction, the set of gate structures including a first gate structure, the first gate structure overlapping at least the second active region and the third active region. In some embodiments, the method further includes fabricating a first set of vias over the set of contacts, and a second set of vias over the set of gate structures, the second set of vias including a first via over the first gate structure. In some embodiments, the method further includes depositing a second conductive material over at least the set of contacts or the set of gate structures on a fourth level thereby forming a first set of conductors, the fourth level being above the first level, the second level and the third level, the first set of conductors extending in the first direction, the first set of conductors including a first conductor that overlaps the first gate structure, and is electrically coupled to the first gate structure by the first via. In some embodiments, wherein the first gate structure is configured to receive a first clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flip-flop comprising:
   a first active region extending in a first direction, and being on a first level of a substrate, the first active region corresponding to a first set of transistors of a first type;
   a second active region extending in the first direction, being on the first level, and being separated from the first active region in a second direction different from the first direction, the second active region corresponding to a second set of transistors of a second type different from the first type;
   a third active region extending in the first direction, being on the first level, and being separated from the first active region and the second active region in the second direction, the third active region corresponding to a third set of transistors of the second type;
   a fourth active region extending in the first direction, being on the first level, and being separated from the first active region, the second active region and the third active region in the second direction, the fourth active region corresponding to a fourth set of transistors of the first type;
   a first gate structure extending in the second direction, overlapping the second active region, the third active region and the fourth active region, and being on a second level different from the first level, the first gate structure being configured to receive a first clock signal;
   a second gate structure extending in the second direction, overlapping the first active region, and being on the second level, the second gate structure being configured to receive a second clock signal inverted from the first clock signal, and being separated from the first gate structure in the second direction;
   a third gate structure extending in the second direction, overlapping the second active region, the third active region and the fourth active region, and being on the second level, the third gate structure being configured to receive the second clock signal, the third gate structure being separated from the first gate structure in the first direction; and a fourth gate structure extending in the second direction, overlapping the first active region, and being on the second level, the fourth gate structure being configured to receive the first clock signal, and being separated from the third gate structure in the second direction;

wherein the first gate structure and the second gate structure are aligned with each other along a first common axis that extends in the second direction, and the third gate structure and the fourth gate structure are aligned with each other along a second common axis that extends in the second direction.

2. The flip-flop of claim 1, further comprising:

a first contact extending in the second direction, being on a third level different from the first level, and overlapping at least the first active region and the second active region.

3. The flip-flop of claim 1, wherein the first active region has a first width;

the second active region has the first width;

the third active region has a second width different from the first width; and the fourth active region has the second width.

4. The flip-flop of claim 1, wherein the first active region has a first number of fins;

the second active region has the first number of fins;

the third active region has a second number of fins different from the first number of fins; and the fourth active region has the second number of fins.

5. The flip-flop of claim 1, wherein the first active region has a first number of nano-sheets;

the second active region has the first number of nano-sheets;

the third active region has a second number of nano-sheets different from the first number of nano-sheets; and the fourth active region has the second number of nano-sheets.

6. A flip-flop, comprising:

a first active region extending in a first direction, and being on a first level, the first active region corresponding to a first row of a first set of transistors of a first type, the first active region comprising:

a first portion of the first active region having a first width in a second direction different from the first direction; and a second portion of the first active region having a second width in the second direction, the second width being different from the first width;

a second active region extending in the first direction, being on the first level, and being separated from the first active region in the second direction, the second active region corresponding to a second row of a second set of transistors of a second type different from the first type, the second active region comprising:

a first portion of the second active region having the first width in the second direction; and a second portion of the second active region having the second width in the second direction; and a first dummy gate extending in the second direction, being located on a second level different from the first level, and the first dummy gate separating at least the first portion of the first active region from the second portion of the first active region, or the first portion of the second active region from the second portion of the second active region.

7. The flip-flop of claim 6, wherein the first active region further comprises:

a third portion of the first active region having a third width in the second direction, the third width being different from the first width and the second width; and the second active region further comprises:

a third portion of the second active region having the third width in the second direction.

8. The flip-flop of claim 7, further comprising:

a second dummy gate extending in the second direction, being located on the second level, and being separated from the first dummy gate in the first direction, and the second dummy gate separating at least the second portion of the first active region from the third portion of the first active region, or the second portion of the second active region from the third portion of the second active region.

9. The flip-flop of claim 8, further comprising:

a third active region extending in the first direction, and being on the first level, the third active region corresponding to a third row of a third set of transistors of the second type, the third active region comprising:

a first portion of the third active region having the first width in the second direction; and a second portion of the third active region having the third width in the second direction.

10. The flip-flop of claim 9, further comprising:

a fourth active region extending in the first direction, being on the first level, and being separated from the third active region in the second direction, the fourth active region corresponding to a fourth row of a fourth set of transistors of the second type, the fourth active region comprising:

a first portion of the fourth active region having the first width in the second direction; and a second portion of the fourth active region having the third width in the second direction.

11. The flip-flop of claim 10, further comprising:

a third dummy gate extending in the second direction, being located on the second level, and the third dummy gate separating at least the first portion of the third active region from the second portion of the third active region, or the first portion of the fourth active region from the second portion of the fourth active region.

12. The flip-flop of claim 11, wherein the third active region further comprises:

a third portion of the third active region having the first width in the second direction;

the fourth active region further comprises:

a third portion of the fourth active region having the first width in the second direction; and the flip-flop further comprises:

a fourth dummy gate extending in the second direction, being located on the second level, and being separated from the third dummy gate in the first direction, and the fourth dummy gate separating at least the second portion of the third active region from the third portion of the third active region, or the second portion of the fourth active region from the third portion of the fourth active region.

13. The flip-flop of claim 12, further comprising:

a first power rail extending in the first direction, overlapping at least a first set of contacts of the first set of transistors, being configured to supply a first supply voltage to at least the first set of contacts of the first set of transistors, and being on a third level different from the first level and the second level;

a second power rail extending in the first direction, overlapping at least a second set of contacts of the second set of transistors and a third set of contacts of the third set of transistors, being configured to supply a second supply voltage to at least the second set of contacts of the second set of transistors and the third set of contacts of the third set of transistors, being on the third level, and being separated from the first power rail in the second direction; and a third power rail extending in the first direction, overlapping at least a fourth set of contacts of the fourth set of transistors, being configured to supply the first supply voltage to at least the fourth set of contacts of the fourth set of transistors, being on the third level, and being separated from the first power rail and the second power rail in the second direction, wherein the second power rail is between the first power rail and the third power rail.

14. The flip-flop of claim 13, further comprising:

a first set of conductive lines extending in the first direction, overlapping the first dummy gate, the second dummy gate, the first active region and the second active region, and being on the third level; and a second set of conductive lines extending in the first direction, overlapping the third dummy gate, the fourth dummy gate, the third active region and the fourth active region, being on the third level, and being separated from the first set of conductive lines in the second direction.

15. A flip-flop comprising:

a first active region extending in a first direction, and being on a first level of a substrate, the first active region corresponding to a first set of transistors of a first type;

a second active region extending in the first direction, being on the first level, and being separated from the first active region in a second direction different from the first direction, the second active region corresponding to a second set of transistors of a second type different from the first type;

a third active region extending in the first direction, being on the first level, and being separated from the first active region and the second active region in the second direction, the third active region corresponding to a third set of transistors of the second type;

a fourth active region extending in the first direction, being on the first level, and being separated from the first active region, the second active region and the third active region in the second direction, the fourth active region corresponding to a fourth set of transistors of the first type;

a first gate structure extending in the second direction, overlapping the first active region, the second active region, the third active region and the fourth active region, and being on a second level different from the first level, the first gate structure being configured to receive a first clock signal; and a second gate structure extending in the second direction, overlapping the first active region, the second active region, the third active region and the fourth active region, and being on the second level, the second gate structure being configured to receive a second clock signal inverted from the first clock signal, the second gate structure being separated from the first gate structure in the first direction.

16. The flip-flop of claim 15, wherein the first active region has a first width;

the second active region has the first width;

the third active region has a second width different from the first width; and the fourth active region has the second width.

17. The flip-flop of claim 15, wherein the first active region has a first number of fins;

the second active region has the first number of fins;

the third active region has a second number of fins different from the first number of fins; and the fourth active region has the second number of fins.

18. The flip-flop of claim 15, wherein the first active region has a first number of nano-sheets;

the second active region has the first number of nano-sheets;

the third active region has a second number of nano-sheets different from the first number of nano-sheets; and the fourth active region has the second number of nano-sheets.

19. The flip-flop of claim 15, further comprising:

a first contact extending in the second direction, being on a third level different from the first level, and overlapping the first active region and the second active region.

20. The flip-flop of claim 19, further comprising:

a second contact extending in the second direction, being on the third level, and overlapping the first active region.

*    *    *    *    *